United States Patent
Komatsu et al.

(10) Patent No.: US 8,884,276 B2
(45) Date of Patent: Nov. 11, 2014

(54) ORGANIC EL DISPLAY PANEL AND ORGANIC EL DISPLAY APPARATUS

(71) Applicant: Panasonic Corporation, Osaka (JP)

(72) Inventors: Takahiro Komatsu, Osaka (JP); Satoru Ohuchi, Osaka (JP); Ryuuta Yamada, Kyoto (JP); Hirofumi Fujita, Osaka (JP); Shinya Fujimura, Osaka (JP); Seiji Nishiyama, Osaka (JP); Kenichi Nendai, Kyoto (JP); Kou Sugano, Osaka (JP); Shuhei Yada, Osaka (JP)

(73) Assignee: Panasonic Corporation, Osaka (JP)

( * ) Notice: Subject to any disclaimer, the term of this patent is extended or adjusted under 35 U.S.C. 154(b) by 140 days.

(21) Appl. No.: 13/660,291

(22) Filed: Oct. 25, 2012

(65) Prior Publication Data

US 2013/0056719 A1    Mar. 7, 2013

Related U.S. Application Data

(63) Continuation of application No. PCT/JP2012/000963, filed on Feb. 14, 2012.

(30) Foreign Application Priority Data

May 11, 2011    (JP) .................................. 2011-106596

(51) Int. Cl.
   *H01L 35/24* (2006.01)
(52) U.S. Cl.
   USPC ...................................... 257/40; 257/E51.001
(58) Field of Classification Search
   USPC ............................................ 257/40, E51.001
   See application file for complete search history.

(56) References Cited

U.S. PATENT DOCUMENTS

| | | |
|---|---|---|
| 5,294,869 A | 3/1994 | Tang et al. |
| 5,443,922 A | 8/1995 | Nishizaki et al. |
| 5,688,551 A | 11/1997 | Littman et al. |

(Continued)

FOREIGN PATENT DOCUMENTS

| | | |
|---|---|---|
| EP | 2175504 | 4/2010 |
| JP | 05-163488 A | 6/1993 |

(Continued)

OTHER PUBLICATIONS

Hyunbok Lee et al., "The origin of the hole injection improvements at indium tin oxide/molybdenum trioxide/N,N'-bis (1-naphthyl)-N,N'-diphenyl-1,1'-biphenyl-4,4'-diamine interface", Applied Physics Letters 93, 043308 (2008).

(Continued)

*Primary Examiner* — Anthony Ho
(74) *Attorney, Agent, or Firm* — Greenblum & Bernstein, P.L.C.

(57) ABSTRACT

Provided is organic EL display panel and an organic EL display apparatus that can be driven at a low voltage and that exhibit excellent light-emitting efficiency. Included are a substrate, a first electrode, an auxiliary wiring, a hole injection layer, a functional layer, and a second electrode. The hole injection layer and the second electrode are formed to be continuous above the first electrode and above the auxiliary wiring. The second electrode and the auxiliary wiring are electrically connected by the hole injection layer in an organic EL display panel. The hole injection layer is a metal oxide film, and metal atoms constituting the metal oxide include both metal atoms at a maximum valence thereof and metal atoms at a valence less than the maximum valence. The metal oxide film includes a metal oxide crystal with a particle diameter on the order of nanometers.

43 Claims, 42 Drawing Sheets

(56) References Cited

U.S. PATENT DOCUMENTS

| | | | |
|---|---|---|---|
| 6,132,280 | A | 10/2000 | Tanabe et al. |
| 6,284,393 | B1 | 9/2001 | Hosokawa et al. |
| 6,309,801 | B1 | 10/2001 | Meijer et al. |
| 2002/0051894 | A1 | 5/2002 | Yoshikawa |
| 2002/0158835 | A1 | 10/2002 | Kobayashi et al. |
| 2003/0137242 | A1 | 7/2003 | Seki |
| 2004/0075385 | A1 | 4/2004 | Tao |
| 2004/0178414 | A1 | 9/2004 | Frey et al. |
| 2005/0064633 | A1 | 3/2005 | Mikoshiba |
| 2005/0170208 | A1 | 8/2005 | Yatsunami et al. |
| 2005/0208206 | A1 | 9/2005 | Yoshikawa |
| 2005/0266763 | A1 | 12/2005 | Kimura et al. |
| 2006/0008931 | A1 | 1/2006 | Lee et al. |
| 2006/0204788 | A1 | 9/2006 | Yoshikawa |
| 2006/0243377 | A1 | 11/2006 | Matsuo et al. |
| 2006/0284166 | A1 | 12/2006 | Chua et al. |
| 2007/0029929 | A1 | 2/2007 | Nakamura et al. |
| 2007/0172978 | A1 | 7/2007 | Chua et al. |
| 2007/0241665 | A1 | 10/2007 | Sakanoue et al. |
| 2007/0290604 | A1 | 12/2007 | Sakanoue et al. |
| 2008/0150422 | A1 | 6/2008 | Ohara |
| 2008/0231179 | A1 | 9/2008 | Abe et al. |
| 2009/0115318 | A1 | 5/2009 | Gregory et al. |
| 2009/0160325 | A1 | 6/2009 | Yatsunami et al. |
| 2009/0243478 | A1 | 10/2009 | Shoda et al. |
| 2009/0272999 | A1 | 11/2009 | Yoshida et al. |
| 2009/0284135 | A1 | 11/2009 | Yoshida et al. |
| 2009/0284141 | A1 | 11/2009 | Sakanoue et al. |
| 2009/0284144 | A1 | 11/2009 | Fujioka et al. |
| 2010/0102310 | A1 | 4/2010 | Komatsu et al. |
| 2010/0213827 | A1 | 8/2010 | Yoshida et al. |
| 2010/0258833 | A1 | 10/2010 | Okumoto et al. |
| 2010/0302221 | A1 | 12/2010 | Okumoto |
| 2011/0037065 | A1 | 2/2011 | Ueno et al. |
| 2011/0037068 | A1 | 2/2011 | Yamazaki et al. |
| 2011/0042703 | A1 | 2/2011 | Okumoto et al. |
| 2012/0061656 | A1 | 3/2012 | Ohuchi et al. |
| 2012/0178191 | A1 | 7/2012 | Sakanoue et al. |

FOREIGN PATENT DOCUMENTS

| | | | |
|---|---|---|---|
| JP | 10-162959 | A | 6/1998 |
| JP | 2000-133446 | A | 5/2000 |
| JP | 2000-223276 | A | 8/2000 |
| JP | 2002-075661 | A | 3/2002 |
| JP | 2002-530881 | A | 9/2002 |
| JP | 2002-318556 | A | 10/2002 |
| JP | 3369615 | B2 | 11/2002 |
| JP | 2003-007460 | A | 1/2003 |
| JP | 2003-249375 | A | 9/2003 |
| JP | 2003-264083 | A | 9/2003 |
| JP | 2004-139746 | A | 5/2004 |
| JP | 2004-228355 | A | 8/2004 |
| JP | 2004-234901 | A | 8/2004 |
| JP | 2004-527093 | A | 9/2004 |
| JP | 2004-363170 | A | 12/2004 |
| JP | 2005-012173 | A | 1/2005 |
| JP | 2005-197189 | A | 7/2005 |
| JP | 2005-203339 | A | 7/2005 |
| JP | 2005-203340 | A | 7/2005 |
| JP | 2005-267926 | A | 9/2005 |
| JP | 2005-268099 | A | 9/2005 |
| JP | 2005-331665 | A | 12/2005 |
| JP | 2006-024573 | A | 1/2006 |
| JP | 2006-114928 | A | 4/2006 |
| JP | 3789991 | B2 | 4/2006 |
| JP | 2006-185869 | A | 7/2006 |
| JP | 2006-253443 | A | 9/2006 |
| JP | 2006-294261 | A | 10/2006 |
| JP | 2006-344459 | A | 12/2006 |
| JP | 2007-073499 | A | 3/2007 |
| JP | 2007-095606 | A | 4/2007 |
| JP | 2007-214066 | A | 8/2007 |
| JP | 2007-527542 | A | 9/2007 |
| JP | 2007-287353 | A | 11/2007 |
| JP | 2007-288071 | A | 11/2007 |
| JP | 2007-288074 | A | 11/2007 |
| JP | 2008-041747 | A | 2/2008 |
| JP | 2008-053556 | A | 3/2008 |
| JP | 2008-091072 | A | 4/2008 |
| JP | 2008-124268 | A | 5/2008 |
| JP | 2008-140724 | A | 6/2008 |
| JP | 2008-177557 | A | 7/2008 |
| JP | 2008-241238 | A | 10/2008 |
| JP | 2008-270731 | A | 11/2008 |
| JP | 2009-004347 | A | 1/2009 |
| JP | 2009-044103 | A | 2/2009 |
| JP | 2009-048960 | A | 3/2009 |
| JP | 2009-054582 | A | 3/2009 |
| JP | 2009-058897 | A | 3/2009 |
| JP | 2009-218156 | A | 9/2009 |
| JP | 2009-239180 | A | 10/2009 |
| JP | 2009-260306 | A | 11/2009 |
| JP | 2009-277590 | A | 11/2009 |
| JP | 2009-277788 | A | 11/2009 |
| JP | 2010-010670 | A | 1/2010 |
| JP | 2010-021138 | A | 1/2010 |
| JP | 2010-021162 | A | 1/2010 |
| JP | 2010-033972 | A | 2/2010 |
| JP | 2010-050107 | A | 3/2010 |
| JP | 2010-073700 | A | 4/2010 |
| JP | 2010-103374 | A | 5/2010 |
| JP | 2010-161070 | A | 7/2010 |
| JP | 2010-161185 | A | 7/2010 |
| JP | 2011-040167 | A | 2/2011 |
| JP | 2011-044445 | | 3/2011 |
| WO | 2008/120714 | A1 | 10/2008 |
| WO | 2008/149498 | A1 | 12/2008 |
| WO | 2008/149499 | A1 | 12/2008 |
| WO | 2010/032443 | A1 | 3/2010 |
| WO | 2010/032444 | A1 | 3/2010 |
| WO | 2010/058716 | A1 | 5/2010 |
| WO | 2010/070798 | A1 | 6/2010 |
| WO | 2010/092795 | A1 | 8/2010 |
| WO | 2010/092796 | A1 | 8/2010 |
| WO | 2010/092797 | A1 | 8/2010 |
| WO | 2011/021343 | A1 | 2/2011 |
| WO | 2012/017495 | A1 | 2/2012 |
| WO | 2012/017502 | A1 | 2/2012 |
| WO | 2012/017503 | A1 | 2/2012 |

OTHER PUBLICATIONS

Kenji Koizumi et al., The electronic structure of alpha-NOD/MoO3 interface, Dai 56 kai Ouyou Butsurigaku Kankei Rengou Kouenaki Yokoushuu (Extended Abstracts for the 56th Spring Meeting of the Japan Society of Applied Physics and Related Societies), No. 3, 30p-ZA-11, The Japan Society of Applied Physics, p. 1279 (Apr. 2, 2009). Along with a verified English language translation.

Jingze Li et al., "Enhanced performance of organic light emitting device by insertion of conducting/insulating WO3 anodic buffer layer", Syntetic Metals 151, pp. 141-146 (2005).

Hiromi Watanabe et al., "Structure and Physical Property Evaluation of MoOX Thin-Film in Reactive Sputtering Method, and MoOX/α-NPD Boundary Analysis", (Nov. 20, 2008). Along with a verified English language partial translation.

Yasuo Nakayama et al., "MoO3 on F8BT Boundary Electron Structure: Research through Photoemission Spectrography and Meta-Stable Excited Atom Spectrometry", (Nov. 20, 2008). Along with a verified English language partial translation.

Min Jung Son et al., "Interface electronic structures of organic light-emitting diodes with WO3 interlayer: A study by photoelectron spectroscopy", Organic Electronics 10, pp. 637-642 (2009).

Kaname Kanai et al., "Electronic structure of anode interface with molybdenum oxide buffer layer", Organic Electronics 11, pp. 188-194 (2010).

F. Bussolotti et al, "Surface electronic properties of polycrystalline WO3 thin films: a study by core level and valence band photoemission". Surface Science 538, pp. 113-123 (2003).

Qin-Ye Bao et al., "Interfacial electronic structures of WO3-based intermediate connectors in tandem organic light-emitting diodes", Organic Electronics 11, pp. 1578-1583 (2010).

(56) References Cited

OTHER PUBLICATIONS

Th. Kugler et al., "Polymer band alignment at the interface with indium tin oxide: consequences for light emitting devices", Chemical Physics Letters 310, pp. 391-396 (1999).

I. N. Yakovkin et al., "Driving force for the WO3(001) surface relaxation", Surface Science 601, pp. 1481-1488 (2007).

J. B. Pedley et al., "Thermochemical Data for Gaseous Monoxides", Journal of Physical and Chemical Reference Data. vol. 12. No. 4. pp. 967-1032 (1983).

M. Stolze et al., "Nature of substoichiometry in reactively DC-sputtered tungsten oxide thin films and its effect on the maximum obtainable colouration by gases", Thin Solid Films 409, pp. 254-264 (2002).

V. Bulovic et al., "Transparent light-emitting devices", Nature, vol. 380, p. 29 (1996).

Meyer et al., "Charge generation layers comprising transition metal-oxide/organic interfaces: Electronic structure and charge generation mechanism", Applied Physics Letters, 96, 193302, pp. 1-3 (May 2010).

United States Office Action in U.S. Appl. No. 13/742,584, dated Apr. 14, 2014.

Ramana et al., "Electron microscopy investigation of structural transformation in tungsten oxide (WO3) thin films", Physica Status Solidi (a) 202, No. 10, pp. R108-R110 (Jul. 6, 2005).

Horsley et al., "Structure of Surface Tungsten Oxide Species in the WO3/AL2O3 Supported Oxide System from X-Ray Abortion Near-edge Spectroscopy and Raman Spectroscopy", Journal of Physical Chemistry, 91, pp. 4014-4020 (1987).

United States Office Action in U.S. Appl. No. 13/742,600, dated Apr. 14, 2014.

United States Office Action in U.S. Appl. No. 13/740,348, dated Apr. 29, 2014.

U.S. Appl. No. 13/736,419 to Shinya Fujimura, filed Jan. 8, 2013.

U.S. Appl. No. 13/740,348 to Seiji Nishiyama et al., filed Jan. 14, 2013.

U.S. Appl. No. 13/742,600 to Kenji Harada et al., filed Jan. 16, 2013.

U.S. Appl. No. 13/742,584 to Kenji Harada et al., filed Jan. 16, 2013.

U.S. Appl. No. 13/995,205 to Takahiro Komatsu et al., filed Jun. 18, 2013.

International Search Report in PCT/JP2010/004833, dated Oct. 12, 2010.

International Search Report in PCT/JP2010/004985, dated Nov. 16, 2010.

International Search Report in PCT/JP2010/004992, dated Nov. 16, 2010.

International Search Report in PCT/JP2010/004991, dated Nov. 16, 2010.

International Search Report in PCT/JP2012/000288, dated Apr. 17, 2012.

International Search Report in PCT/JP2011/006448, dated Feb. 21, 2012.

International Search Report in PCT/JP2012/000963, dated May 15, 2012.

U.S. Appl. No. 14/000,977 to Satoru Ohuchi et al., filed Aug. 22, 2013.

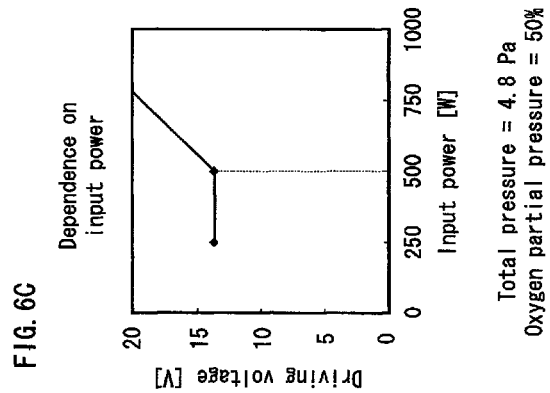
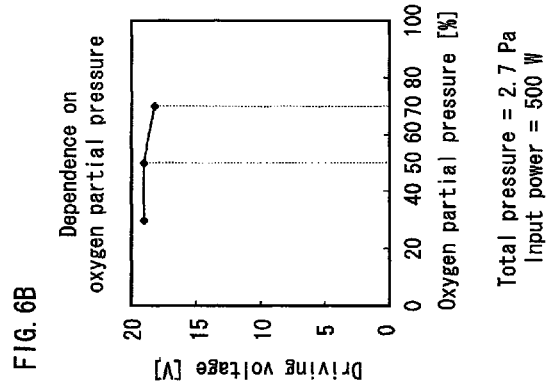
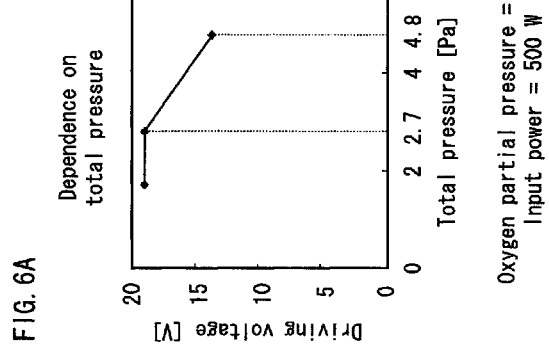

(a): Appropriate injection sites for tungsten oxide layer)

(b, c): No/insufficient injection sites for tungsten oxide layer)

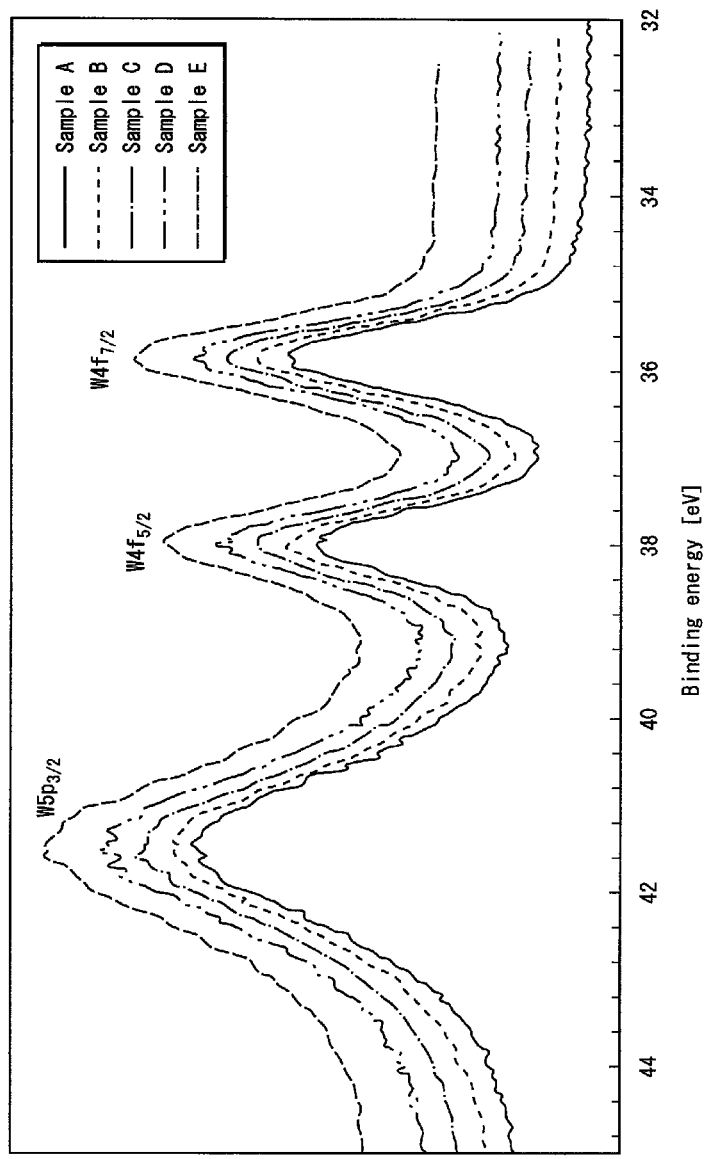

○ : Tungsten
◍ : Oxygen

FIG. 36
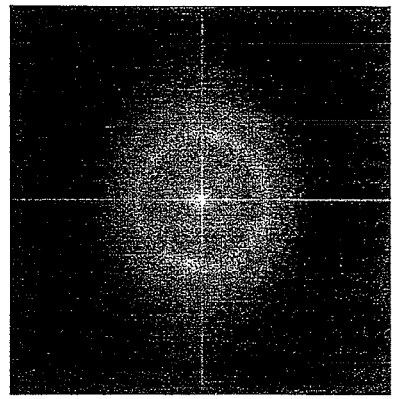
Sample C
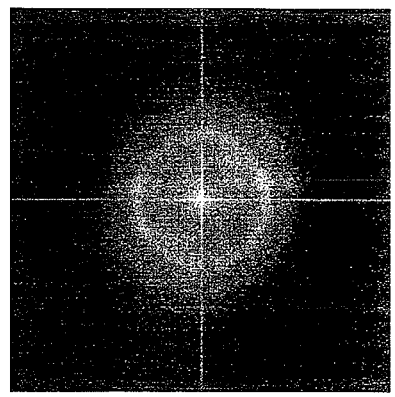
Sample B
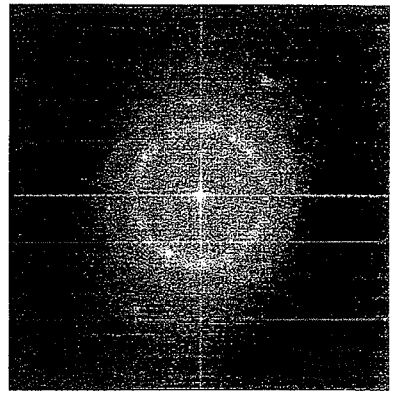
Sample A
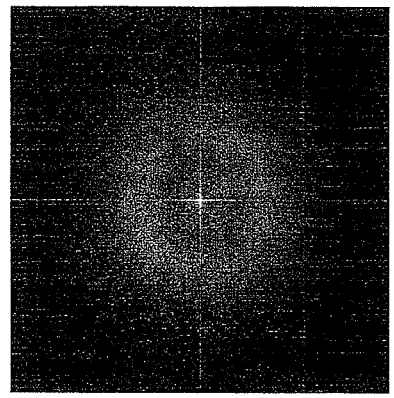
Sample E
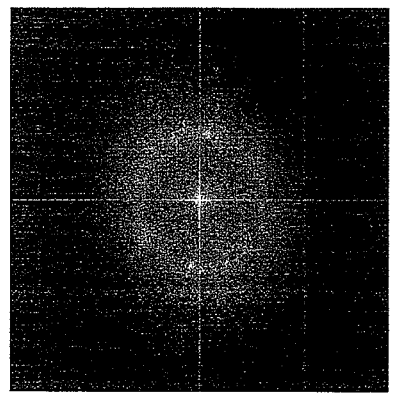
Sample D FIG. 38
Sample A
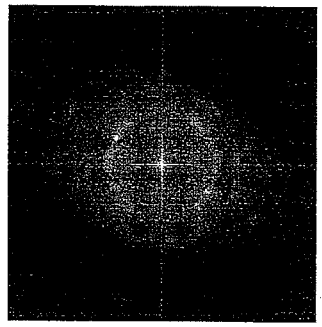 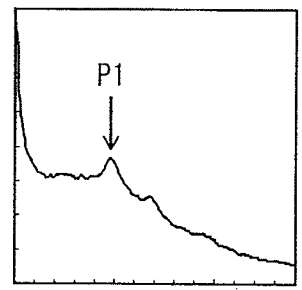
Sample B
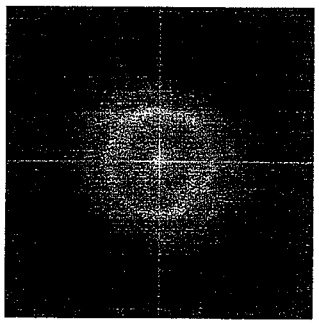 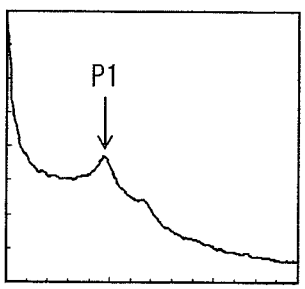
Sample C
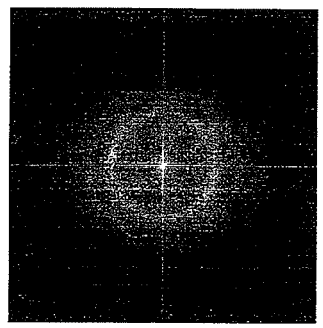 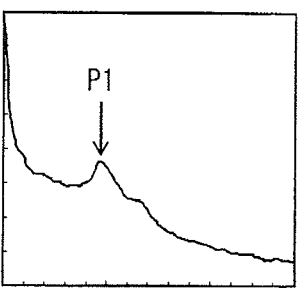

FIG. 39
Sample D
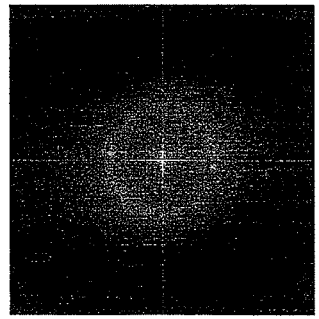 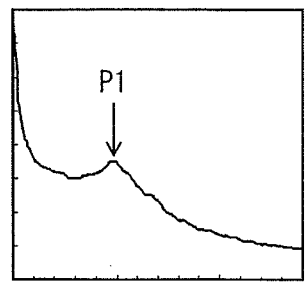
Sample E
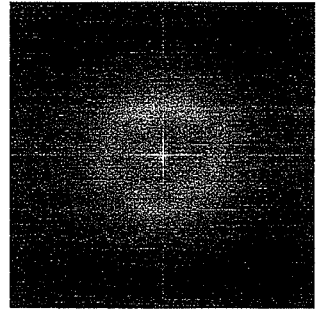 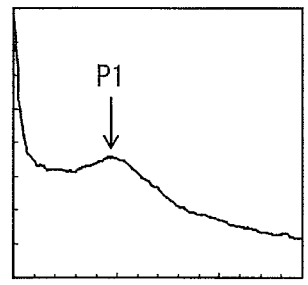

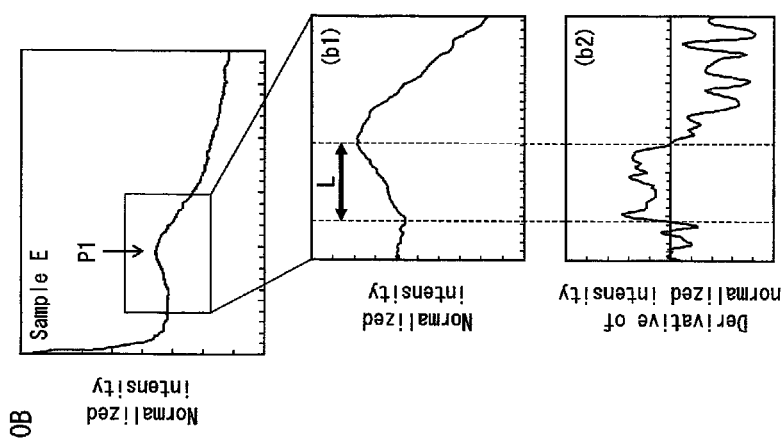
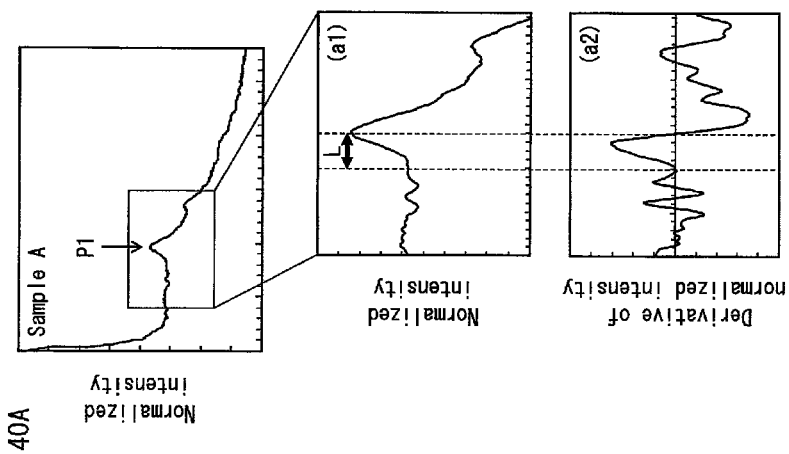
FIG. 40A
FIG. 40B

ORGANIC EL DISPLAY PANEL AND ORGANIC EL DISPLAY APPARATUS

This is a continuation of International Application PCT/JP2012/000963, with an international filing date of Feb. 14, 2012.

TECHNICAL FIELD

The present invention relates to organic EL display panels and organic EL display apparatuses that use electric light-emitting elements that are organic electric-field light-emitting elements (hereinafter referred to as "organic EL elements").

BACKGROUND ART

In recent years, progress is being made in research and development of diverse functional elements that use organic semiconductors. Organic EL elements are among the most common of such functional elements. An organic EL element is a current-driven light emitter that includes a pair of electrodes, consisting of an anode and a cathode, and a functional layer disposed between the pair of electrodes. The functional layer includes a light-emitting layer formed from organic material. Voltage is applied between the pair of electrodes. The emission of light from the organic EL element is caused by an electric-field light-emitting phenomenon taking place as a result of the recombination of holes injected from the anode to the functional layer and electrons injected from the cathode to the functional layer. Given the high visibility of organic EL elements resulting from their self-luminescence, as well as their excellent shock resistance resulting from the fully solid-state structure thereof, more attention is now being given to the application of organic EL elements as a light emitter for various organic EL display panels and organic EL display apparatuses or a light source.

In order to increase the light emission efficiency of an organic EL element, efficient injection of carriers (holes and electrons) from the electrodes to the functional layer is essential. Generally, provision of an injection layer in between each of the electrodes and the functional layer is effective in realizing efficient injection of carriers to the functional layer, since an injection layer has the function of lowering the energy barrier during injection. An organic material, such as copper phthalocyanine or PEDOT (conducting polymer), or a metal oxide, such as molybdenum oxide or tungsten oxide, is used as the hole injection layer provided between the functional layer and the anode. An organic material, such as a metal complex or oxadiazole, or a metal such as barium is used as the electron injection layer provided between the functional layer and the cathode.

Among such injection layers, an improvement in hole injection efficiency as well as longevity of the organic EL element has been reported for an organic EL element using a metal oxide, such as molybdenum oxide or tungsten oxide, as the hole injection layer (see Patent Literature 1, 2, and Non-Patent Literature 1). A report has also been made regarding the influence on the improvement by the electron level formed by structures similar to an oxygen vacancy of the metal oxide on the surface of the hole injection layer (Non-Patent Literature 2).

On the other hand, as organic EL display panels grow in size, it becomes necessary to reduce the resistance of the wiring portion that connects the power source to the electrodes in the organic EL pixels constituting the panel. In particular, in a top emission type active-matrix organic EL display panel, it is necessary to use transparent electrode material, such as ITO or IZO, as the common electrode. As these materials are relatively high resistance, it is desirable to limit their use as a wiring portion.

With respect to this point, for example, Patent Literature 3 discloses a top emission type organic EL element with a wiring portion structured so that the second electrode (common electrode) is connected to auxiliary wiring, thus providing a wiring portion that reduces the use of the relatively high-resistance common electrode. The auxiliary wiring is low-resistance wiring that provides electrons from the power source to the common electrode.

It is desirable to provide the auxiliary wiring in a non-light-emitting cell, so as not to block the light-emitting cell. Furthermore, the auxiliary wiring may be provided either above or below the common electrode in the non-light-emitting cell. A structure in which the auxiliary wiring is provided below can be considered more desirable, as the auxiliary wiring can be formed during the same processes as when forming other components such as the thin-film transistors and pixel electrodes.

CITATION LIST

Patent Literature

Patent Literature 1: Japanese Patent Application Publication No. 2005-203339
Patent Literature 2: Japanese Patent Application Publication No. 2007-288074
Patent Literature 3: Japanese Patent Application Publication No. 2002-318556

Non-Patent Literature

Non-Patent Literature 1: Jingze Li et al., Synthetic Metals 151, 141 (2005).
Non-Patent Literature 2: Kaname Kanai et al., Organic Electronics 11, 188 (2010).
Non-Patent Literature 3: M. Stolze et al., Thin Solid Films 409, 254 (2002).
Non-Patent Literature 4: Hiromi Watanabe et al., Yuki EL Tohronkai Dai 7 Kai Reikai Yokoushu 17 (2008).
Non-Patent Literature 5: I. N. Yakovkin et al., Surface Science 601, 1481 (2007).
Non-Patent Literature 6: Hyunbok Lee et al., Applied Physics Letters 93, 043308 (2008).
Non-Patent Literature 7: Yasuo Nakayama et al., Yuki EL Tohronkai Dai 7 Kai Reikai Yokoushu 5 (2008).

SUMMARY OF INVENTION

Technical Problem

Vapor deposition or sputtering is typically used as the method for forming the above metal oxide film. Taking into consideration the heat resistance of the layer already formed on the substrate at the point of formation of the metal oxide film, the metal oxide film is typically formed at a low substrate temperature of 200° C. or less.

Typically, forming the metal oxide film at a low substrate temperature with the sputtering method leads to reduced diffusion along the substrate surface of metal oxide particles that are sputtered and reach the substrate, easily leading to formation of a metal oxide film with a disorderly, amorphous structure. Furthermore, the difficulty of maintaining the composition and thickness of the metal oxide film uniform when forming the film at a low substrate temperature has also been reported (Non-Patent Literature 3).

When the metal oxide film is amorphous, the locations that receive an injection of holes, such as locations similar to an oxygen vacancy, are isolated from each other throughout the film. Conduction of holes in the film is therefore achieved by the holes hopping between these isolated locations. In order to use such a metal oxide film when driving the organic EL elements, however, it is necessary to apply a high driving voltage to the organic EL elements. In other words, due to having a low hole conduction efficiency, hopping conduction leads to the problem of an increase in the driving voltage of the elements.

On the other hand, in an organic EL element in which the auxiliary wiring is below the common electrode, patterning is typically performed after forming the pixel electrodes (anode) and the auxiliary wiring as one film. The hole injection layer is subsequently layer thereon.

In this context, it is desirable that a hole injection layer made from copper phthalocyanine or PEDOT not be formed on the auxiliary wiring. This is not only because such hole injection layers are typically high resistance, but also because forming such hole injection layers on the auxiliary wiring prevents the supply of electrodes from the auxiliary wiring to the common electrode.

Specifically, such hole injection layers are designed so that the binding energy of the highest occupied molecular orbital is near (approximately equal to) the Fermi level of ITO or the like, which is typically used as the anode. Conversely, the lowest unoccupied molecular orbital is quite far from the Fermi level. As a result, although hole injection into the hole injection layers from the anode is relatively easy, electron injection is difficult. While this is advantageous in the light-emitting unit, it causes an increase in resistance of the wiring portion at the connecting portion between the auxiliary wiring and the common electrode, as electrons cannot be provided to the common electrode through the hole injection layers from the auxiliary wiring which is made from the same material as the anode.

Furthermore, many materials used for the hole injection layer are chemically unstable with respect to electrons and tend to decompose or degrade upon continual reception of electrons over an extended period of time. This may result in degradation of the panel characteristics.

It is therefore necessary that these hole injection layers not be formed by patterning on the auxiliary wiring. Methods for film information by patterning include 1) a method of selectively forming films on pixel electrodes using mask deposition, screen printing, inkjet printing, or the like, and 2) a method of first forming a film over the entire surface, and then using photolithography, dry etching, or the like to selectively remove only portions above the auxiliary wiring. The increase in the number of processes with both of these methods, however, leads to an increase in manufacturing costs, as well as an increase in particles that lowers the yield. Furthermore, resist residue and the like from the patterning may remain on the auxiliary wiring, acting as a resistance component and further increasing the resistance of the wiring portion.

In view of such problems, the present disclosure provides an organic EL display panel and an organic EL display apparatus that can be driven at a low voltage and that exhibit excellent light-emitting efficiency.

Solution to Problem

An organic EL display panel according to an aspect of the present invention comprises a substrate; at least one first electrode on or in the substrate; auxiliary wiring on or in the substrate at a distance from the first electrode; a functional layer, including at least a light-emitting layer, above the first electrode; a hole injection layer for injecting holes to the functional layer, the hole injection layer being between the first electrode and the functional layer; and a second electrode above the functional layer, wherein the hole injection layer and the second electrode are both formed to be continuous above the first electrode and above the auxiliary wiring, the second electrode and the auxiliary wiring are electrically connected by the hole injection layer, the hole injection layer includes a metal oxide film, metal atoms constituting the metal oxide include both metal atoms at a maximum valence thereof and metal atoms at a valence less than the maximum valence, and the metal oxide film includes a crystal of the metal oxide, a particle diameter of the crystal being on an order of nanometers.

Advantageous Effects of Invention

In an organic EL display panel and an organic EL display apparatus according to an aspect of the present invention, the hole injection layer is formed from a metal oxide film including a metal oxide, and metal atoms constituting the metal oxide include both metal atoms at a maximum valence thereof and metal atoms at a valence less than the maximum valence. Therefore, the metal oxide film is provided with regions for the conduction of holes and electrons. Additionally, the hole injection layer includes a metal oxide crystal with a particle diameter on the order of nanometers. Therefore, numerous crystal surfaces and grain boundaries form in the hole injection layer.

Providing the hole injection layer with the above structure allows for reduction in the hole injection barrier between the hole injection layer and the functional layer in the light-emitting cell, while also allowing for the exchange of carriers with almost no barrier between the pixel electrode in the light-emitting cell and the hole injection layer, between the auxiliary wiring in the wiring portion and the hole injection layer, and between the hole injection layer and the common electrode. Furthermore, in the light-emitting cell, conduction paths for holes extend through the hole injection layer in the direction of thickness thereof, thus achieving effective hole conduction. In the wiring portion, electrons can easily move along the conduction paths in the hole injection layer, thus maintaining the wiring portion at a good, low resistance. In sum, the above aspect of the present invention achieves low driving voltage and excellent light-emitting efficiency.

BRIEF DESCRIPTION OF DRAWINGS

FIGS. 6A through 6C are graphs illustrating a dependence of driving voltage of hole-only devices on film forming conditions of a hole injection layer;

FIG. 31 is a diagram illustrating spectra belonging to $W5p_{3/2}$, $W4f_{5/2}$, and $W4f_{7/2}$ as obtained by HXPS measurement of a tungsten oxide layer;

FIG. 36 shows 2D Fourier transform images for the TEM photographs shown in FIG. 35;

FIG. 38 shows 2D Fourier transform images and plots of change in luminance for samples A, B, and C;

FIG. 39 shows 2D Fourier transform images and plots of change in luminance for samples D and E;

FIGS. 40A and 40B are plots of change in luminance for samples A and E, with (a1) and (b1) being enlarged diagrams of each peak closest to the center point in the plots of change in luminance, and (a2) and (b2) being the first derivative of the plot of change in luminance in (a1) and (b1);

DESCRIPTION OF EMBODIMENTS

Figure 1A:
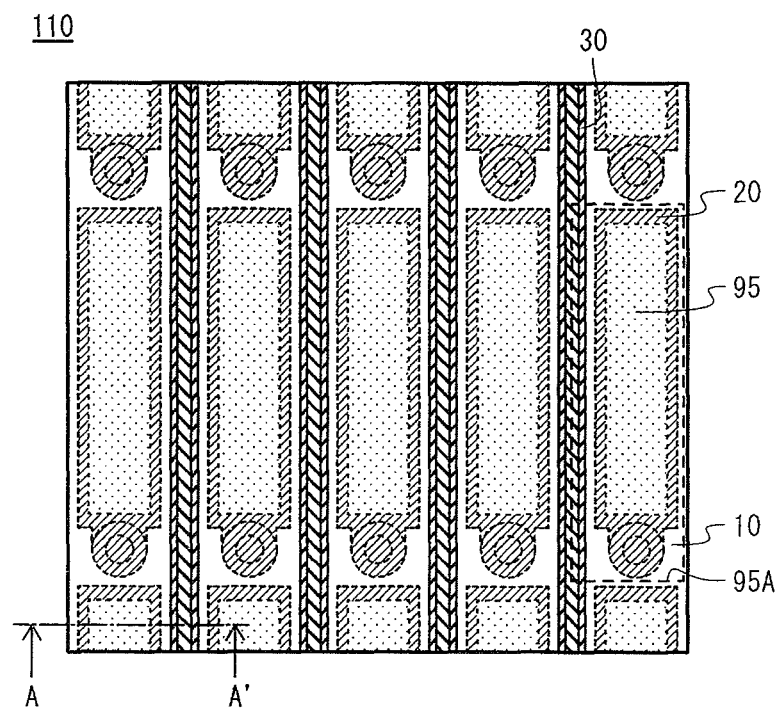
FIGS. 1A, 1B, 1C, and 1D are diagrams illustrating an organic EL display panel according to an aspect of the present invention.

Outline of an Aspect of the Present Invention

An organic EL display panel according to an aspect of the present invention comprises a substrate; at least one first electrode on or in the substrate; auxiliary wiring on or in the substrate at a distance from the first electrode; a functional layer, including at least a light-emitting layer, above the first electrode; a hole injection layer for injecting holes to the functional layer, the hole injection layer being between the first electrode and the functional layer; and a second electrode above the functional layer, wherein the hole injection layer and the second electrode are both formed to be continuous above the first electrode and above the auxiliary wiring, the second electrode and the auxiliary wiring are electrically connected by the hole injection layer, the hole injection layer includes a metal oxide film, metal atoms constituting the metal oxide include both metal atoms at a maximum valence thereof and metal atoms at a valence less than the maximum valence, and the metal oxide film includes a crystal of the metal oxide, a particle diameter of the crystal being on an order of nanometers.

In the above structure, the hole injection layer is formed from a metal oxide film including a metal oxide, and metal atoms constituting the metal oxide include both metal atoms at a maximum valence thereof and metal atoms at a valence less than the maximum valence. Therefore, the metal oxide film is provided with regions for the conduction of holes and electrons. Additionally, the hole injection layer includes a metal oxide crystal with a particle diameter on the order of nanometers. Therefore, numerous crystal surfaces and grain boundaries form in the hole injection layer. As a result, in the light-emitting cell, conduction paths for holes extend through the hole injection layer in the direction of thickness thereof, thus achieving effective hole conduction. In the wiring portion, electrons can easily move along the conduction paths in the hole injection layer, thus maintaining the wiring portion at a good, low resistance. This structure thus achieves low driving voltage and excellent light emitting efficiency. In this context, the "particle diameter on an order of nanometers" refers to a size that is approximately 5 nm to 10 nm and that is smaller than the thickness of the hole injection layer.

Furthermore, in the above structure, carriers can be exchanged with almost no barrier between the auxiliary wiring in the wiring portion and the hole injection layer, and between the hole injection layer and the common electrode. Electrons are also easily conducted through the hole injection layer in the wiring portion. It therefore poses no problem to form the hole injection layer on the auxiliary wiring, making a step to pattern the hole injection layer unnecessary. This not only reduces the number of processes but also allows for stable mass production.

Furthermore, with the above structure, the hole injection layer is constituted by chemically stable tungsten oxide. Therefore, the hole injection layer can be prevented from degrading or changing in properties by appropriately selecting the alkaline solution, water, organic solvent, or the like used during formation of the bank. Accordingly, after completion of the organic EL element, the hole injection layer is able to maintain its form, its excellent efficiency for injecting holes to the functional layer in the light emitting cell, and its excellent exchange of carriers with the common electrode in the wiring portion. This allows for manufacturing of an organic EL element that can withstand processing performed during the mass production of organic EL display panels.

The light-emitting layer of the organic EL element is layered after formation of the hole injection layer. Typically, the light-emitting layer is applied separately for each color of emitted light (for example, R, G and B). To prevent colors from mixing between pixels and to ensure a high level of accuracy, barriers (hereinafter referred to as a bank) may be provided between pixels. The bank is typically formed with photolithography, for example by applying bank material composed of photosensitive resist material onto the surface of the hole injection layer, pre-baking the bank material, exposing the bank material to light with a pattern mask, removing unhardened, excess bank material with a developer composed of an alkaline solution or the like, and finally rinsing with pure water. To form the bank, an alkaline solution, water, an organic solvent, and the like are used. If the hole injection layer is composed of an organic material, such material will degrade or change in properties due to the above solutions, thereby damaging the hole injection layer and preventing the achievement of the desired hole injection efficiency. By contrast, the hole injection layer according to an aspect of the present invention is formed from tungsten oxide, which does not easily degrade or change in properties due to the above solvents. The above problem therefore does not occur.

In the organic EL display panel according to the above aspect of the present invention, the second electrode may be a transparent electrode.

In the organic EL display panel according to the above aspect of the present invention, the transparent electrode may be one of ITO and IZO.

In the organic EL display panel according to the above aspect of the present invention, the second electrode may have one of Al and Ag as a primary component.

The organic EL display panel according to the above aspect of the present invention may further comprise a metal layer formed to be continuous above the first electrode and above the auxiliary wiring, wherein, above the first electrode, the metal layer is between the second electrode and the light-emitting layer, and above the auxiliary wiring, the metal layer is between the second electrode and the hole injection layer.

In the organic EL display panel according to the above aspect of the present invention, the metal layer may be an electron injection layer that, above the first electrode, injects electrons from the second electrode to the light-emitting layer.

In the organic EL display panel according to the above aspect of the present invention, the metal layer may include barium (Ba).

In the organic EL display panel according to the above aspect of the present invention, the auxiliary wiring may be one of ITO and IZO.

As described above, carriers can be exchanged with almost no barrier between the hole injection layer and the auxiliary wiring composed of ITO or IZO. Accordingly, the organic EL display panel according to an aspect of the present invention can be expected to allow for driving at a low voltage while exhibiting excellent light-emitting efficiency.

In the organic EL display panel according to the above aspect of the present invention, the hole injection layer above the auxiliary wiring may have properties identical to the hole injection layer above the first electrode.

In the organic EL display panel according to the above aspect of the present invention, at least above the auxiliary wiring, the hole injection layer may be at least 4 nm thick.

The above structure is even more desirable, since Schottky ohmic contact stably forms between the auxiliary wiring in the wiring portion and the hole injection layer, as well as between the hole injection layer and the metal layer. Stable carrier exchange can therefore be expected.

In other words, it is desirable to guarantee at least 2 nm for stable Schottky ohmic contact between the auxiliary wiring in the hole injection layer, and to guarantee at least 2 nm for stable Schottky ohmic contact between the hole injection layer and the metal layer. A thickness of at least 4 nm is therefore considered even more desirable.

The organic EL display panel according to the above aspect of the present invention may further comprise a bank on the hole injection layer defining at least one aperture exposing the first electrode and including a region exposing the auxiliary wiring, wherein the light-emitting layer is formed above the first electrode in the aperture defined by the bank.

In the organic EL display panel according to the above aspect of the present invention, the at least one first electrode may comprise a plurality of first electrodes, one per pixel, and the at least one aperture in the bank may comprise a plurality of apertures formed in one-to-one correspondence with the first electrodes.

In the organic EL display panel according to the above aspect of the present invention, the at least one first electrode may comprise a plurality of first electrodes, one per pixel, arranged in lines, and the at least one aperture in the bank may comprise a plurality of apertures, one for each of the lines of the first electrodes.

In the organic EL display panel according to the above aspect of the present invention, the hole injection layer may be at least 2 nm thick.

In the organic EL display panel according to the above aspect of the present invention, a UPS spectrum of the hole injection layer may exhibit an upward protrusion in a range between 1.8 electron volts and 3.6 electron volts lower than a lowest energy level of a valence band in terms of binding energy.

In the organic EL display panel according to the above aspect of the present invention, an XPS spectrum of the hole injection layer may exhibit an upward protrusion in a range between 1.8 electron volts and 3.6 electron volts lower than a lowest energy level of a valence band in terms of binding energy.

In the organic EL display panel according to the above aspect of the present invention, a differential spectrum obtained by differentiating a UPS spectrum of the hole injection layer may exhibit a shape expressed by a non-exponential function throughout a range between 2.0 electron volts and 3.2 electron volts lower than a lowest energy level of a valence band in terms of binding energy.

In the organic EL display panel according to the above aspect of the present invention, an occupied energy level of the hole injection layer may be in a range between 2.0 electron volts and 3.2 electron volts lower than a lowest energy level of a valence band in terms of binding energy.

In the organic EL display panel according to the above aspect of the present invention, at an interface between the hole injection layer and the functional layer, an occupied energy level of the hole injection layer may cause a highest occupied molecular orbital of the functional layer to be approximately equal to the occupied energy level in terms of binding energy.

In the organic EL display panel according to the above aspect of the present invention, at the interface between the hole injection layer and the functional layer, a gap between the occupied energy level and the highest occupied molecular orbital of the functional layer may be at most 0.3 electron volts in terms of binding energy.

In the organic EL display panel according to the above aspect of the present invention, at an interface between the first electrode and the hole injection layer, an occupied energy level of the hole injection layer may cause a binding energy of the occupied energy level to be approximately equal to a Fermi level of the first electrode.

In the organic EL display panel according to the above aspect of the present invention, at the interface between the first electrode and the hole injection layer, a gap between the occupied energy level and the Fermi level of the first electrode may be at most 0.3 electron volts in terms of binding energy.

In the organic EL display panel according to the above aspect of the present invention, at an interface between the auxiliary wiring and the hole injection layer, an occupied energy level of the hole injection layer may cause a binding energy of the occupied energy level to be approximately equal to a Fermi level of the auxiliary wiring.

In the organic EL display panel according to the above aspect of the present invention, at the interface between the auxiliary wiring and the hole injection layer, a gap between the occupied energy level and the Fermi level of the auxiliary wiring may be at most 0.3 electron volts in terms of binding energy.

In the organic EL display panel according to the above aspect of the present invention, at an interface between the hole injection layer and the second electrode, an occupied energy level of the hole injection layer may cause a binding energy of the occupied energy level to be approximately equal to a Fermi level of the second electrode.

In the organic EL display panel according to the above aspect of the present invention, at the interface between the hole injection layer and the second electrode, a gap between the occupied energy level and the Fermi level of the second electrode may be at most 0.3 electron volts in terms of binding energy.

In the organic EL display panel according to the above aspect of the present invention, at an interface between the hole injection layer and the electron injection layer, an occupied energy level of the hole injection layer may cause a binding energy of the occupied energy level to be approximately equal to a Fermi level of the electron injection layer.

In the organic EL display panel according to the above aspect of the present invention, at the interface between the hole injection layer and the electron injection layer, a gap between the occupied energy level and the Fermi level of the electron injection layer may be at most 0.3 electron volts in terms of binding energy.

In the organic EL display panel according to the above aspect of the present invention, the metal oxide may be tungsten oxide, and the metal atoms at the maximum valence may be tungsten atoms with a valence of six. In the organic EL display panel according to the above aspect of the present invention, the metal atoms at the valence less than the maximum valence may be tungsten atoms with a valence of five. Furthermore, the ratio $W^{5+}/W^{6+}$ of the number of the tungsten atoms with a valence of five to the number of the tungsten atoms with a valence of six may be at least 3.2%. This structure achieves even better hole conduction efficiency.

As described above, in a top emission type organic EL element, a transparent electrode material such as ITO or IZO needs to be used for the common electrode (second electrode), but these materials have a higher resistivity than metallic materials. As a result, extensive use of the common electrode in the wiring portion leads to differences in the length of the common electrode between light-emitting pixels, the differences becoming greater as the display panel increases in area. A large voltage drop thus occurs between the center of the display panel and the edge of the power supply unit, causing a corresponding difference in luminance that makes the center appear dark. In other words, this may lead to the problem of fluctuations in voltage, depending on the position of the organic EL element within the display panel, and the problem of degradation in display quality. Therefore, as described above, the wiring part also adopts low-voltage auxiliary wiring in order to minimize usage of the common electrode.

The tungsten oxide provided with predetermined properties as per an aspect of the present invention also forms Schottky ohmic contact with these transparent electrode materials. Therefore, providing the tungsten oxide between the auxiliary wiring and the transparent electrode material does not lead to an increase in the resistance of the wiring portion. Specifically, carriers can be exchanged with almost no barrier between the auxiliary wiring and the hole injection layer, as well as between the hole injection layer and the common electrode composed of ITO, IZO, or the like. As a result, the organic EL display panel according to an aspect of the present invention can be expected to allow for driving at a low voltage while exhibiting excellent light-emitting efficiency.

Between the light-emitting layer in the organic EL element and the common electrode, a metal layer of barium or the like is sometimes provided as an electron injection layer. In a bottom emission type organic EL element, a highly reflective metallic material, such as Ag or Al, is used as the common electrode.

The tungsten oxide provided with predetermined properties as per an aspect of the present invention also forms Schottky ohmic contact with these metals and therefore does not lead to an increase in the resistance of the wiring portion even when formed on the auxiliary wiring. Specifically, carriers can be exchanged with almost no barrier between the auxiliary wiring and the hole injection layer, as well as between the hole injection layer and the common electrode or metal layer composed of Ba, Al, Ag, or the like. As a result, the organic EL display panel according to an aspect of the present invention can be expected to allow for driving at a low voltage while exhibiting excellent light-emitting efficiency.

In the organic EL display panel according to the above aspect of the present invention, the ratio $W^{5+}/W^{6+}$ may be at least 3.2% and at most 7.4%. This structure achieves even better hole conduction efficiency.

In the organic EL display panel according to the above aspect of the present invention, a hard X-ray photoelectron spectroscopy spectrum of the hole injection layer formed from tungsten oxide may include a first component and a second component, the first component corresponding to a $4f_{7/2}$ energy level of the tungsten atoms with a valence of six, and the second component being in a region lower than the first component in terms of binding energy.

In the organic EL display panel according to the above aspect of the present invention, the second component may be in a region between 0.3 electron volts and 1.8 electron volts lower, in terms of binding energy, than a peak top of the first component.

In the organic EL display panel according to the above aspect of the present invention, an area intensity of the second component may be between 3.2% and 7.4% of an area intensity of the first component.

In the organic EL display panel according to the above aspect of the present invention, tungsten atoms at a valence less than the maximum valence may cause an electronic state of the hole injection layer formed from tungsten oxide to have an occupied energy level in a range between 1.8 electron volts and 3.6 electron volts lower than a lowest energy level of a valence band in terms of binding energy.

In the organic EL display panel according to the above aspect of the present invention, the hole injection layer formed from tungsten oxide may include a plurality of crystals of the tungsten oxide, each of the crystals having a particle diameter of between 5 nm and 10 nm.

In the organic EL display panel according to the above aspect of the present invention, regular linear structures at intervals of between 1.85 angstroms and 5.55 angstroms may appear in a lattice image by transmission electron microscopy observation of the hole injection layer formed from tungsten oxide.

In the organic EL display panel according to the above aspect of the present invention, in a 2D Fourier transform image of the lattice image, a bright region formed by concentric circles centering on a center point of the 2D Fourier transform images may appear.

In the organic EL display panel according to the above aspect of the present invention, in a plot of distance from the center point versus normalized luminance, the normalized luminance being a normalized value of the luminance of the 2D Fourier transform image at the corresponding distance, at least one peak of the normalized luminance may appear other than the center point.

In the organic EL display panel according to the above aspect of the present invention, with a peak width being a difference between the distance corresponding to a position of a peak top of the normalized luminance appearing closest to the center point in the plot and the distance corresponding to a position at which a peak of the normalized luminance begins to rise, the peak width may be less than 22 when the distance corresponding to the peak top is 100.

An organic EL display panel according to another aspect of the present invention comprises a substrate; a first electrode on or in the substrate; wiring on or in the substrate at a distance from the first electrode; an organic layer, including organic material, above the first electrode; a metal oxide film, including a metal oxide, between the organic layer and the first electrode; and a second electrode above the organic layer, wherein the metal oxide film and the second electrode are both formed to be continuous above the first electrode and above the wiring, the second electrode and the wiring are electrically connected by the metal oxide film, metal atoms constituting the metal oxide include both metal atoms at a maximum valence thereof and metal atoms at a valence less than the maximum valence, and the metal oxide film includes a crystal of the metal oxide, a particle diameter of the crystal being on an order of nanometers.

A method of manufacturing an organic EL display panel according to another aspect of the present invention comprises the steps of forming a first electrode on or in a substrate; forming auxiliary wiring on or in the substrate at a distance from the first electrode; forming a hole injection layer to be continuous above the first electrode and above the auxiliary wiring; forming a functional layer above the first electrode including at least a light-emitting layer; and forming a second electrode to be continuous above the functional layer and above the hole injection layer formed above the auxiliary wiring, wherein the second electrode and the auxiliary wiring are electrically connected by the hole injection layer, the hole injection layer is formed to include a metal oxide film, and the metal oxide film is formed so that metal atoms constituting the metal oxide include both metal atoms at a maximum valence thereof and metal atoms at a valence less than the maximum valence, and so as to include a crystal of the metal oxide, a particle diameter of the crystal being on an order of nanometers.

The method of manufacturing an organic EL display panel according to the above aspect of the present invention may further comprise, between formation of the hole injection layer and formation of the functional layer, the step of forming a bank on the hole injection layer defining an aperture exposing the first electrode and including a region exposing the auxiliary wiring, wherein the functional layer is formed within the aperture defined by the bank.

In the method of manufacturing an organic EL display panel according to the above aspect of the present invention, the hole injection layer formed above the auxiliary wiring may have properties identical to the hole injection layer formed above the first electrode.

In the method of manufacturing an organic EL display panel according to the above aspect of the present invention, the metal oxide film may be a tungsten oxide film, and the tungsten oxide film may be formed with a sputtering gas including argon gas and oxygen gas, using tungsten as a sputtering target, under film forming conditions such that a total pressure of the sputtering gas is at least 2.3 Pa and at most 7.0 Pa, a partial pressure of the oxygen gas in the sputtering gas is at least 50% and at most 70%, an input power density per unit area of the sputtering target is at least 1.5 W/cm$^2$ and at most 6.0 W/cm$^2$, and a value yielded by dividing the total pressure of the sputtering gas by the input power density is larger than 0.7 Pa·cm$^2$/W.

In the method of manufacturing an organic EL display panel according to the above aspect of the present invention, when forming the hole injection layer, the value yielded by dividing the total pressure of the sputtering gas by the input power density may be smaller than 3.2 Pa·cm$^2$/W.

A method of manufacturing an organic EL display panel according to another aspect of the present invention comprises the steps of forming a first electrode on or in a substrate; forming wiring on or in the substrate at a distance from the first electrode; forming a metal oxide film, including a metal oxide, to be continuous above the first electrode and above the wiring; forming an organic layer, including organic material, above the first electrode; and forming a second electrode to be continuous above the organic layer and above the metal oxide film formed above the wiring, wherein the second electrode and the wiring are electrically connected by the metal oxide film, and the metal oxide film is formed so that metal atoms constituting the metal oxide include both metal atoms at a maximum valence thereof and metal atoms at a valence less than the maximum valence, and so as to include a crystal of the metal oxide, a particle diameter of the crystal being on an order of nanometers.

An organic EL display apparatus according to an aspect of the present invention is provided with any of the above organic EL display panels.

Note that when a numerical range is indicated in the present disclosure, both the upper and lower limits are included in the numerical range. For example, a range between 0.3 eV and 1.8 eV includes both 0.3 eV and 1.8 eV.

Discovery Leading to the Present Invention

First, the inventors observed the following through an experiment described below: if an occupied energy level near the Fermi surface, formed by a structure similar to an oxygen vacancy, exists along the surface of a hole injection layer formed from a metal oxide such as molybdenum oxide or tungsten oxide, then at the interface between the hole injection layer and the functional layer, the difference between the lowest binding energy of the occupied energy level near the Fermi surface and the binding energy of the highest occupied molecular orbital in the functional layer becomes small, which is effective for reducing the driving voltage of the element.

Focusing on this observation, the inventors discovered that if the occupied energy level near the Fermi surface exists in the hole injection layer, then the difference between the lowest binding energy of the occupied energy level near the Fermi surface and the Fermi level of the electrode is also small at the interface with the electrodes such as the anode, the cathode, and the auxiliary wiring. This suggested the possibility of favorable carrier exchange.

The inventors then discovered that a hole injection layer made from metal oxide that has an occupied energy level near the Fermi surface can achieve Schottky ohmic contact with electrodes that are relatively low-resistance and are made from a metal material such as Al, or electrodes made from a transparent electrode material with a relatively high resistance, such as ITO or IZO. For this reason, even if formed on the auxiliary wiring, the hole injection layer does not increase the resistance of the wiring portion.

Second, it is well known that a structure similar to an oxygen vacancy easily forms on surfaces or grain boundaries where the crystal periodicity of a metal oxide or the like is interrupted. The inventors discovered that the hole injection layer can be provided with conduction regions by reducing the size of the metal oxide crystals forming the hole injection layer and forming the above occupied energy levels to be continuous near the Fermi surface along the grain boundaries and surfaces in the hole injection layer. Through an experiment described below, the inventors confirmed that improving the hole conduction characteristics of the hole injection layer allows for a reduction in the driving voltage of the organic EL element. Furthermore, the inventors examined the conditions for forming a hole injection layer with good hole conduction characteristics. Focusing on how not only holes but also electrons can intrinsically be conducted at the hole conduction regions, the inventors discovered that even if the hole injection layer is provided in the wiring portion, electrons are still easily conducted throughout the hole injection layer, thus maintaining the wiring portion at a low resistance.

Third, the inventors also examined the material for forming a hole injection layer that does not easily degrade or suffer from a change in properties during the bank forming process.

As described above, a metal oxide, which is an inorganic material, is a good material for forming a hole injection layer with improved driving voltage and longevity of the organic EL element. However, actual manufacturing of an organic EL element using molybdenum oxide for the hole injection layer suggested that the hole injection layer might degrade or suffer from a change in properties due to the alkaline solution, water, organic solvent, or the like use during the bank forming process. Degradation or a change in properties of the hole injection layer would impair the expected ability of the hole injection layer to inject holes above the pixel electrode in the light-emitting cell and would increase the resistance of the wiring portion above the auxiliary wiring, thus preventing normal driving of the organic EL element. Moreover, such a hole injection layer would not be able to withstand the mass production process of organic EL elements and organic EL panels incorporating such organic EL elements. Therefore, it cannot always be considered desirable to form the hole injection layer from molybdenum oxide, which may cause degradation or a change in properties.

Therefore, focusing on tungsten oxide which has a lower probability of causing degradation or a change in properties, the inventors discovered that tungsten oxide provided with certain physical properties has low solubility and does not easily degrade in the above solution and the like. Furthermore, such tungsten oxide has a strong capability to inject and conduct holes.

Embodiment 1

The following is a description of an organic EL display panel and an organic EL display apparatus according to an aspect of the present invention, followed by the results of experiments to confirm performance and an analysis thereof. Note that components in the accompanying figures are not depicted to scale.

Structure of Organic EL Display Panel

Figure 1B:
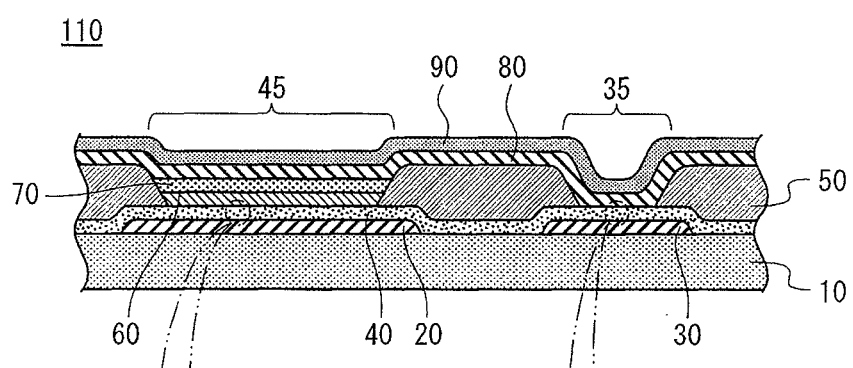

FIGS. 1A through 1D illustrate an organic EL display panel according to an aspect of the present invention. FIG. 1A is a partial plan view illustrating the main portions of the organic EL display panel. FIG. 1B is a cross-sectional diagram, along the line from A to A' in FIG. 1A, illustrating the main portions of the organic EL display panel.

As shown in FIG. 1A, an organic EL display panel 110 according to the present embodiment is provided with a matrix of a plurality of light-emitting pixels 95A each having a light-emitting cell 95. A plurality of anodes (pixel electrodes, first electrodes) 20 are provided, one for each pixel, and an auxiliary wiring (also corresponding to the wiring) 30 is provided along the light-emitting cells 95 for each row of light-emitting pixels.

As illustrated in FIG. 1B, the organic EL display panel 110 includes the following: a substrate 10, anodes 20 and auxiliary wirings 30 formed on the substrate 10, a hole injection layer 40 (also corresponding to the tungsten oxide layer) formed above the anodes 20 and the auxiliary wiring 30, pixel apertures 45 formed on the hole injection layer 40 above the anodes 20, banks 50 having connection apertures 35 above the auxiliary wiring 30, buffer layers 60 formed within the pixel apertures 45 of the banks 50, light-emitting layers 70 (also corresponding to the organic layers) formed on the buffer layers 60 within the pixel apertures 45 of the banks 50, an electron injection layer (also corresponding to the metal layer) 80 formed on the upper surface of the above components, a cathode 90 (common electrode, a second electrode) formed on the electron injection layer 80, and the like.

A hole injection layer with properties identical to the hole injection layer 40 formed above the anode 20 is also formed above the auxiliary wiring 30. In other words, the hole injection layer 40 is formed across the entire surface shown in the partial plan view of FIG. 1A. The electron injection layer 80 and the cathode 90 are also formed across the entire surface shown in the partial plan view of FIG. 1A.

The auxiliary wiring 30 and the cathode 90 are electrically connected via the hole injection layer 40 and the electron injection layer 80 within the connection apertures 35 provided along the auxiliary wiring 30, thus constituting the wiring portion that connects the cathode 90 to the power source. The layer structure between the cathode 90 and the auxiliary wiring 30 in the connection apertures 35 is not limited to the above structure. For example, a layer other than the hole injection layer 40 and the electron injection layer 80 may be included, or alternatively the electron injection layer 80 may be excluded. Any layer structure that does not prevent electrons from flowing from the auxiliary wiring 30 to the cathode 90 is acceptable. Organic EL display panels including such a multilayered structure are included in the scope of the present invention and achieve the same advantageous effects as the organic EL display panel 110 according to the present embodiment.

Each light-emitting cell 95 is composed of the hole injection layer 40, the buffer layer 60, the light-emitting layer 70, and the electron injection layer 80 provided within the pixel apertures 45. Through the cathode 90, the light-emitting cell 95 emits light produced by recombination of holes and electrons injected into the light-emitting layer 70. Note that the anodes 20 are provided separately for each pixel in correspondence with the light-emitting cells 95. In other words, when the light-emitting cell is composed of subpixels, such as R, G, B subpixels, the light-emitting cell 95 and the anode 20 are provided separately in correspondence with each subpixel.

Substrate

The substrate 10 is the base material for the organic EL element and may be foamed with an insulating material such as alkali-free glass, soda glass, nonfluorescent glass, phosphate glass, borate glass, quartz, acrylic resin, styrenic resin, polycarbonate resin, epoxy resin, polyethylene, polyester, silicone resin, and alumina.

While not shown in the figures, TFTs (thin film transistors) are provided on the surface of the substrate 10 for driving the organic EL elements.

Anode

The anode 20 is formed by, for example, layering a 20 nm-thick transparent conductive film of ITO on a 400 nm-thick metal film of Al. Note that the structure of the anode 20 is not limited in this way and may instead be formed from a single layer, such as a transparent conducting film of ITO, IZO, or the like; a metal film of Al, Ag, or the like; or an alloy film of APC (alloy of silver, palladium, and copper), ARA (alloy of silver, rubidium, and gold), MoCr (alloy of molybdenum and chromium), NiCr (alloy of nickel and chromium), or the like. Furthermore, a structure may be adopted having a plurality of layers selected from the above transparent conducting films, metal films, and metal alloy films.

Auxiliary Wiring

The auxiliary wiring 30 is formed by, for example, layering a 20 nm-thick transparent conductive film of ITO on a 400 nm-thick metal film of Al. Note that the structure of the auxiliary wiring 30 is not limited in this way and may instead be formed from a single layer, such as a transparent conducting film of ITO, IZO, or the like; a metal film of Al, Ag, or the like; or an alloy film of APC (alloy of silver, palladium, and copper), ARA (alloy of silver, rubidium, and gold), MoCr (alloy of molybdenum and chromium), NiCr (alloy of nickel and chromium), or the like. Furthermore, a structure may be adopted having a plurality of layers selected from the above transparent conducting films, metal films, and metal alloy films.

Hole Injection Layer

The hole injection layer 40 is, for example, formed as a layer of tungsten oxide that is at least 2 nm thick (in the present example, 30 nm). In the composition formula (WOx) denoting the composition of tungsten oxide, x is a real number existing within a range of approximately $2<x<3$. A thickness under 2 nm is not desirable, as such a thickness makes it difficult to form the hole injection layer 40 uniformly and to form Schottky ohmic contact between the anode 20 and the hole injection layer 40 of the light-emitting cell. The above Schottky ohmic contact can be stably formed when the thickness of the tungsten oxide layer is at least 2 nm. Therefore, by forming the hole injection layer 40 to at least this thickness, a stable efficiency of hole injection from the anode 20 to the hole injection layer 40 of the light-emitting cell can be expected.

Furthermore, it is even more desirable for the thickness of the tungsten oxide layer to be at least 4 nm, since the Schottky ohmic contact stably forms between the auxiliary wiring 30 and the hole injection layer 40 as well as between the hole injection layer 40 and the electron injection layer 80 in the wiring portion. At this thickness, stable carrier exchange can therefore be expected.

While it is desirable for the hole injection layer 40 to be formed only from tungsten oxide, the inclusion of a trace level of impurities is acceptable, provided that the amount does not exceed the amount of impurities that might normally be incorporated.

By being formed under predetermined conditions, the hole injection layer 40 has an electron level with a structure similar to an oxygen vacancy of a metal oxide. The existence of this electron level allows for good hole injection from the anode 20 to the hole injection layer 40 and from the hole injection layer 40 to the buffer layer 60 in the light-emitting cell, as well as good carrier exchange between the auxiliary wiring 30 and the hole injection layer 40, and between the hole injection layer 40 and the electron injection layer 80, in the wiring portion. Details on these predetermined film forming conditions are described below.

Figure 1C:
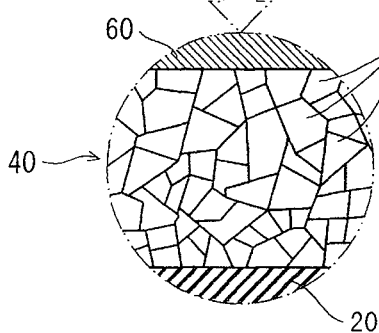
Figure 1D:
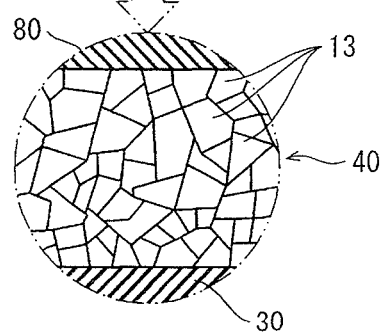

FIG. 1C is a partially expanded view near the hole injection layer 40 above the anode 20, and FIG. 1D is a partially expanded view near the hole injection layer 40 above the auxiliary wiring 30. Since the tungsten oxide layer constituting the hole injection layer 40 is formed under the predetermined conditions, the hole injection layer 40 includes tungsten oxide crystals 13 as illustrated in FIGS. 1C and 1D. The particle diameter of each crystal 13 is on the order of nanometers. As an example, if the thickness of the hole injection layer 40 is approximately 30 nm, the particle diameter of the crystals 13 is approximately between 5 and 10 nm. Hereinafter, the crystals 13 whose particle diameter is on the order of nanometers are referred to as "nanocrystals 13", and a layered structure composed of nanocrystals 13 is referred to as a "nanocrystal structure". Note that apart from the nanocrystal structure, the hole injection layer 40 may include an amorphous structure.

In a hole injection layer 40 with the above nanocrystal structure, the tungsten atoms constituting the tungsten oxide are distributed to include both atoms at the maximum valence and atoms at a valence less than the maximum valence. Typically, the tungsten oxide layer includes a structure similar to an oxygen vacancy. In tungsten oxide with a crystal structure that does not have a structure similar to an oxygen vacancy, the maximum valence of the tungsten is a valence of six. On the other hand, in tungsten oxide with a crystal structure that has a structure similar to an oxygen vacancy, the valence of the tungsten is less than the maximum. Furthermore, the structure similar to an oxygen vacancy is typically abundant along the crystal surface.

Accordingly, in the organic EL display panel 110, in addition to moderating the hole injection barrier between the anode 20 and the hole injection layer 40 in the light-emitting cell, it is desirable to further improve the efficiency of hole conduction by distributing tungsten atoms with a valence of five throughout the hole injection layer 40 to create structures similar to an oxygen vacancy. In other words, by providing the hole injection layer 40 formed from tungsten oxide with the nanocrystal structure, the holes injected from the anode 20 to the hole injection layer 40 are conducted by the structures similar to an oxygen vacancy existing along the crystal interface of the nanocrystals 13, thereby increasing the paths for conduction of holes and improving the hole conduction efficiency. This efficiently reduces the driving voltage of the organic EL display panel 110. Furthermore, since electrons are also conducted in the wiring portion by the structures similar to an oxygen vacancy existing along the crystal interface of the nanocrystals 13, the hole injection layer 40 on the auxiliary wiring 30 does not block conduction of electrons in the wiring portion.

Additionally, the tungsten oxide forming the hole injection layer 40 has high chemical resistance, i.e. the tungsten oxide does not easily undergo undesired chemical reactions. Therefore, even if the hole injection layer 40 comes into contact with solvents or the like used during processes performed after formation of the hole injection layer 40, damage to the hole injection layer 40 due to degradation or a change of properties is reduced. Forming the hole injection layer 40 from a material with high chemical resistance thus prevents a reduction in the efficiency of conduction of electrons and holes from the hole injection layer 40.

The hole injection layer 40 formed from tungsten oxide in the present embodiment includes both the case of formation only with a nanocrystal structure and the formation with both a nanocrystal structure and an amorphous structure. Furthermore, it is desirable that the nanocrystal structure be present throughout the hole injection layer 40. Holes can be efficiently conducted from below the hole injection layer 40 to above the hole injection layer 40, however, as long as grain boundaries are connected in at least one location in the light-emitting cell from the interface where the anode 20 contacts with the hole injection layer 40 to the interface where the hole injection layer 40 contacts with the buffer layer 60. Likewise, electrons can be efficiently conducted from below the hole injection layer 40 to above the hole injection layer 40 as long as grain boundaries are connected in at least one location in the wiring portion from the interface where the auxiliary wiring 30 contacts with the hole injection layer 40 to the interface where the hole injection layer 40 contacts with the electron injection layer 80.

Note that examples have been reported on in the past of using a layer that includes tungsten oxide crystals as the hole injection layer. For example, Non-Patent Literature 1 suggests that crystallizing a tungsten oxide layer by annealing at 450° C. improves the hole conduction efficiency. However, Non-Patent Literature 1 does not disclose the conditions for forming a tungsten oxide layer with a large area, nor the effects that tungsten oxide formed on the substrate as a hole injection layer has on other layers in the substrate. Non-Patent Literature 1 therefore does not demonstrate the potential for practical mass-production of a large organic EL display panel. Furthermore, Non-Patent Literature 1 does not disclose purposely forming tungsten oxide nanocrystals having a structure similar to an oxygen vacancy in the hole injection layer. The hole injection layer according to an aspect of the present invention is formed from a tungsten oxide layer that is resistant to chemical reactions, is stable, and can withstand the mass production process of large organic EL panels. Furthermore, purposely incorporating structures similar to an oxygen vacancy in the tungsten oxide layer achieves excellent hole conduction efficiency, another decisive difference from conventional technology.

In greater detail, the above reference to having an "electron level with a structure similar to an oxygen vacancy of a metal oxide" means that the hole injection layer 40 has, in an electronic state thereof, an occupied energy level between 1.8 eV and 3.6 eV lower than the upper end of the valence band of the hole injection layer, i.e. the lowest energy level of the valence band, in terms of binding energy. This occupied energy level corresponds to the highest occupied energy level of the hole injection layer 40 and is closest to the Fermi level (Fermi surface) of the hole injection layer 40 in terms of binding energy. As such, the occupied energy level is hereinafter referred to as "the occupied energy level near the Fermi surface".

The existence of the occupied energy level near the Fermi surface results in a so-called interface energy level alignment being formed at an interface between the hole injection layer 40 and the functional layer (in this example, the buffer layer 60). By formation of the interface energy level alignment, the binding energy of the highest occupied molecular orbital of the buffer layer 60 is approximately equal to the binding energy of the occupied energy level near the Fermi surface of the hole injection layer 40.

Note that the expressions "approximately equal to" and "interface energy level alignment being formed" as referred to herein indicate that at the interface between the hole injection layer 40 and the buffer layer 60, the difference between the lowest binding energy at the occupied energy level near the Fermi surface and the lowest binding energy at the highest occupied molecular orbital is ±0.3 eV.

Furthermore, the expression "interface" as referred to here denotes an area that includes a surface of the hole injection layer 40 and a portion of the buffer layer 60 within a distance of 0.3 nm from the surface of the hole injection layer 40.

Additionally, a characteristic of the hole injection layer 40 is the formation of a so-called Schottky ohmic contact at the interface with the anode 20, the auxiliary wiring 30, and the electron injection layer 80.

The expression "Schottky ohmic contact" as referred to here denotes that the Fermi level of the anode 20, the auxiliary wiring 30, and the electron injection layer 80 differs from the above-described lowest binding energy of the occupied energy level near the Fermi surface of the hole injection layer 40 by a small amount, specifically ±0.3 eV, at a position that is 2 nm away from the surface of the anode 20, auxiliary wiring 30, or the electron injection layer 80 towards the hole injection layer 40. Furthermore, the expression "interface" as referred to here denotes a region that includes a surface of the anode 20, the auxiliary wiring 30, or the electron injection layer 80 and the Schottky barrier formed on the side of the surface facing the hole injection layer 40.

This occupied energy level near the Fermi surface exists not only at the above interface, but also throughout the hole injection layer 40 at the grain boundaries of the nanocrystals. The occupied energy level near the Fermi surface thus forms a conduction path for holes in the light-emitting cell, yielding excellent hole conduction efficiency, and forms a conduction path for electrons in the wiring portion, thereby maintaining a low resistance. As a result, the organic EL element of the present embodiment can be driven at a lower voltage.

Note that not all tungsten oxide has such an occupied energy level near the Fermi surface; rather, within the hole injection layer and at the interface with the buffer layer 60, this particular energy level only forms under the predetermined film forming conditions described below.

Banks

The banks 50 are, for example, composed of an organic material with insulating properties (such as acrylic resin, polyimide resin, novolac-type phenolic resin, and the like). The banks 50 are formed in a pixel bank structure, with pixel apertures 45 in one-to-one correspondence with a plurality of anodes 20, or in a line bank structure, with one pixel aperture 45 corresponding to a plurality of anodes 20 arranged in a line. Note that the banks 50 are not essential to the present invention and are unnecessary in cases such as when an organic EL display panel is constituted by one organic EL element.

Buffer Layer

The buffer layer 60 is, for example, a 20 nm-thick layer of TFB (poly(9,9-di-n-octylfluorene-alt-(1,4-phenylene-((4-sec-butylphenyl)imino)-1, 4-phenylene)), which is an amine-containing organic polymer.

Light-Emitting Layer

The light-emitting layer 70 is, for example, a 70 nm-thick layer of F8BT (poly(9,9-di-n-octylfluorene-alt-benzothiadiazole)), which is an organic polymer. However, the material to be used in forming the light-emitting layer 70 is not limited to this, and the light-emitting layer 70 may include a commonly-known organic material. For example, the light-emitting layer 70 may be formed from a fluorescent material such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, anthracene compound, cyanine compound, acridine compound, metal complex of a 8-hydroxyquinoline compound, metal complex of a 2-bipyridine compound, complex of a Schiff base and a group three metal, metal complex of oxine, rare earth metal complex, etc., as recited in Japanese Patent Application Publication No. H5-163488.

Functional Layer

The functional layer of the present invention is either one, a combination of two or more, or every one of layers such as the following: a hole transport layer, a light-emitting layer, and a buffer layer. The hole transport layer transports holes. The light-emitting layer emits light as a result of recombination of holes and electrons which are injected therein. The buffer layer is used for the adjustment of optical characteristics or for blocking electrons. Although the target of the present invention is the hole injection layer, an organic EL element commonly includes layers having each of the functions of the above-described hole transport layer, light-emitting layer and the like, in addition to the hole injection layer. As such, the expression "functional layer" refers to all layers other than the hole injection layer that are necessary in the organic EL element.

Electron Injection Layer

The electron injection layer 80 is, for example, a 5 nm-thick barium layer and has the function of injecting electrons from the cathode 90 to the light-emitting layer 70. The electron injection layer 80 is formed to be continuous above the anodes 20 and above the auxiliary wiring 30. Above the anodes 20, the electron injection layer 80 is located between the cathode 90 and the light-emitting layer 70, whereas above the auxiliary wiring 30, the electron injection layer 80 is located between the cathode 90 and the hole injection layer 40. When light is emitted through the top (i.e. top emission), as in the present embodiment, the electron injection layer 80 must be light-transmissive. Forming the electron injection layer as a 5 nm-thick barium layer makes the electron injection layer light-transmissive. Note that when light is emitted through the bottom (i.e. bottom emission), depending on the element structure, the electron injection layer need not always be light-transmissive.

Cathode

The cathode 90 is formed by, for example, layering a 35 nm-thick transparent conductive film of ITO. Note that the structure of the cathode 90 is not limited in this way and may instead be formed from a thin layer of a transparent conducting film of IZO, or the like; a metal such as Al, Ag, or the like; or an alloy of APC (alloy of silver, palladium, and copper), ARA (alloy of silver, rubidium, and gold), MoCr (alloy of molybdenum and chromium), NiCr (alloy of nickel and chromium), or the like. Furthermore, a structure may be adopted having a plurality of layers selected from the above transparent conducting films, metal films, and metal alloy films.

A direct current power supply is connected to the anodes 20 and to the auxiliary wirings 30 to supply power from an external source to the organic EL display panel 110.

Structure of Organic EL Display Apparatus

Figure 2:
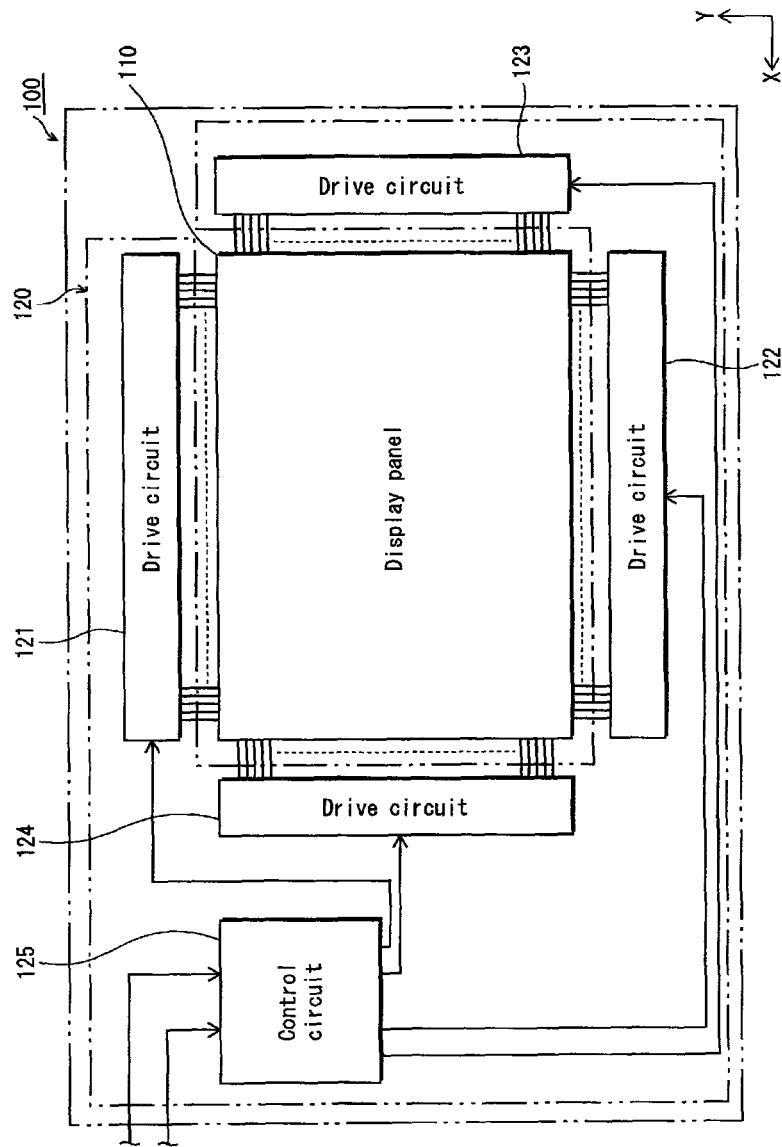
FIG. 2 is a diagram illustrating the overall configuration of an organic EL display apparatus according to an aspect of the present invention.

Based on FIG. 2, an organic EL display apparatus according to an aspect of the present invention is now described. FIG. 2 is a diagram illustrating the overall configuration of an organic EL display apparatus according to an aspect of the present invention.

As illustrated in FIG. 2, an organic EL display apparatus 100 is provided with the organic EL display panel 110 according to an aspect of the present invention as well as a drive control unit 120 connected thereto. The organic EL display apparatus 100 is used in monitors, televisions, cellular telephones, and the like. The drive control unit 120 is composed of four drive circuits 121-124 and a control circuit 125. Note that in an actual organic EL display apparatus 100, the layout and the connection of the drive control unit 120 with respect to the organic EL display panel 110 are not limited to the depiction in FIG. 2.

Method of Manufacturing Organic EL Display Panel

With reference to the drawings, the following provides details on a method of manufacturing an organic EL display panel according to the present embodiment.

FIGS. 3A-3D and 4A-4E are cross-section diagrams illustrating the method of manufacturing an organic EL display panel according to an aspect of the present invention.

Figure 3A:
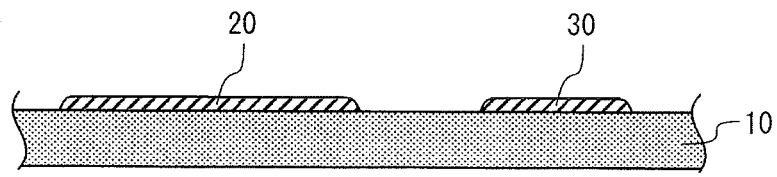
FIGS. 3A through 3E are cross-section diagrams illustrating the method of manufacturing an organic EL display panel according to an aspect of the present invention.

First, as illustrated in FIG. 3A, a substrate 10 is prepared. The substrate 10 is provided with a drive circuit (not shown in the drawings) composed of, for example, TFTs (Thin Film Transistors), capacitors, and the like. Using, for example, vacuum deposition or sputtering, a metal film of Al and a transparent conducting film such as ITO are formed in this order across the entire substrate 10. Subsequently, using photolithography, the metal film and the transparent conducting layer are etched to form anodes 20 at predetermined positions as well as auxiliary wiring 30 at predetermined positions electrically insulated from the anodes 20.

At this point, the anodes 20 are formed individually in correspondence with the light-emitting units, whereas the auxiliary wiring 30 is provided in a one-dimensional arrangement along the rows or columns, for example, of light-emitting pixels provided in the two-dimensional matrix. Note that a planarizing layer, for example, may be provided on the substrate 10 as necessary to eliminate unevenness due to the drive circuit or other factors, with the anodes 20 and auxiliary wiring 30 being formed on top of the planarizing layer.

Figure 3B:
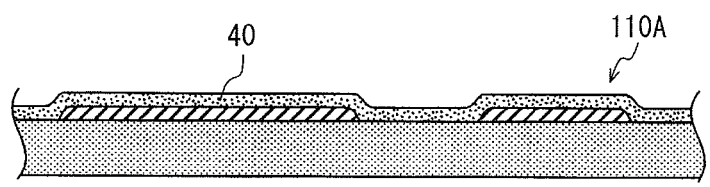

Next, as illustrated in FIG. 3B, the hole injection layer 40 is formed on the anodes 20 in the auxiliary wiring 30 by the reactive sputtering method. Specifically, the target of reactive sputtering method is metal tungsten. Argon gas and oxygen gas are respectively introduced into the chamber as the sputtering gas and the reactive gas. Under these conditions, the argon is ionized by the application of high voltage and caused to bombard the sputtering target. The metal tungsten ejected as a result of the sputtering phenomenon reacts with the oxygen gas to produce tungsten oxide. The hole injection layer 40 thus forms as a continuous film along the anodes 20 and the auxiliary wiring 30 on the substrate 10, yielding an intermediate product 110A.

Note that as described below, it is desirable that the film forming conditions be set as follows: the total pressure of the sputtering gas composed of argon gas and oxygen gas should be at least 2.3 Pa and at most 7.0 Pa. The partial pressure of the oxygen gas with respect to the total pressure of the sputtering gas should be at least 50% and at most 70%. The input power (input power density) per unit area of the target should be at least 1.5 W/cm$^2$ and at most 6.0 W/cm$^2$. Finally, the value yielded by dividing the total pressure of the sputtering gas by the input power density should be larger than 0.7 Pa·cm$^2$/W. The hole injection layer 40, composed of tungsten oxide, resulting from film formation under these conditions has a nanocrystal structure and has an electron level with a structure similar to an oxygen vacancy at the surface thereof and along the crystal interface.

Next, the intermediate product 110A is removed from the chamber.

Figure 3C:
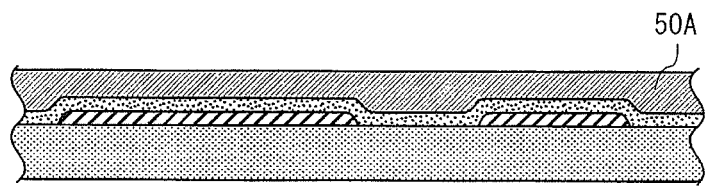

As illustrated in FIG. 3C, a negative photoresist 50A is then applied to the entire surface.

Figure 3D:
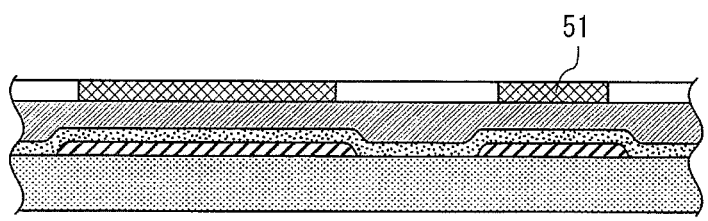

Subsequently, as illustrated in FIG. 3D, a photomask 51 having light-blocking portions at positions corresponding to the light-emitting cells and connecting portions is layered on the negative photoresist 50A. The photoresist 50A is exposed through the photomask 51 using photolithography.

Figure 3E:
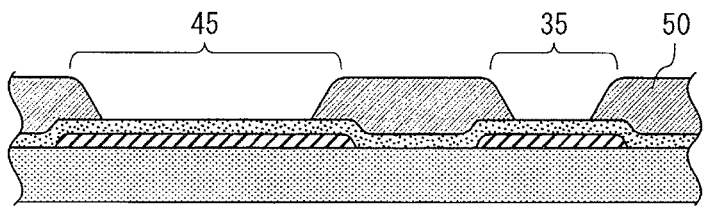

Next, as illustrated in FIG. 3E, the intermediate product 110A is developed to form the pixel apertures 45 and connection apertures 35 between the banks 50.

Figure 4A:
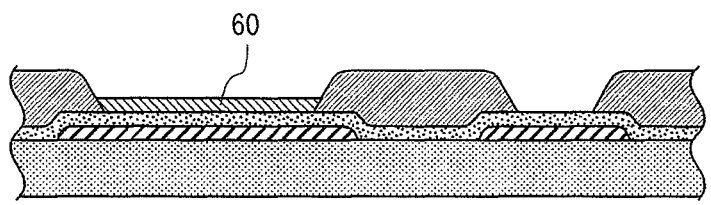
FIGS. 4A through 4D are cross-section diagrams illustrating the method of manufacturing an organic EL display panel according to an aspect of the present invention.

Next, as illustrated in FIG. 4A, the buffer layer 60 is formed by ejecting drops of ink composition containing organic amine-containing molecular material into the pixel apertures 45 by a wet process, such as spin coating or an inkjet method, and removing the solvent by volatilization.

Figure 4B:
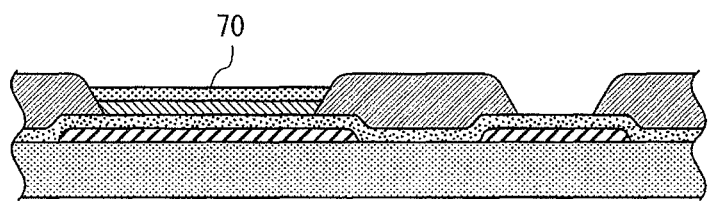

Subsequently, as illustrated in FIG. 4B, the light-emitting layer 70 is formed by ejecting drops of ink composition containing organic light-emitting material onto the surface of the buffer layer 60 by the same method and removing the solvent by volatilization.

Here, it should be noted that the method for forming the buffer layer 60 and the light-emitting layer 70 is not limited to the above method. Other than spin coating and the inkjet method, ink may be ejected/applied by another commonly-known method such as the gravure printing method, the dispenser method, the nozzle coating method, the intaglio printing method, or the relief printing method.

Figure 4C:
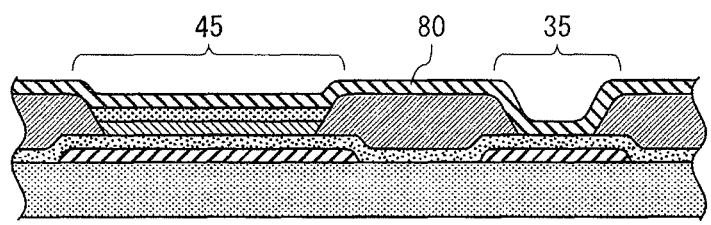

Subsequently, as illustrated in FIG. 4C, the electron injection layer 80 is formed to be continuous on the light-emitting layer 70 and on the hole injection layer 40 in the connection aperture 35 with, for example, the vacuum deposition method.

Figure 4D:
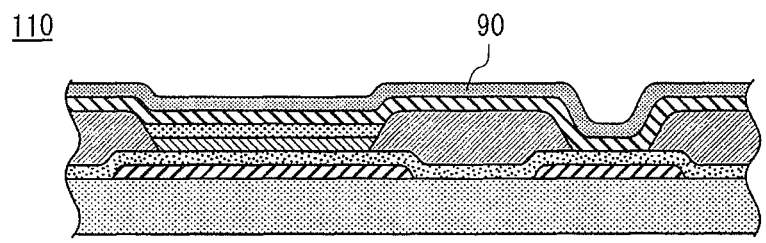

Furthermore, as illustrated in FIG. 4D, by the same method, the cathode 90 is formed on the electron injection layer 80.

Note that while not illustrated in FIGS. 1A and 1B, a sealing layer may be additionally provided on the surface of the cathode 90, or a sealing cap may be provided to isolate the entire organic EL element from external space, in order as to prevent the organic EL element from being exposed to the atmosphere after completion. The sealing layer may be formed, for example, by using materials such as SiN (silicon nitride) and SiON (silicon oxynitride), and may be disposed such that the organic EL element is sealed therein. When using a sealing cap to prevent atmospheric exposure of the organic EL element, the sealing cap may be formed by using, for instance, the same material as the substrate 10, and a getter which absorbs moisture and the like may be provided within the sealed space formed by the substrate 10 and the sealing cap.

Performance of the above steps completes the organic EL display panel 110.

Experiments and Analysis
[1] Experiments on Hole Injection Efficiency from the Hole Injection Layer to the Functional Layer and Analysis of Results The present section mainly offers an analysis of the hole injection efficiency from the hole injection layer 40 to the buffer layer 60, whereas section [2] offers an analysis of hole conduction efficiency in the hole injection layer 40.

Conditions for Forming the Tungsten Oxide Film

In the present embodiment, the tungsten oxide film constituting the hole injection layer 40 is formed under predetermined conditions, thereby providing the hole injection layer 40 with the above-described occupied energy level near the Fermi surface. This reduces the hole injection barrier between the hole injection layer 40 and the buffer layer 60 and allows for driving of the organic EL display panel 110 at a low voltage.

A method for obtaining a tungsten oxide film having the above-described characteristics employs a DC magnetron sputtering device, with metal tungsten as the sputtering target. The film is formed without controlling substrate temperature, and by introducing argon gas and oxygen gas into the chamber of the sputtering device. It is considered desirable to form the tungsten oxide film with the reactive sputtering method under the following conditions: (1) the total gas pressure of the sputter gas, composed of argon gas and oxygen gas, is at least 2.7 Pa and at most 7.0 Pa; (2) the ratio of oxygen partial pressure to the total pressure of the sputter gas is at least 50% and at most 70%; and (3) the input power per unit surface area of the target (input power density) is at least 1 W/cm$^2$ and at most 2.8 W/cm$^2$.

The effectiveness of such film forming conditions (1) through (3) has been confirmed through the following experiments.

First, hole-only devices were prepared as assessment devices to be used in accurately assessing the dependence of the efficiency of hole injection, from the hole injection layer 40 to the buffer layer 60, on the film forming conditions.

In an organic EL element, the carriers constituting electric current consist of both holes and electrons. As such, the electrical characteristics of an organic EL element reflect not only hole current, but also electron current. In a hole-only device, however, the injection of electrons from the cathode is blocked, and there is almost no flow of electron current. Therefore, the electrical current consists almost entirely of hole current, and the carriers can be considered almost entirely to be holes. A hole-only device is therefore desirable when assessing hole injection efficiency.

Figure 5:
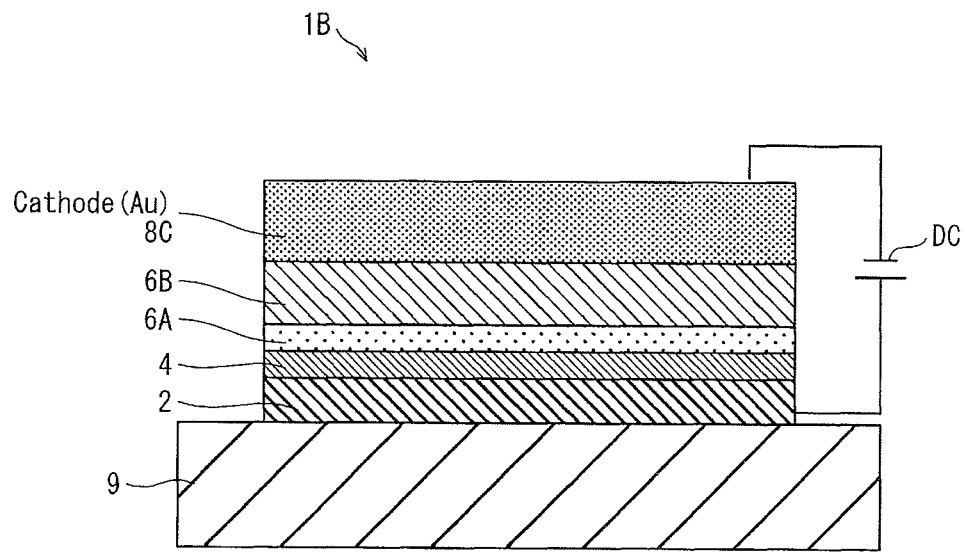
FIG. 5 is a schematic cross-section diagram illustrating a structure of a hole-only device 1B.

Specifically, a hole-only device 1B has the structure illustrated in FIG. 5 and was created as follows. An anode 2 composed of a thin ITO film was formed by sputtering on a substrate 9 to a thickness of 50 nm. A hole injection layer 4 composed of tungsten oxide was formed under the conditions listed below on the anode 2 to a thickness of 30 nm. A buffer layer 6A and a light-emitting layer 6B were then formed by spin coating. The buffer layer 6A was composed of TFB, which is an organic amine-containing polymer, and was formed on the hole injection layer 4 to a thickness of 20 nm. The light-emitting layer 6B was composed of F8BT, which is an organic polymer, and was formed to a thickness of 70 nm. A cathode 8C composed of Au (gold) was then formed by vapor deposition to a thickness of 100 nm. Note that since the hole-only devices 1B are only assessment devices for examining the efficiency of hole injection from the hole injection layer to the buffer layer in the light-emitting unit of an organic EL display panel, other components such as the banks and the wiring portion were omitted.

In the manufacturing of the hole-only devices, the hole injection layers 4 were formed by applying the reactive sputtering method with a DC magnetron sputtering device. The gas introduced into the chamber was composed of at least one of argon gas and oxygen gas, and the sputtering target used was metal tungsten. Further, no control was performed regarding substrate temperature, while control of argon partial pressure, oxygen partial pressure, and total gas pressure within the chamber was performed by adjusting the flow amount of the respective gases. Furthermore, in order as to obtain the hole-only devices, changes were made to certain film forming conditions, namely total gas pressure, oxygen partial pressure, and input power, as illustrated in Table 1. As a result, hole-only devices 1B (element Nos. 1 through 14), each having a hole injection layer 4 formed under different film forming conditions, were obtained. Note that, hereinafter, oxygen partial pressure is indicated as a ratio (%) with respect to the total pressure of the gases in the chamber of the sputtering device.

TABLE 1

Film Forming Conditions of Hole-only Devices 1B

| | Device No. | | | | | | | | | | | | | |
|---|---|---|---|---|---|---|---|---|---|---|---|---|---|---|
| | 1 | 2 | 3 | 4 | 5 | 6 | 7 | 8 | 9 | 10 | 11 | 12 | 13 | 14 |
| Oxygen Partial Pressure (%) | 70 | 50 | 100 | 50 | 70 | 100 | 70 | 50 | 100 | 50 | 70 | 30 | 30 | 50 |
| Total Pressure (Pa) | 2.7 | 4.8 | 1.7 | 1.7 | 2.7 | 1.7 | 2.7 | 4.8 | 1.7 | 2.7 | 1.7 | 1.7 | 2.7 | 4.8 |
| Input Power (W) | 500 | 500 | 500 | 500 | 250 | 250 | 1000 | 1000 | 1000 | 500 | 500 | 500 | 500 | 250 |
| T-S (mm) | 113 | 113 | 113 | 113 | 113 | 113 | 113 | 113 | 113 | 113 | 113 | 113 | 113 | 113 |
| Film Forming Rate (nm/s) | 0.164 | 0.14 | 0.111 | 0.181 | 0.057 | | 0.308 | 0.311 | 0.246 | 0.154 | 0.153 | 0.364 | 0.177 | 0.049 |
| Film Thickness (nm) | 30 | 30 | 30 | 30 | 30 | 30 | 30 | 30 | 30 | 30 | 30 | 30 | 30 | 30 |

Table 2 illustrates a relation between input power and input power density of the above-presented DC magnetron sputtering device.

TABLE 2

| Input Power (W) | Input Power Density (W/cm²) |
|---|---|
| 250 | 1.4 |
| 500 | 2.8 |
| 1000 | 5.6 |

The completed hole-only devices 1B were then connected to a direct current power supply, and voltage was applied thereto. Furthermore, by changing the applied voltage, an electric current value per unit surface area (current density) was calculated for different voltages. Hereinafter, the expression "driving voltage" refers to the voltage applied when the current density value is 10 mA/cm².

It can be inferred that as the driving voltage grows smaller, the efficiency of hole injection from the hole injection layer 4 to the buffer layer 6A is higher. This is because the components of each hole-only device 1B other than the hole injection layer 4 are prepared according to the same manufacturing method. Therefore, other than the hole injection layer 4, the hole injection barrier between two adjacent layers can be assumed to be constant. Furthermore, as described below, it was confirmed through another experiment that the anode 2 and the hole injection layer 4 in this experiment are in Schottky ohmic contact. Accordingly, the differences in driving voltage depending on the conditions for forming the hole injection layer 4 strongly reflect the hole injection efficiency from the hole injection layer 4 to the buffer layer 6A and the hole conduction efficiency of the hole injection layer 4 itself.

It can be assumed that in addition to the hole injection efficiency from the hole injection layer 4 to the buffer layer 6A, the hole conduction efficiency of the hole injection layer 4 also influences the characteristics of the elements in the experiments described in the present section, "Conditions for Forming the Tungsten Oxide Film". The below assessment of energy diagrams, however, also clearly indicates that the hole injection barrier between the hole injection layer 4 and the buffer layer 6A is strongly reflected in the characteristics of the elements.

Table 3 illustrates the driving voltages obtained through experiments for each hole-only device 1B under various film forming conditions of total pressure, oxygen partial pressure, and input power. Note that the numbers enclosed in circles in Table 3 indicate the element number of each of the hole-only devices 1B.

Furthermore, FIGS. 6A through 6C are graphs illustrating the dependence of driving voltages of the hole-only devices 1B on the film forming conditions. Each of the points in FIG. 6A indicates, from left to right in the figure, a driving voltage of element Nos. 4, 10, and 2. Similarly, each of the points in FIG. 6B indicates, from left to right in the figure, a driving voltage of element Nos. 13, 10, and 1. Finally, each of the points in FIG. 6C indicates, from left to right in the figure, a driving voltage of element Nos. 14, 2, and 8.

Here, it should be noted that in the following cases, film formation was not successfully performed due to limitations of the sputtering device, such as gas flow amount: total pressure of 2.7 Pa and oxygen partial pressure of 100%, total pressure of 4.8 Pa and oxygen partial pressure of 30%, total pressure of 4.8 Pa and oxygen partial pressure of 70%, and total pressure of 4.8 Pa and oxygen partial pressure ratio of 100%.

First, concerning the dependence of driving voltage on total pressure, when the oxygen partial pressure ratio was set to 50% and the input power was set to 500 W, a clear reduction in driving voltage was observed when the total pressure was set higher than 2.7 Pa and lower than or equal to 4.8 Pa, as illustrated in FIG. 6A. In addition, as a result of a different experiment, it was found that this trend of reduction in driving voltage continues at least until the total pressure is lower than or equal to 7.0 Pa. Taking this into account, it is desirable that total pressure during the forming of the hole injection layer 4 be set higher than 2.7 Pa and lower than or equal to 7.0 Pa.

Next, concerning the dependence of driving voltage on oxygen partial pressure ratio, when the total pressure was set to 2.7 Pa and the input power was set to 500 W, it was observed that driving voltage decreases as oxygen partial pressure ratio increases, at least when the oxygen partial pressure ratio was set higher than or equal to 50% and lower than or equal to 70%, as illustrated in FIG. 6B. However, as a result of a different experiment, it was found that when the oxygen partial pressure ratio exceeds this range, the driving voltage begins to increase adversely. Taking this into account, it is desirable that oxygen partial pressure ratio during the forming of the hole injection layer 4 be set higher than or equal to 50%, while setting an upper limit at approximately 70%.

Finally, concerning the dependence of driving voltage on input power, when total pressure was set to 4.8 Pa and oxygen partial pressure ratio was set to 50%, a rapid increase in driving voltage was observed when the input power exceeded 500 W, as illustrated in FIG. 6C. Taking this into account, it is

TABLE 3

Film Forming Conditions and Driving Voltages of the Hole-Only Devices 1B
(Applied Voltage Under Current Density of 10 mA/cm²)

| | | Total Pressure | | |
|---|---|---|---|---|
| | | 1.7 Pa | 2.7 Pa | 4.8 Pa |
| Oxygen Partial Pressure | 30% | (12) 500 W (unmeasured) | (13) 500 W (19 V) | Film could not be formed |
| | 50% | (4) 500 W (19 V) | (10) 500 W (19 V) | (14) 250 W (13.7 V) (2) 500 W (13.7 V) (8) 1000 W (>20 V) |
| | 70% | (11) 500 W (unmeasured) | (5) 250 W (14.7 V) (1) 500 W (18.2 V) (7) 1000 W (>20 V) | Film could not be formed |
| | 100% | (6) 250 W (unmeasured) (3) 500 W (>20 V) (9) 1000 W (>20 V) | Film could not be formed | Film could not be formed | desirable that input power be restricted to be lower than or equal to 500 W. Here, it should be noted that, when referring to elements No. 1 and 3 in Table 3, it could be seen that, even when the input power was set to 500 W, driving voltage increased when the total pressure was set lower than or equal to 2.7 Pa.

Figure 7:
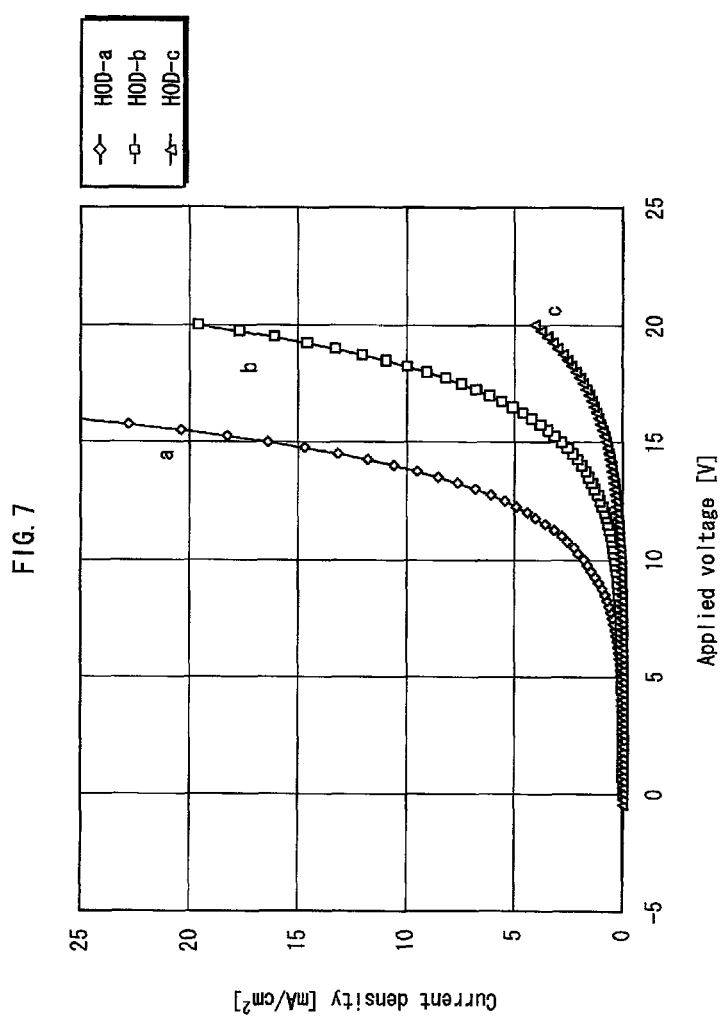
FIG. 7 is a device characteristics diagram showing relation curves illustrating relations between applied voltage and current density of the hole-only devices.

The subsequent FIG. 7 is a diagram illustrating an current density-applied voltage curve of the hole-only devices 1B, taking element Nos. 14, 1, and 7 as examples. In FIG. 7, the vertical axis indicates current density ($mA/cm^2$), whereas the horizontal axis indicates applied voltage (V). Furthermore, element No. 14 fulfills all desirable film forming conditions explained in the above of total pressure, oxygen partial pressure, and input power, while on the other hand, each of element Nos. 1 and 7 do not fulfill at least one of the desirable film forming conditions.

Concerning the film forming conditions under which the hole injection layer 4 (and the later-described tungsten oxide layer 12) is formed, in order as to facilitate the explanations to be provided in the following, hereinafter, the film forming conditions under which the hole injection layer 4 was formed in element No. 14 is referred to as film forming conditions a, the film forming conditions under which the hole injection layer 4 was formed in element No. 1 is referred to as film forming conditions b, and the film forming conditions under which the hole injection layer 4 was formed in element No. 7 is referred to as film forming conditions c. In addition, element Nos. 14, 1, and 7 are accordingly labeled HOD-a, HOD-b, and HOD-c in FIG. 7.

As illustrated in FIG. 7, the current density-applied voltage curve indicating HOD-a indicates that HOD-a has a higher degree of responsiveness to an increase in applied voltage compared with HOD-b and HOD-c. Further, it could be seen that HOD-a requires for the lowest level of applied voltage to reach a high current density compared with HOD-b and HOD-c. As a result, as compared to HOD-b and HOD-c, the hole injection efficiency from the hole injection layer 4 to the buffer layer 6A can be inferred to be superior in HOD-a. Here, it should be noted that HOD-a operates at the lowest driving voltage among the hole-only devices 1B.

Thus far, tests on the hole injection efficiency from the hole injection layer to the buffer layer in the hole-only devices 1B have been described. In an organic EL element within the light-emitting cell in an organic EL display panel according to an aspect of the present invention, the dependence on film forming conditions of the hole injection efficiency from the hole injection layer to the buffer layer is essentially the same as the hole-only devices 1B. In order to confirm this point, organic EL elements 1 as illustrated in FIG. 8 were prepared using hole injection layers formed under conditions a, b, and c.

Figure 8:
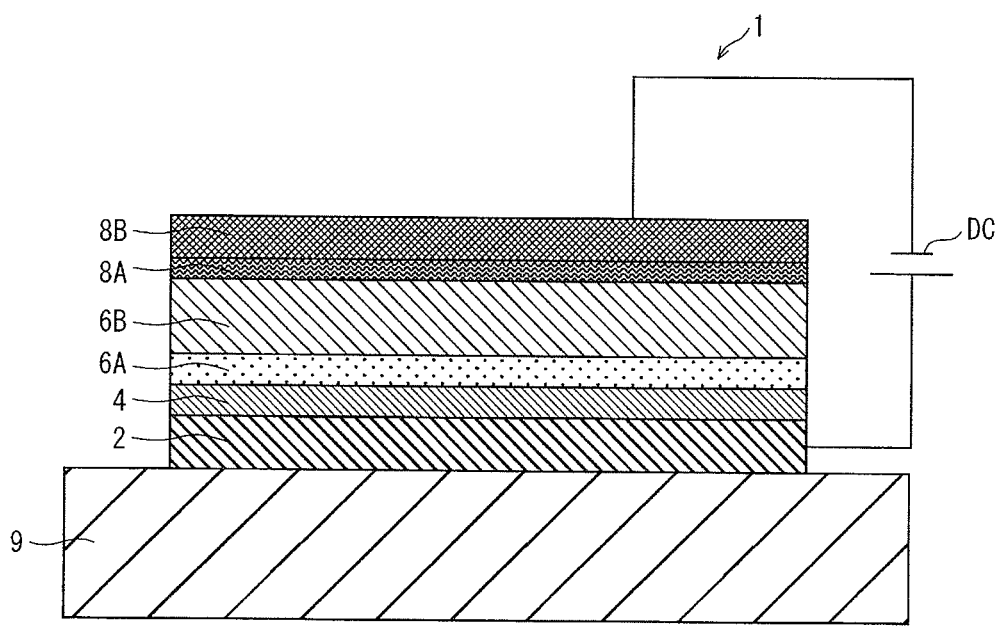
FIG. 8 is a schematic cross-sectional view illustrating a structure of an organic EL element 1 as an assessment device.

As illustrated in FIG. 8, apart from the cathode, the organic EL elements 1 thus prepared have an identical structure to the hole-only devices 1B. Specifically, an anode 2 composed of a thin ITO film was formed by sputtering on a substrate 9 to a thickness of 50 nm. A hole injection layer 4 composed of tungsten oxide was formed under conditions a, b, and c on the anode 2 to a thickness of 30 nm. A buffer layer 6A and a light-emitting layer 6B were then formed by spin coating. The buffer layer 6A was composed of TFB, which is an organic amine-containing polymer, and was formed on the hole injection layer 4 to a thickness of 20 nm. The light-emitting layer 6B was composed of F8BT, which is an organic polymer, and was formed to a thickness of 70 nm. An electron injection layer 8A composed of Ba was then formed to a thickness of 5 nm, and a cathode 8B composed of Al was then formed by vapor deposition to a thickness of 100 nm. Note that since the organic EL elements 1 are only assessment devices for examining the efficiency of hole injection from the hole injection layer to the buffer layer in the light-emitting unit of an organic EL display panel, other components such as the banks and the wiring portion were omitted.

Figure 9:
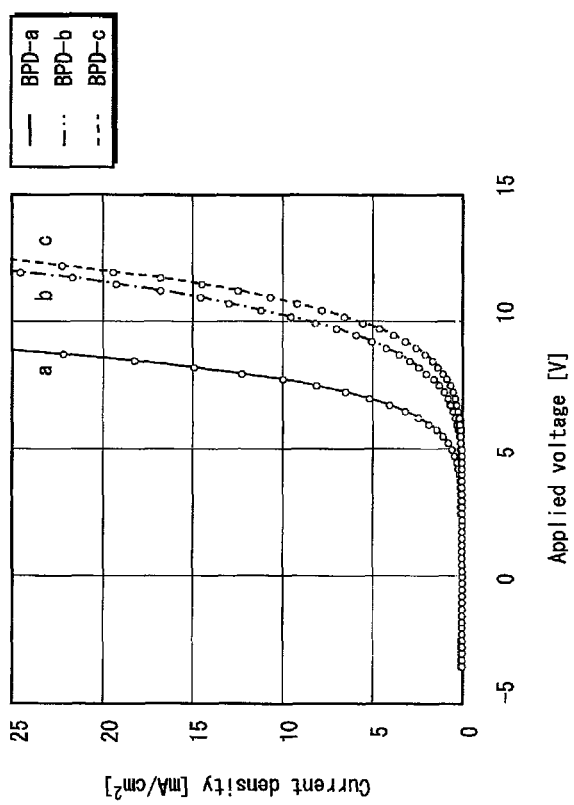
FIG. 9 is a device characteristics diagram showing relation curves illustrating relations between applied voltage and current density of organic EL elements.

The organic EL elements 1 prepared under film forming conditions a, b, and c were then connected to a direct current power supply, and voltage was applied thereto. FIG. 9 is a diagram illustrating the current density-applied voltage curve at this point. In FIG. 9, the vertical axis represents the current density ($mA/cm^2$), and the horizontal axis represents the applied voltage (V).

Note that, in order as to facilitate the explanations to be made in the following, the organic El elements 1 prepared under film forming conditions a, b, and c are respectively illustrated as BPD-a, BPD-b, and BPD-c in FIG. 9.

As illustrated in FIG. 9, the current density-applied voltage curve indicating BPD-a indicates that BPD-a has a higher degree of responsiveness to an increase in applied voltage compared with BPD-b and BPD-c. Further, it could be seen that BPD-a requires for the lowest level of applied voltage to reach a high current density compared with BPD-b and BPD-c. This trend is similar to the trend which could be seen in the hole-only devices HOD-a, HOD-b, and HOD-c, which were prepared under the same respective film forming conditions as BPD-a, BPD-b, and BPD-c.

Figure 10:
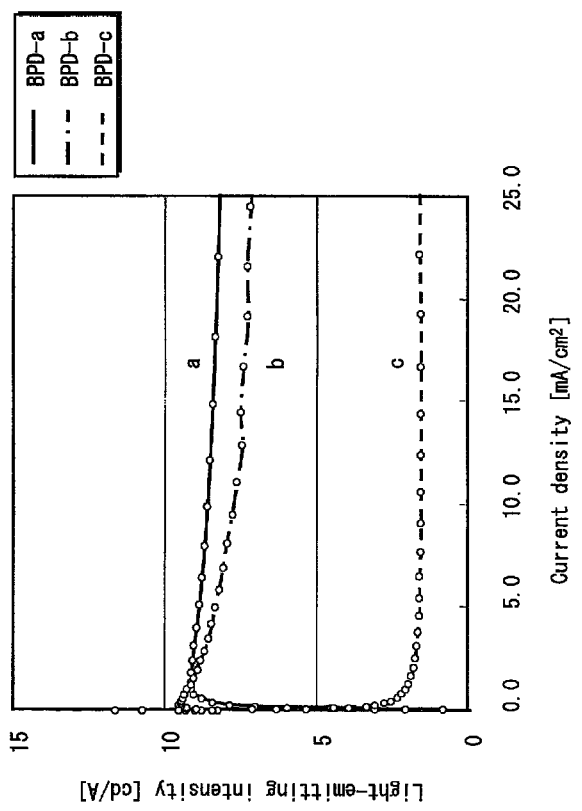
FIG. 10 is a device characteristics diagram showing relation curves illustrating relations between current density and light-emitting intensity of organic EL elements.

In addition, FIG. 10 is a diagram illustrating light-emitting intensity-current density curves corresponding to the above organic EL elements 1, each curve indicating the relation between the change in current density and the resultant change in light-emitting intensity. In FIG. 10, the vertical axis represents light-emitting intensity (cd/A), and the horizontal axis represents current density ($mA/cm^2$). FIG. 10 shows that the light-emitting intensity was strongest for BPD-a, at least over the range in which the current density was measured.

From the above results, it can be inferred that in the organic EL elements 1, the hole injection efficiency from the hole injection layer 4 to the buffer layer 6A depends on the film forming conditions in the same way as was the case with the hole-only devices 1B. Namely, in the organic EL elements 1 of the present experiment, the tungsten oxide film constituting the hole injection layer 4 was formed using metal tungsten as the sputtering target in a DC magnetron sputtering device, applying the reactive sputtering method without controlling the substrate temperature. The chamber gas was composed of argon gas and oxygen gas, with a total pressure higher than 2.7 Pa and lower than or equal to 7.0 Pa, an oxygen partial pressure ratio of at least 50% and at most 70%, and input power density at least 1 $W/cm^2$ and at most 2.8 $W/cm^2$. Under these conditions, it can be inferred that the hole injection efficiency from the hole injection layer 4 to the buffer layer 6A was good, thereby achieving a superb low driving voltage and high light-emitting efficiency.

Note that among the above conditions, the condition concerning input power is represented in terms of input power density based on Table 2. When using a DC magnetron sputtering device that is different from the DC magnetron sputtering device used in the present experiment, a hole injection layer 4 that achieves an organic EL element one with a superb low driving voltage and high light-emitting efficiency, as in the present experiment, can be yielded by adjusting the input power according to the size of the sputtering target so that the input power density fulfills the above condition. Conditions on total pressure and oxygen partial pressure, on the other hand, are independent of the device and the sputtering target.

Additionally, as already explained above, no intentional adjustment of the substrate temperature was performed while forming the hole injection layer 4 by applying the reactive sputtering method, and during the experiment, the sputtering device was placed under room temperature. Therefore, the substrate was at room temperature at least before the forming of the hole injection layer 4 was performed. However, while the hole injection layer 4 was being formed, there is a possibility that the substrate temperature may have risen by several tens of degrees Celsius.

Electronic State of the Hole Injection Layer

The tungsten oxide constituting the hole injection layer 40 of the organic EL display panel 110 of the present embodiment has the above-described occupied energy level near the Fermi surface. The occupied energy level near the Fermi surface is formed by adjusting the film forming conditions under which the hole injection layer 4 is formed as described above. Details are provided below.

The inventors conducted an experiment to determine whether the occupied energy level near the Fermi surface exists in each of the tungsten oxide films formed under a corresponding one of film forming conditions a, b, and c.

Figure 11:
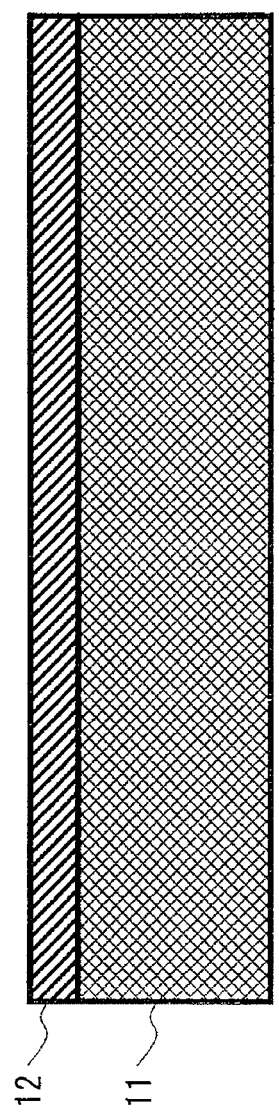
FIG. 11 is a schematic cross-sectional view illustrating a structure of a sample for photoelectron spectroscopy measurement.

The inventors prepared samples for photoelectron spectroscopy measurement under film forming conditions a, b, and c. As illustrated by the sample 1C in FIG. 11, each of the samples was prepared by forming a 10 nm-thick tungsten oxide layer 12 (corresponding to the hole injection layer) on a conductive silicon substrate 11 by applying the above-described reactive sputtering method. Hereinafter, a sample 1C formed under film forming conditions a is referred to as sample a, a sample 1C formed under film forming conditions b is referred to as sample b, and a sample 1C formed under film forming conditions c is referred to as sample c.

The forming of the tungsten oxide layer 12 of each of the samples was performed inside a sputtering device. Then, to prevent atmospheric exposure, the samples a, b, and c were transported to a glovebox which was connected to the sputtering device and which was filled with nitrogen gas. Subsequently, the samples were sealed inside transfer vessels in the glovebox, and were mounted on a photoelectron spectroscopy device. Thus, ultraviolet photoelectron spectroscopy (UPS) measurement of the samples was performed while preventing the tungsten oxide layer 12 having been formed on the samples from undergoing atmospheric exposure.

In general, a UPS spectrum obtained as a result of the UPS measurement reflects a state of occupied energy levels, such as a valence band and the like, within several nanometers in distance from the surface of the target of measurement. As such, the present experiment was conducted in order as to observe the state of occupied energy levels at a surface portion of the tungsten oxide layer 12 by utilizing UPS measurement.

The conditions under which the UPS measurement was conducted are as follows. Here, it should be noted that, since the samples a, b, and c commonly include the conductive silicon substrate 11, charge-up did not occur during the UPS measurement.

Figure 12:
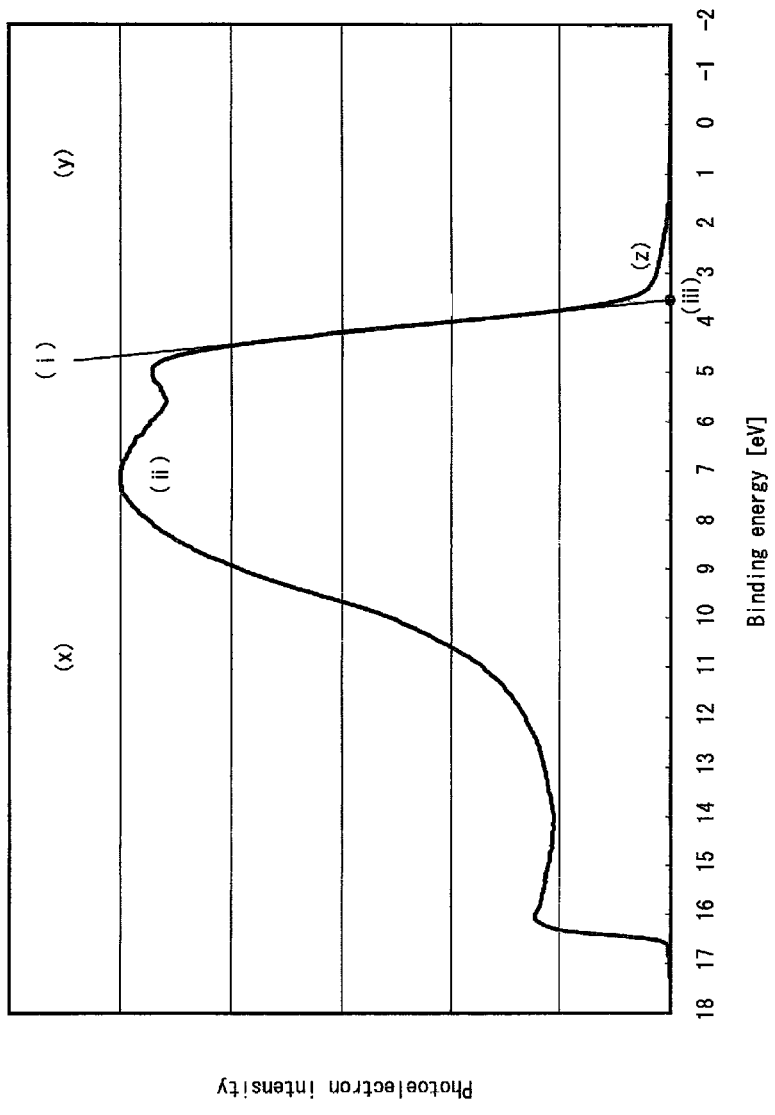
FIG. 12 is a diagram illustrating a UPS spectrum of a tungsten oxide layer.

Light source: He I line
Bias: None
Electron emission angle: Direction of normal line to the substrate
Interval between measurement points: 0.05 eV FIG. 12 is a diagram illustrating a UPS spectrum of the tungsten oxide layer 12 of the sample a. The origin of the horizontal axis, which represents binding energy, corresponds to the Fermi surface of the conductive silicon substrate 11, and the left direction with respect to the origin is positive.

Each of the occupied energy levels of the tungsten oxide layer 12 is now described with reference to FIG. 12.

Commonly, a UPS spectrum of tungsten oxide indicates a distinct, rapid rise which can be uniquely distinguished from other areas thereof. Here, a tangential line passing through an inflection point of the above rise is referred to as line (i), and the point at which line (i) intersects the horizontal axis is referred to as point (iii). The UPS spectrum of tungsten oxide can be divided into two areas: area x that extends in the high binding energy direction from point (iii), and area y that extends in the low binding energy direction from point (iii).

Here, according to Table 4, each of the samples a, b, and c has a tungsten oxide layer 12 whose composition ratio between tungsten atoms and oxygen atoms is approximately 1:3. The composition ratios illustrated in Table 4 were obtained by performing X-ray photoelectron spectroscopy (XPS) measurement. More specifically, XPS measurement of the samples was performed by using the photoelectron spectroscopy device while preventing atmospheric exposure of the tungsten oxide layer 12 from forming on the samples, in a similar way as in the UPS measurement. By conducting the XPS measurement, the composition ratio of tungsten to oxygen within several nanometers in distance from the surface of the tungsten oxide layer 12 was estimated for each of the samples a, b, and c. Note that the film forming conditions under which the tungsten oxide layers 12 were formed are also illustrated in Table 4.

TABLE 4

| | Sample | | |
| --- | --- | --- | --- |
| | Sample a | Sample b | Sample c |
| Film Forming Conditions | Film forming conditions a | Film forming conditions b | Film forming conditions c |
| Total Pressure (Pa) | 4.8 | 2.7 | 2.7 |
| Oxygen Partial Pressure (%) | 50 | 70 | 70 |
| Input Power (W) | 250 | 500 | 1000 |
| Composition Ratio (oxygen/tungsten) | 3.0 | 2.9 | 2.8 |

Based on the composition ratios, it can be assumed that in each of the samples a, b, and c, the tungsten oxide layer 12, at least within several nanometers in distance from the surface thereof, has an atomic arrangement basically in accordance with tungsten trioxide. That is, in the basic structure of the tungsten oxide layer 12, six oxygen atoms bond with one tungsten atom in octahedral coordination such that octahedrons share oxygen atoms at corners thereof with adjacent octahedrons. Accordingly, the area x in FIG. 12 has either the structure of tungsten trioxide or an amorphous structure in which the crystalline order is disturbed (yet in which bonds are not broken, thus preserving the above basic structure). The area x thus corresponds to a valence band with an occupied energy level deriving from the above basic structure. Note that the inventors have performed X-ray absorption fine structure (XAFS) measurement with respect to the tungsten oxide layer 12 of each of the samples a, b, and c, and have confirmed that the above-mentioned basic structure is formed therein.

Accordingly, the area y illustrated in FIG. 12 corresponds to a band gap between the valence band and the conduction band. It is commonly known, however, that an occupied energy level that differs from the occupied energy level of the valence band may exist in this area of the tungsten oxide, as is suggested by the UPS spectrum in FIG. 12. This occupied energy level in area y derives from another structure that is different from the above-mentioned basic structure, and is referred to as a band gap energy level (in-gap state or gap state).

Figure 13:
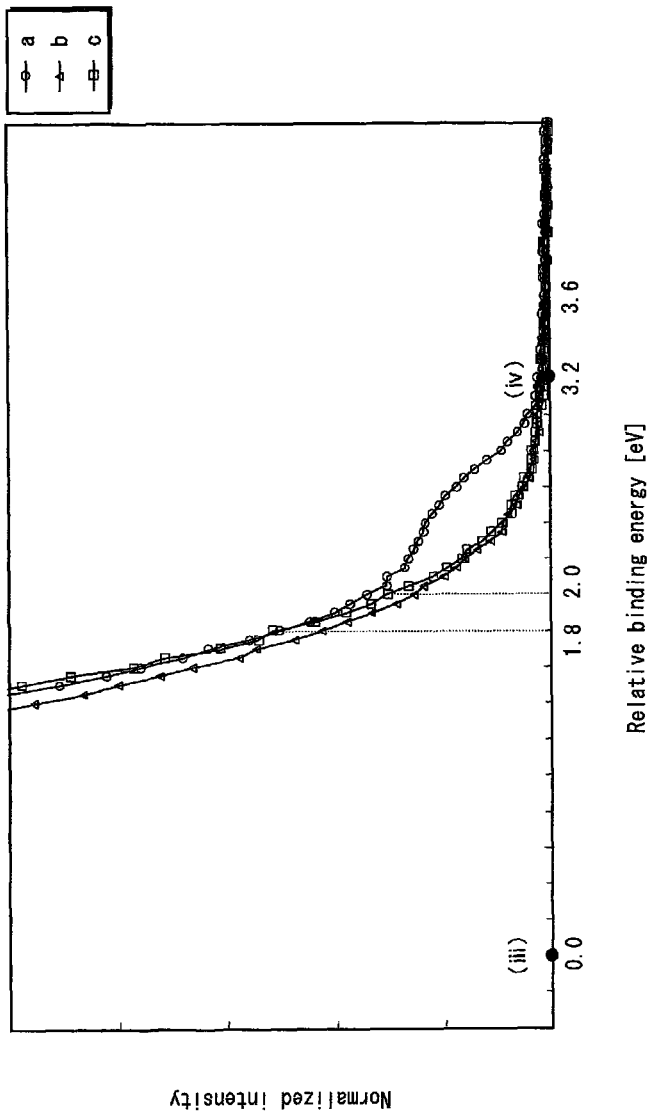
FIG. 13 is a diagram illustrating UPS spectra of a tungsten oxide layer.

The subsequent FIG. 13 is a diagram illustrating a UPS spectrum of the tungsten oxide layer 12 of each of the sample devices a, b, and c within area y. The spectrum intensity indicated by the vertical axis in FIG. 13 has been normalized using the peak-top intensity value of a peak (ii) in FIG. 12, which is located approximately between 3 eV and 4 eV in the high binding energy direction from point (iii). In addition, note that point (iii) in FIG. 13 is illustrated at the same point on the horizontal axis as in FIG. 12. In FIG. 13, the horizontal axis indicates a relative value (relative binding energy) with respect to point (iii), and the binding energy decreases from left to right.

As illustrated in FIG. 13, the spectrum indicating the tungsten oxide layer 12 of the sample a exhibits a peak in an area between a point which is 3.6 eV lower in terms of binding energy than point (iii) and a point which is 1.8 eV lower in terms of binding energy than point (iii). Point (iv) in FIG. 9 indicates a point at which such a peak in the spectrum indicating the tungsten oxide layer 12 of the sample a is first obviously observed. That is, point (iv) is a point at which the peak begins. The existence of such a peak is not observed in the spectra corresponding to samples b and c.

For forming the hole injection layer, the present invention thus uses tungsten oxide whose UPS spectrum indicates an upward protrusion (not necessarily in the form of a peak) in an area which is between 1.8 eV and 3.6 eV lower in terms of binding energy than point (iii), thereby endowing the organic EL display panel 110 with excellent hole injection efficiency.

Furthermore, it has been found that hole injection efficiency tends to increase when the upward protrusion has a higher degree of sharpness. Therefore, as illustrated in FIG. 13, it can be said that the area that is between 2.0 eV and 3.2 eV lower than point (iii) in terms of binding energy is particularly essential, since the upward protrusion is relatively easier to confirm in this area and has a relatively sharper inclination.

Note that, in the following description, the upward protrusion as observed in the UPS spectrum is referred to as "a spectral protrusion near the Fermi surface". Furthermore, the energy level corresponding to this spectral protrusion near the Fermi surface is the "the occupied energy level near the Fermi surface", which has been already described in the above.

Subsequently, the inventors performed differentiation on the normalized intensity of the UPS spectrum of each of the samples a, b, and c indicated in FIG. 13. The differentiation was performed for the purpose of making the spectral protrusion near the Fermi surface more distinguishable.

Specifically, by using the graph analysis software IGOR Pro 6.0, binomial smoothing (where the smoothing factor was set to 1) was conducted 11 times with respect to the UPS spectra illustrated in FIG. 13, and differentiation was subsequently performed applying the central difference method. Such processing of data was conducted so as to remove fluctuation factors such as background noise generated during the UPS measurement, to smoothen the differential curves, and to convey the arguments presented in the following in as clear a manner as possible.

Figure 14:
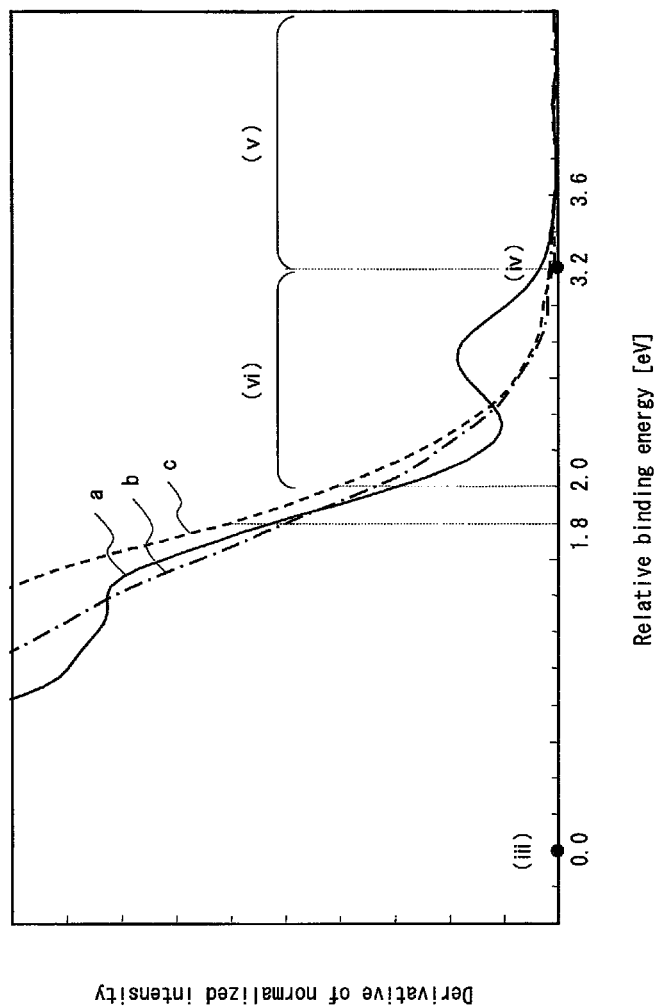
FIG. 14 is a diagram illustrating differential curves corresponding to the UPS spectra of FIG. 13.

FIG. 14 is a diagram illustrating differential curves yielded as a result of the above processing. Points (iii) and (iv) in FIG. 14 are provided at the same points on the horizontal axis as the respective points (iii) and (iv) in FIG. 13.

According to the differential curves illustrated in FIG. 14, the derivatives of normalized intensities of the tungsten oxide layers 12 corresponding to samples b and c do not depart from the vicinity of "0" within an area (v). Area (v) indicates an area which extends from a point which indicates a minimal binding energy that can be measured by using the photoelectron spectroscopy device to point (iv). Furthermore, in an area (vi) extending approximately 1.2 eV in the high binding energy direction from point (iv), the derivatives corresponding to samples b and c exhibit only a slight increase as approaching the high binding energy direction, although increase is seen in the increase rates thereof. In addition, the shapes of the differential curves corresponding to samples b and c within areas (v) and (vi) turn out to exhibit similarity with the respective UPS spectra illustrated in FIG. 13, from which the differential curves of FIG. 14 have been derived. Therefore, it can be said that the shapes of the UPS spectrum and the differential curve derived therefrom of each of samples b and c within areas (v) and (vi) resemble the shape of an exponential function curve.

On the other hand, for the tungsten oxide layer 12 of sample a, the differential curve exhibits a rapid rise from the vicinity of point (iv) towards the direction of higher binding energy. Thus, the shape of the differential curve within the areas (v) and (vi) clearly differs from the shape of an exponential function curve. Similarly, in FIG. 13, the spectrum for sample a from which FIG. 14 is derived begins to protrude in the vicinity of point (iv). At the same time, it is clear that the spectrum in FIG. 13 exhibits a spectral protrusion near the Fermi surface differing from the shape of an exponential function curve.

In other words, such a sample a is characterized in that an occupied energy level near the Fermi surface is found in an area which is approximately 1.8 eV to 3.6 eV lower than the lowest binding energy of the valence band. In particular, a spectral protrusion near the Fermi surface corresponding to the occupied energy level near the Fermi surface can be clearly seen in the UPS spectrum in an area that is approximately between 2.0 eV and 3.2 eV lower than the lowest binding energy of the valence band.

Figure 15:
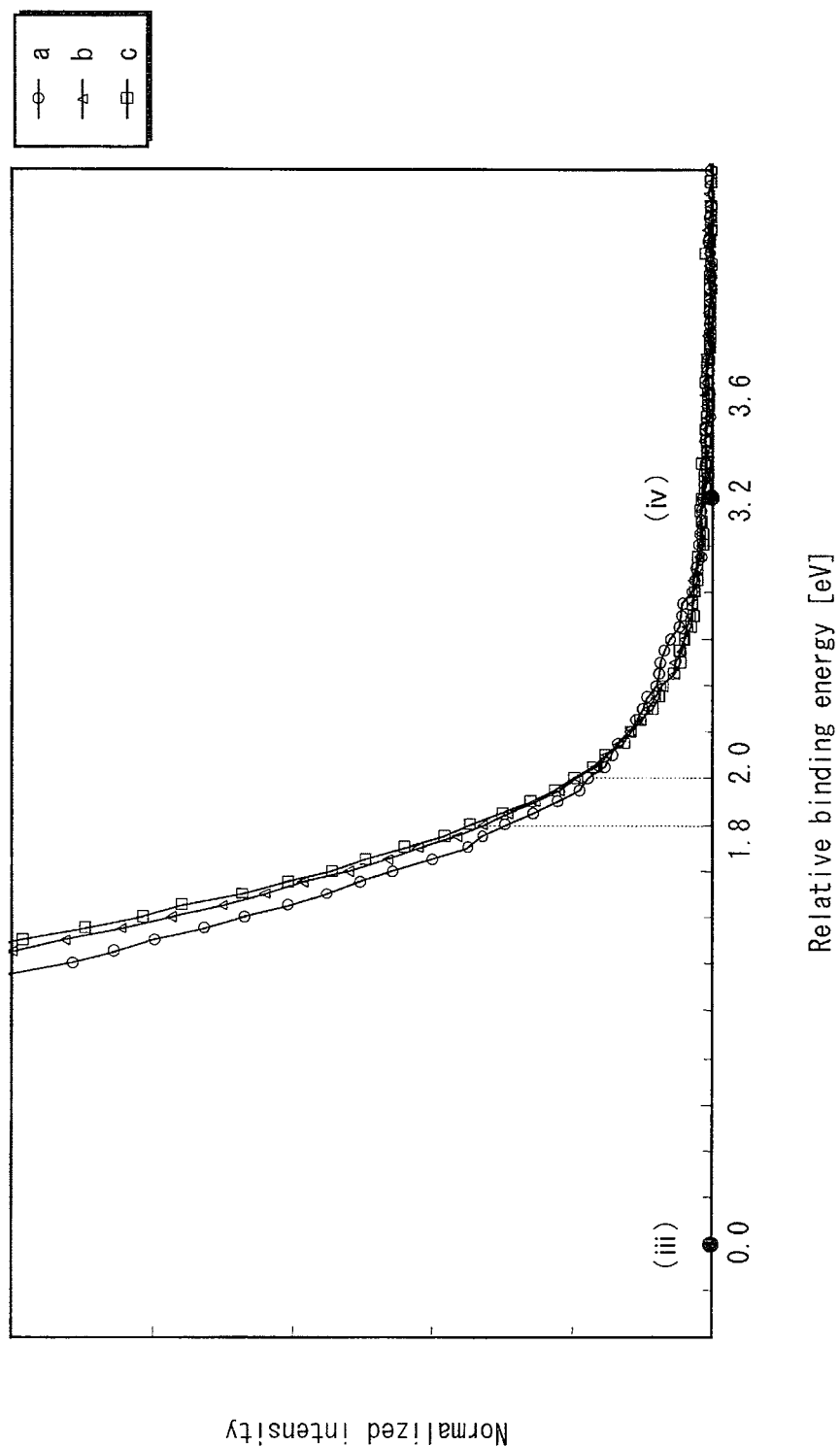
FIG. 15 is a diagram illustrating UPS spectra of tungsten oxide layers that have been subjected to atmospheric exposure.

Next, the inventors conducted atmospheric exposure, at room temperature for a period of one hour, of the tungsten oxide layer 12 of each of the samples a, b, and c on which the UPS spectra measurement illustrated in FIG. 13 had been performed. These samples had not previously been exposed to the atmosphere after film formation. The inventors then conducted UPS measurement again to confirm changes in the spectra. FIG. 15 is a diagram illustrating UPS spectra within the above area y. The horizontal axis in FIG. 15 is similar to the horizontal axis in FIG. 13, with points (iii) and (iv) located along the horizontal axis at the same position as in FIG. 13.

Based on the UPS spectra illustrated in FIG. 15, the tungsten oxide layer 12 of each of the samples b and c does not exhibit the spectral protrusion near the Fermi surface either before or after atmospheric exposure. On the other hand, the tungsten oxide layer 12 of the sample a still exhibits the spectral protrusion near the Fermi surface, although the spectrum after atmospheric exposure differs in intensity and shape. Hence, sample a maintains the same characteristics as before atmospheric exposure even after conducting atmospheric exposure for a certain duration, thus clearly demonstrating that sample a has a certain level of stability with respect to the surrounding atmosphere.

Thus far, the measured UPS spectra of the samples a, b, and c have been discussed. It should be noted, however, that the spectral protrusion near the Fermi surface can similarly be observed in the spectra obtained by XPS measurement or hard X-ray photoelectron spectroscopy measurement.

Figure 16:
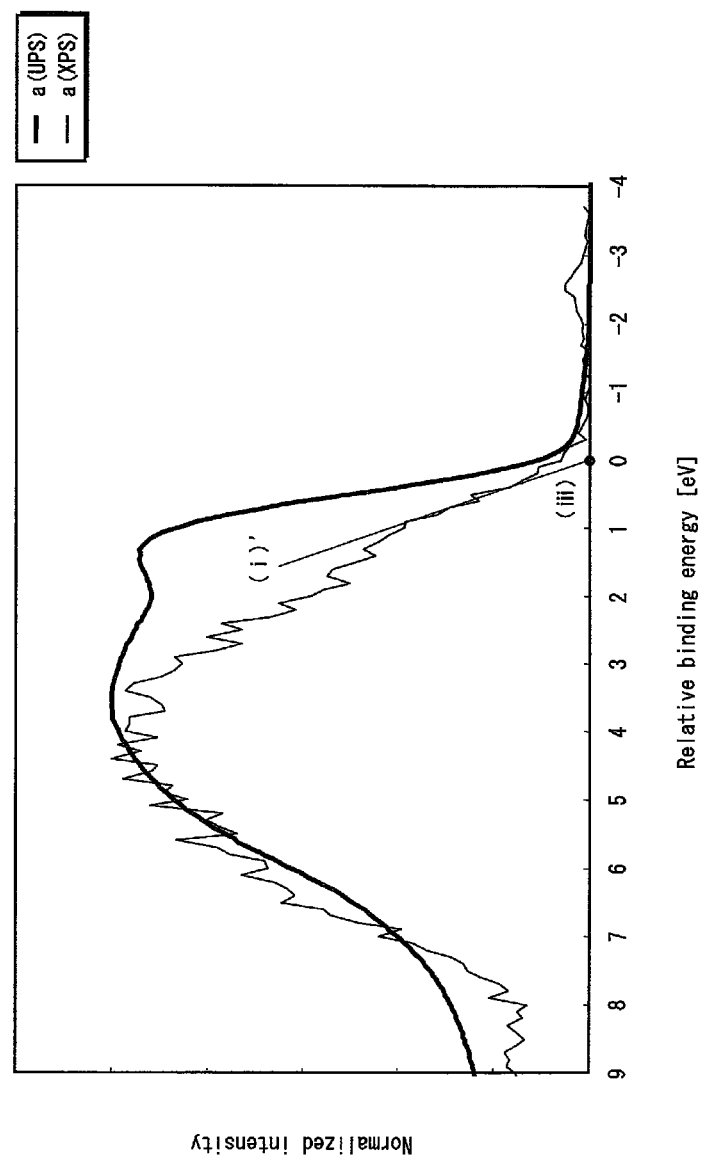
FIG. 16 is a diagram illustrating both a UPS spectrum and an XPS spectrum of a tungsten oxide layer according to an aspect of the present invention.

FIG. 16 is a diagram illustrating an XPS spectrum of the tungsten oxide layer 12 of sample a after the above atmospheric exposure. For the sake of comparison, the UPS spectrum of the tungsten oxide layer 12 of sample a (as illustrated in FIG. 12) is also shown overlaid on the XPS spectrum.

The conditions under which the XPS measurement was conducted are similar to the conditions for the above UPS measurement, differing only in that an Al—Kα line was used as the light source. The interval between measurement points, however, was 0.1 eV. In FIG. 16, point (iii) is provided at the same point on the horizontal axis as point (iii) in FIG. 12, and like FIG. 13, the horizontal axis indicates a relative binding energy with respect to point (iii). In addition, a line in the XPS spectrum corresponding to the line (i) in FIG. 12 is illustrated as line (i)' in FIG. 16.

As illustrated in FIG. 16, the spectral protrusion near the Fermi surface of the tungsten oxide layer 12 of the sample a is found in the XPS spectrum, as well as in the UPS spectrum, as a protrusion of a considerable degree within an area approximately between 1.8 eV and 3.6 eV lower than the lowest binding energy of the valence band. The spectral protrusion near the Fermi surface was similarly found in a separate experiment in the spectrum observed with hard X-ray photoelectron spectroscopy.

The sample 1C (FIG. 11) was used instead of the organic EL element 1 (FIG. 8) as the sample for conducting the above photoelectron spectroscopy measurements. Unlike the structure of the organic EL element 1, the sample 1C is composed of the tungsten oxide layer 12 formed on the conductive silicon substrate 11. This step was taken merely to prevent the occurrence of charge-up during measurement; the structure of the organic EL display panel 110 according to an aspect of the present invention is not to be limited to such a structure.

According to another experiment conducted by the inventors, when UPS measurement and XPS measurements were conducted against a sample having the structure of the organic EL element 1 illustrated in FIG. 8 (i.e. an anode composed of ITO and a hole injection layer composed of tungsten oxide formed in this order on one surface of the substrate 9), charge-up occurred during measurement of the tungsten oxide layer under film forming conditions b and c.

However, by using a neutralizing electron gun that cancels such charge-up, a similar spectrum as for sample 1C was obtained at least in the range extending from the band gap to the lowest binding energy in the valence band, even though in some cases the absolute value of the binding energy indicated by each of the occupied energy levels of the hole injection layer (for example, the binding energy value when the Fermi level of the photoelectron spectroscopy device itself is set as a reference point) differed from the corresponding value of the tungsten oxide layer 12 of the sample device 1C for photoelectron spectroscopy measurement.

Analysis of Hole Injection Efficiency from the Hole Injection Layer to the Functional Layer In the case of an occupied energy level near the Fermi surface in a hole injection layer composed of tungsten oxide, the principle behind the effect that the occupied energy level has on the efficiency of hole injection from the hole injection layer to the functional layer can be explained as follows. Note that in this case, the existence of the occupied energy level can be confirmed as a protrusion near the Fermi surface in, for instance, a UPS spectrum.

It has been frequently reported, with reference to results of experiments and first principles calculations, that existence of the occupied energy level near the Fermi surface, which can be seen in a thin film or a crystal of tungsten oxide, derives from a structure similar to an oxygen vacancy.

Specifically, it can be assumed that the existence of the occupied energy level near the Fermi surface derives from a binding orbital formed by 5d orbitals of adjacent tungsten atoms due to a deficiency of oxygen atoms, or from a 5d orbital of a singular tungsten atom which is not terminated with an oxygen atom and which exists at the surface of a film or within a film. Further, it is assumed that such 5d orbitals, when either in semi-occupied state or unoccupied state, are capable of pulling an electron off of the highest occupied molecular orbital of an organic molecule when contact is formed therebetween. The pulling of an electron from the organic molecule performed by the 5d orbital is believed to have the effect of stabilizing the energy state of both the tungsten atom and the organic molecule.

As a matter of fact, a report has been made that, when a layer composed of α-NPD, which is a small organic molecule, is layered on a thin film of molybdenum oxide, electrons transfer from the α-NPD molecule to the molybdenum oxide thin film (Non-Patent Literature 4). Note that molybdenum oxide has many common physical properties similar to those of tungsten oxide, such as a catalyst effect, electrochromism, and photochromism.

In further detail, the inventors arrived at the conception that, in the case of tungsten oxide, a semi-occupied 5d orbital or a structure similar thereto of a single tungsten atom corresponds to the occupied energy level near the Fermi surface. The semi-occupied 5d orbital is lower in terms of binding energy than a binding orbital of 5d orbitals of adjacent tungsten atoms.

Figure 17:
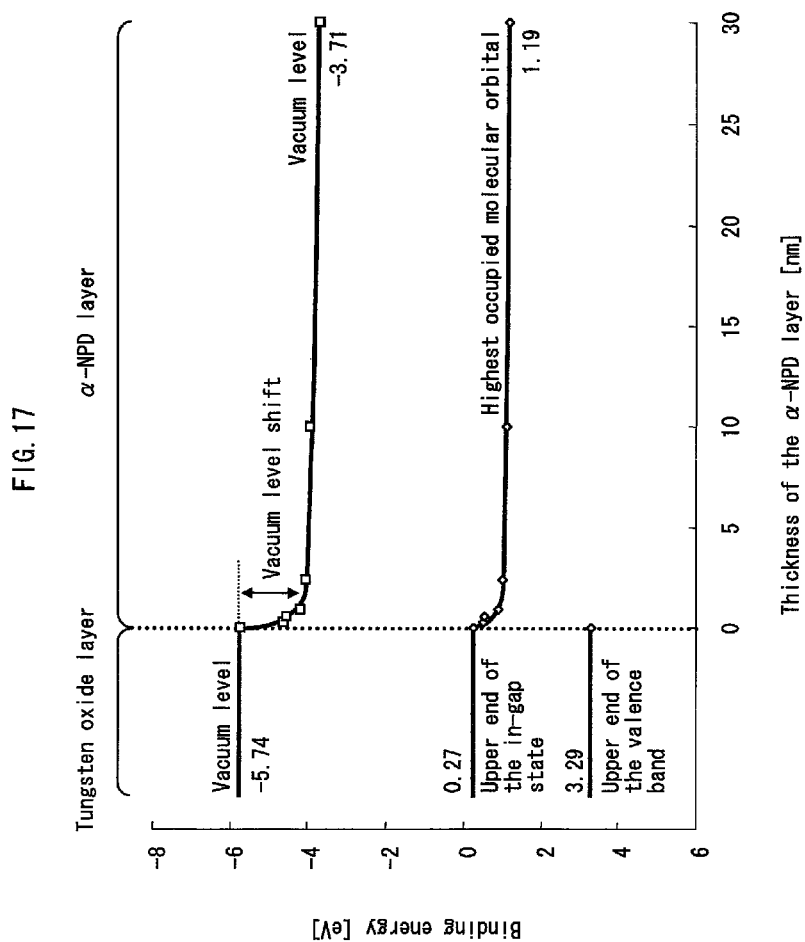
FIG. 17 is a diagram illustrating an energetic state at an interface between the tungsten oxide layer according to an aspect of the present invention and an α-NPD layer.

FIG. 17 is a diagram illustrating an energetic state at an interface between the tungsten oxide layer having the occupied energy level near the Fermi surface and an α-NPD layer.

Within the tungsten oxide layer (corresponding to the hole injection layer), FIG. 17 illustrates the lowest binding energy of the valence band (the "upper end of the valence band" in FIG. 17) and the lowest binding energy of the occupied energy level near the Fermi surface, corresponding to the point at which the occupied energy level near the Fermi surface rises (the "upper end of the in-gap state" in FIG. 17). In the UPS spectrum, the upper end of the valence band corresponds to point (iii) in FIG. 12, and the upper end of the in-gap state corresponds to point (iv) in FIG. 13.

In addition, FIG. 17 illustrates the relationship between (i) the thickness of the α-NPD layer, in a case where the α-NPD layer (corresponding to the functional layer) is formed on the tungsten oxide layer, and (ii) the binding energy of the highest occupied molecular orbital of the α-NPD as well as the vacuum level. Here, the binding energy of the highest occupied molecular orbital of the α-NPD layer corresponds to the binding energy at a point at which a peak in the highest occupied molecular orbital begins in the UPS spectrum, i.e. the lowest binding energy of the highest occupied molecular orbital in the α-NPD.

More specifically, the energy diagram illustrated in FIG. 17 is obtained through repeated alternate execution of the UPS measurement and the ultra-high vacuum vapor deposition, where the tungsten oxide layer formed on the ITO substrate is transferred back and forth between a photoelectron spectroscopy device and an ultra-high vacuum vapor deposition device connected to the photoelectron spectroscopy device. Since the occurrence of charge-up was not encountered during the UPS measurement, the binding energy on the vertical axis in FIG. 17 is indicated as an absolute value taken with respect to a reference point, which is the Fermi level of the ITO substrate.

FIG. 17 demonstrates that, at least within a range of between 0 and 0.3 nm from the surface of the α-NPD layer, i.e. in a vicinity of the interface between the tungsten oxide layer and the α-NPD layer, the upper end of the in-gap state of the tungsten oxide layer and the highest occupied molecular orbital of the α-NPD layer are approximately equal in terms of binding energy. In other words, the energy levels are in a state of alignment (the state described above as the "interface energy level alignment"). Here, it should be noted that the state of "approximately equal" as referred to above actually includes a state where a slight difference exists between the binding energies of the two layers, and specifically denotes a range of ±0.3 eV inclusive.

Further, it can be seen from FIG. 17 that the interface energy level alignment is formed as a result of interaction between the tungsten oxide and the α-NPD, and not by mere coincidence. Refer to the following for reasons as to why such an indication can be made.

For instance, the change in vacuum level (vacuum level shift) observed at the interface between the tungsten oxide layer and the α-NPD layer indicates that an electrical double layer (EDL) is formed at the interface. Further, considering the direction in which the vacuum level shift is oriented, it can be seen that the EDL is formed to be negative in the direction of the tungsten oxide layer, and positive in the direction of the α-NPD layer. In addition, since the magnitude of the vacuum level shift is considerably large near 2 eV, it can be reasonably assumed that the EDL has been formed not due to physical adsorption or the like, but rather as a result of an effect similar to a chemical bond. Thus, it can be reasonably assumed that the interface energy level alignment has been formed as a result of interaction between the tungsten oxide and the α-NPD.

Furthermore, the inventors of the present invention assume that the interaction is specifically caused by a mechanism as described below.

First of all, as described above, the occupied energy level near the Fermi surface derives from the 5d orbital of a tungsten atom that has a structure similar to an oxygen vacancy. In the following, the 5d orbital of the tungsten atom is referred to as a "W5d orbital corresponding to the spectral protrusion".

When the highest occupied molecular orbital of an α-NPD molecule approaches the W5d orbital corresponding to the spectral protrusion at the surface of the tungsten oxide layer, an electron transfers from the highest occupied molecular orbital of the α-NPD molecule to the W5d orbital corresponding to the spectral protrusion. Such transfer of an electron takes place since both the tungsten oxide layer and the α-NPD molecule seek for stabilization of energetic state. Hence, an EDL is formed at the interface, thus causing the vacuum level shift and the interface energy level alignment observed in FIG. 17.

More specifically, many reports have been made, as a result of first principles calculations, that the highest occupied molecular orbital of an organic amine-containing molecule, such as α-NPD, is characterized in that the electron density thereof typically exhibits a distribution biased towards a nitrogen atom of the amine structure, and that the structure thereof includes, as the main component, a lone pair of electrons of the nitrogen atom. It can therefore be assumed that, particularly at the interface between the tungsten oxide layer and the layer of an organic amine-containing molecule, an electron transfers from the lone pair of electrons of the nitrogen atom in the amine structure of the amine-containing molecule, to the W5d orbital corresponding to the spectral protrusion.

This assumption is supported by reports made of interface energy level alignments, similar to the interface energy level alignment between the tungsten oxide layer and the α-NPD layer illustrated in FIG. 17, at interfaces formed between both α-NPD and F8BT and a vapor deposition film of molybdenum oxide, which has a physical property similar to tungsten oxide, as described above (see Non-Patent Literature 2, 6, and 7).

In the organic EL display panel pertaining to an aspect of the present invention, the excellent efficiency of the hole injection layer for hole injection into the functional layer can be explained according to the interface energy level alignment as described above. That is, an interface energy level alignment occurs between the hole injection layer composed of tungsten oxide that has the occupied energy level near the Fermi surface and the adjacent functional layer. As a result, the binding energy at the point at which the occupied energy level near the surface begins to rise and the binding energy of the highest occupied molecular orbital of the functional layer become approximately equal. The injection of holes takes place between such energy levels having the interface energy level alignment formed therebetween. Therefore, the hole injection barrier between the hole injection layer and the functional layer in an aspect of the present invention is nearly nonexistent.

The cause behind formation of the occupied energy level near the Fermi surface is a structure similar to an oxygen vacancy, and it is highly unlikely for tungsten oxide that is completely free of such a structure to actually exist. For example, it can be reasonably assumed that, even in such tungsten oxide as used to prepare the above-described samples b and c, which does not exhibit the spectral protrusion near the Fermi surface in the photoelectron spectroscopy spectrum, structures similar to an oxygen vacancy exist, however minimal they may be in number.

Figure 18A:
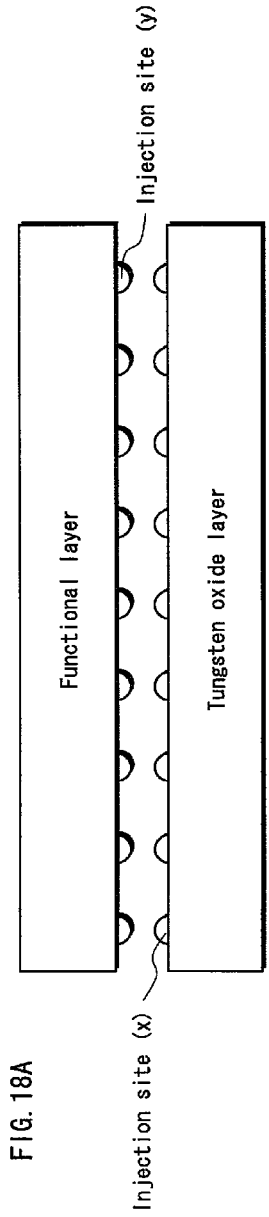
FIGS. 18A and 18B are diagrams illustrating the effects yielded by injection sites of the hole injection layer and a functional layer.
Figure 18B:
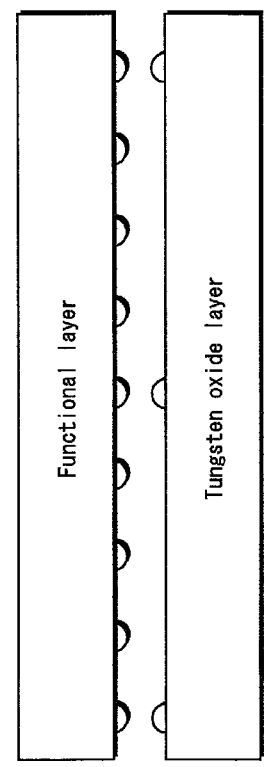

With respect to this point, explanation is now provided, with reference to FIGS. 18A and 18B, of the reason for which the hole-only device HOD-a and the organic EL element BPD-a, both having the hole injection layer which corresponds to the tungsten oxide layer 12 of the sample a, exhibit the superb low driving voltage observed in the above experiments.

To bring about the interaction between the highest occupied molecular orbital of the organic molecule composing the functional layer and the occupied energy level near the Fermi surface of the tungsten oxide layer when disposing the tungsten oxide layer on the functional layer, the following condition needs to be fulfilled. Namely, at the interface between the layers, a portion of the organic molecule where the electron density of the highest occupied molecular orbital is high and a structure similar to an oxygen vacancy on the surface of the tungsten oxide layer (illustrated as "injection site x" in FIG. 18A) must approach (i.e. contact) each other to within a distance at which the interaction is triggered. The portion of the organic molecule (illustrated as "injection site y" in FIG. 18A) is, for instance, a nitrogen atom in the amine structure of an organic amine-containing molecule.

However, in a tungsten oxide layer as incorporated in the samples b and c, the number density of the injection site x, if any, is extremely small, as illustrated in FIG. 18B. Accordingly, the upward protrusion near the Fermi surface does not appear in the UPS spectra thereof. Thus, the possibility of the injection site y and the injection site x coming into contact is extremely low. Since the injection of holes takes place where the injection site a and the injection site y come into contact, it is clear that hole injection efficiency in samples b and c is extremely low.

In contrast to this, as illustrated in FIG. 18A, an abundance of injection sites y exists in the tungsten oxide layer which exhibits the spectral protrusion near the Fermi surface, as for example in the above-described sample a. Thus, there is a high possibility of the injection sites y and the injection sites x coming into contact, thereby providing a high hole injection efficiency from the hole injection layer to the functional layer.

To further substantiate the analysis made thus far, the energy diagram at the interface with the α-NPD layer was also measured, as in FIG. 17, for the tungsten oxide layer formed under film forming conditions c, i.e. the tungsten oxide layer in which no protrusion near the Fermi surface could be confirmed.

Figure 19:
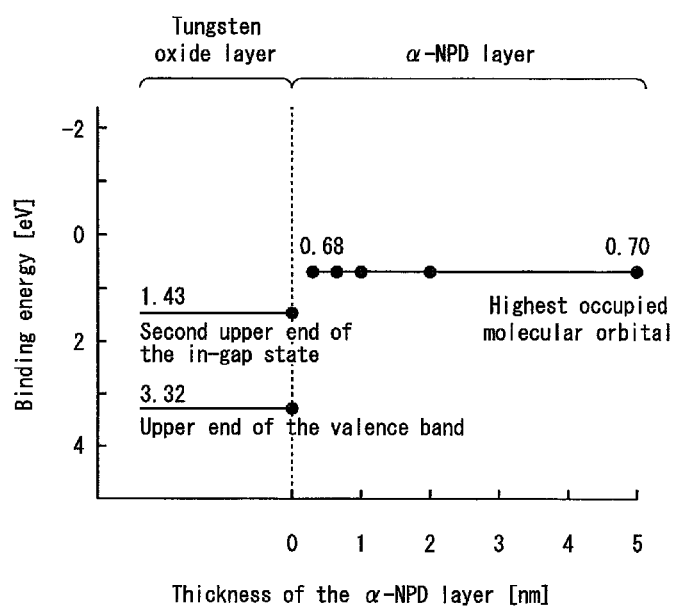
FIG. 19 is a diagram illustrating an energetic state at an interface between the tungsten oxide layer formed under film forming conditions c and the α-NPD layer.

FIG. 19 shows the results. As described above, the upper end of the in-gap state of the tungsten oxide layer, which corresponds to the spectral protrusion near the Fermi surface, could not be confirmed at all. As a candidate for another energy level used in hole injection, FIG. 19 shows the point at which a structure different from the spectral protrusion ((z) in FIG. 12) rises (the "second upper end of the in-gap state"), this point being observed at a higher binding energy than the location of the spectral protrusion near the Fermi surface in the UPS spectrum. FIG. 19 also shows the upper end of the valence band.

However, the highest occupied molecular orbital of the α-NPD in FIG. 19 completely differs from FIG. 17 and approaches neither the second upper end of the in-gap state nor the upper end of the valence band. In other words, interface energy level alignment does not occur at all. This means that the second in-gap state and the valence band both hardly interact with the highest occupied molecular orbital of the α-NPD. Even if holes are injected from the second upper end of the in-gap state to the highest occupied molecular orbital of the α-NPD, the injection barrier is 0.75 eV, an extremely large value compared to FIG. 17, in which the injection barrier is nearly zero.

It is considered that this difference in the injection barrier greatly affects the driving voltage and the light-emitting efficiency of the hole-only devices 1B and the organic EL elements 1 formed under film forming conditions a, b, and c. Specifically, the differences in characteristics between the hole-only devices 1B and the organic EL elements 1 formed under film forming conditions a, b, and c strongly suggest that the organic EL display panel 110 according to an aspect of the present invention has excellent hole injection efficiency from the hole injection layer to the functional layer.

To summarize the above analysis, the excellent hole injection efficiency of the organic EL display panel 110 according to an aspect of the present invention can be explained as follows.

First, a hole injection layer composed of tungsten oxide exhibits, in the photoelectron spectroscopy spectrum thereof, an upward protrusion near the Fermi surface. This means that a considerable number of structures similar to an oxygen vacancy, as well as occupied energy levels near the Fermi surface deriving from the structures, exist along the surface of the hole injection layer.

The occupied energy level near the Fermi surface, the existence of which is indicated by the spectral protrusion near the Fermi surface, pulls an electron off from the organic molecule composing the functional layer adjacent to the hole injection layer. As a result, the occupied energy level near the Fermi surface establishes an interface energy level alignment with the highest occupied molecular orbital of the organic molecule.

As such, if a considerable number of structures similar to an oxygen vacancy is found along the surface of the hole injection layer, the probability increases of contact between the occupied energy level near the Fermi surface and a portion of the highest occupied molecular orbital with a high electron density in the organic molecule. Thus, the interface energy level alignment occurs efficiently, whereby the tungsten oxide layer exhibits excellent hole injection efficiency from the hole injection layer to the functional layer.

Analysis of Hole Injection Efficiency from the Anodes to the Hole Injection Layer The following describes the Schottky ohmic contact formed between the anode and the hole injection layer composed of tungsten oxide according to an aspect of the present invention. The stability of this contact (as dependent on the material and surface conditions of the anode) is also described.

1. Hole Injection Barrier Between Anode and Hole Injection Layer

FIGS. 20 through 23 are energy diagrams near the interface between the anode and the functional layer in a conventional organic EL element, in which the anode in the functional layer are directly laminated together. Here, α-NPD was used as the functional layer. The binding energy along the vertical axis in the figures represents absolute values, with the Fermi level of the anode at the origin.

Figure 20:
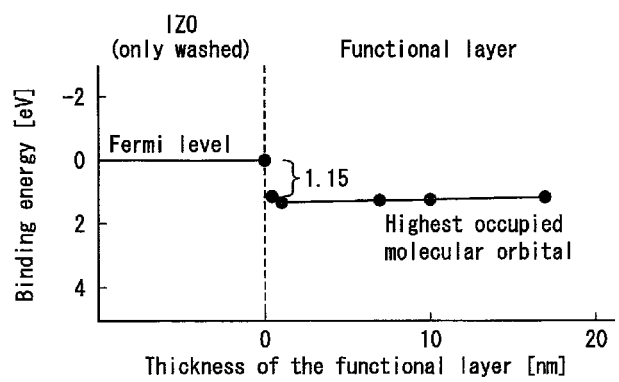
FIG. 20 is a diagram illustrating an energetic state at an interface between the functional layer and an IZO anode cleaned with pure water.
Figure 21:
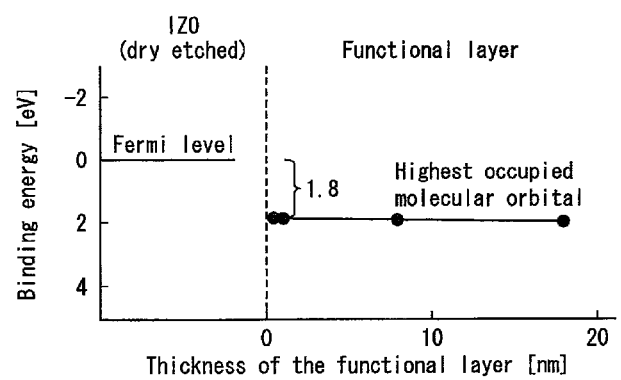
FIG. 21 is a diagram illustrating an energetic state at an interface between the functional layer and an IZO anode cleaned with pure water and subsequently dry etched.

When the anode is formed from IZO, as in FIGS. 20 and 21, the hole injection barrier between the Fermi level of the anode and the highest occupied molecular orbital of the functional layer was quite large, exceeding 1 eV both when the surface of the anode was cleaned only with pure water, as in FIG. 20, and when dry etching was performed on the surface of the anode after cleaning with pure water, as in FIG. 21. The magnitude of the hole injection barrier has also been shown to vary greatly depending on differences in how the IZO surface is processed.

Figure 22:
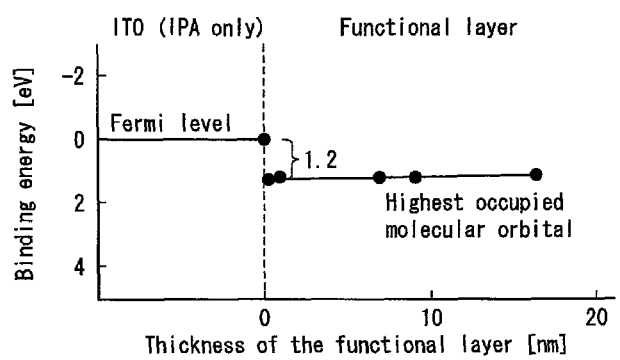
FIG. 22 is a diagram illustrating an energetic state at an interface between the functional layer and an ITO anode cleaned with IPA.
Figure 23:
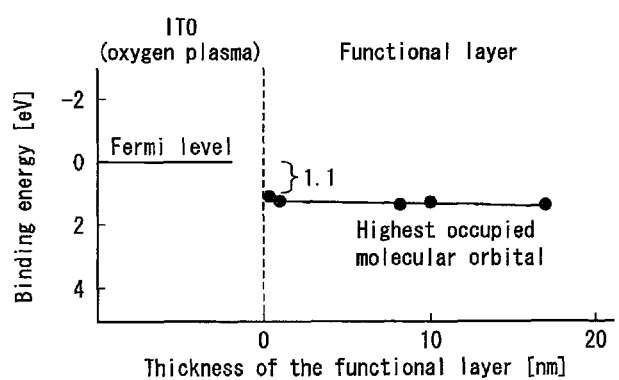
FIG. 23 is a diagram illustrating an energetic state at an interface between the functional layer and an ITO anode cleaned with IPA and subsequently subject to oxygen plasma treatment.

When the anode is formed from ITO, as in FIGS. 22 and 23, is also clear that a very high hole injection barrier exists both when the surface of the anode is only cleaned with IPA (isopropanol), as in FIG. 22, and when the surface of the anode is further treated with oxygen plasma after cleaning with IPA, as in FIG. 23.

As illustrated in FIGS. 20 through 23, in a conventional organic EL element, the hole injection barrier between the anode and the functional layer varies greatly depending on the type of anode material and on the surface condition of the anode. Moreover, the barrier itself is large, thus clearly pointing to the potential for improvement with regards to driving voltage.

On the other hand, FIGS. 24 through 28 are energy diagrams near the interface between an anode and a hole injection layer when the anode is laminated with the hole injection layer composed of tungsten oxide according to an aspect of the present invention.

Figure 24:
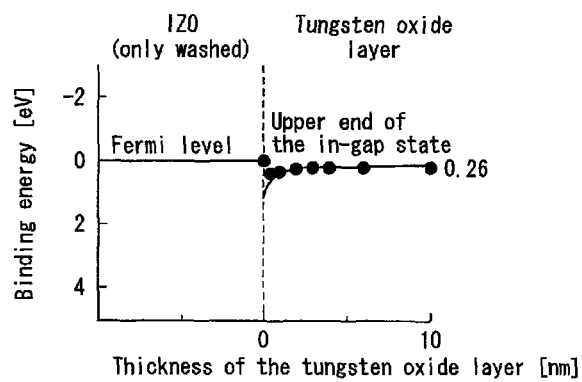
FIG. 24 is a diagram illustrating an energetic state at an interface between the hole injection layer according to an aspect of the present invention and an IZO anode cleaned with pure water.
Figure 25:
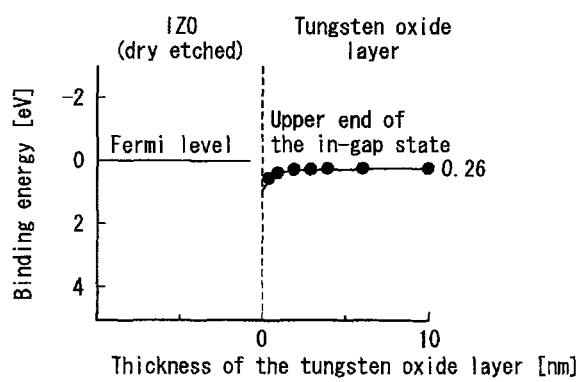
FIG. 25 is a diagram illustrating an energetic state at an interface between the hole injection layer according to an aspect of the present invention and an IZO anode cleaned with pure water and subsequently dry etched.

FIGS. 24 and 25 show the case of forming the anode from IZO. Like FIGS. 20 and 21, the surface of the anode was only cleaned with pure water in FIG. 24, whereas dry etching was performed on the surface of the anode after cleaning with pure water in FIG. 25. The hole injection layer according to an aspect of the present invention was then laminated on the anodes manufactured in this way.

Figure 26:
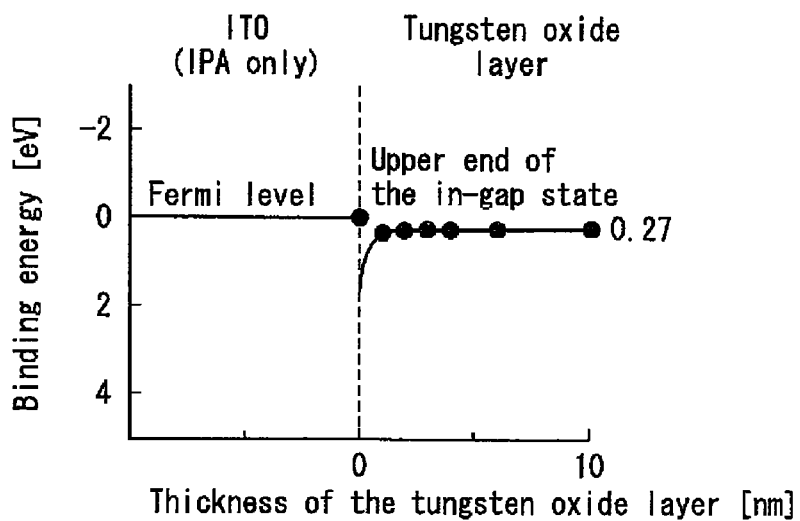
FIG. 26 is a diagram illustrating an energetic state at an interface between the hole injection layer according to an aspect of the present invention and an ITO anode cleaned with IPA.
Figure 27:
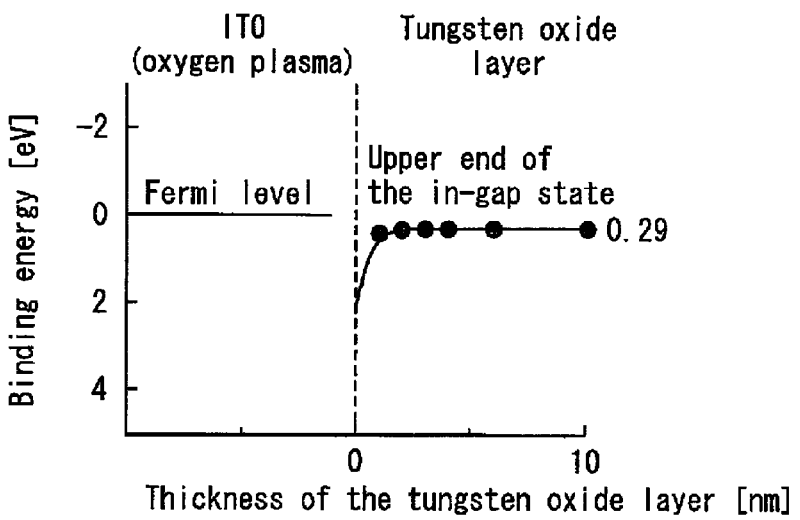
FIG. 27 is a diagram illustrating an energetic state at an interface between the hole injection layer according to an aspect of the present invention and an ITO anode cleaned with IPA and subsequently subject to oxygen plasma treatment.

FIGS. 26 and 27 show the case of forming the anode from ITO. Like FIGS. 22 and 23, the surface of the anode was only cleaned with IPA in FIG. 26, whereas the anode was treated with oxygen plasma after cleaning with IPA in FIG. 27. The hole injection layer according to an aspect of the present invention was then laminated on the anodes manufactured in this way.

Figure 28:
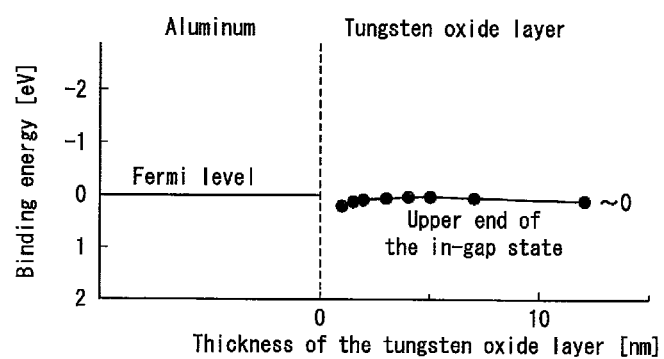
FIG. 28 is a diagram illustrating an energetic state at an interface between the hole injection layer according to an aspect of the present invention and an aluminum anode.

Furthermore, FIG. 28 shows the case of forming the anode from Al. After forming the anode, the hole injection layer according to an aspect of the present invention was layered thereon without the anode being exposed to the atmosphere, so as to prevent the surface from undergoing natural oxidation.

The following conclusions can be drawn from the results shown in FIGS. 24 through 28.

First, in every one of FIGS. 24 through 28, when the thickness of the hole injection layer is less than 2 nm, the binding energy at the upper end of the in-gap state, which is the position at which the occupied energy level near the Fermi surface begins to rise, has a relatively sharp inclination. At a thickness of 2 nm or greater, however, the binding energy is nearly constant. The value of the binding energy upon becoming nearly constant is extremely close to the Fermi level of the anode, the difference being within a range of ±0.3 eV. In other words, in all of FIGS. 24 through 28, the width of the Schottky barrier between the anode and the hole injection layer according to an aspect of the present invention is approximately 2 nm, meaning that excellent Schottky ohmic contact is achieved.

Furthermore, for the IZO anodes in FIGS. 24 and 25, as well as the ITO anodes in FIGS. 26 and 27, the difference in binding energy between the Fermi level of the anode and the upper end of the in-gap state when the thickness of the hole injection layer is 2 nm or greater does not depend on the surface conditions of the anode, but rather is nearly the same value (at most a difference of 0.02 eV).

The following conclusions can therefore be drawn. First of all, for all of the anode materials IZO, ITO, and Al, if the thickness of the hole injection layer according to an aspect of the present invention is 2 nm or greater, the anode and the hole injection layer are in Schottky ohmic contact. Furthermore, if the surface conditions of the anode have at least undergone one of the above treatments, then this contact is not only preserved well, but the degree of contact (the above difference in binding energy) does not depend on differences in surface conditions of the anode, thereby maintaining an extremely stable, constant state.

Based on these results, using the hole injection layer composed of tungsten oxide according to an aspect of the present invention promises excellent hole injection efficiency from the anodes to the hole injection layer without the need for a variety of procedures to maintain the work function and the surface conditions of the anode stable. In other words, no special care need be taken to carefully select the anode material, or to maintain the surface conditions of the anode strictly constant immediately before formation of the hole injection layer.

To summarize the above considerations, the hole injection layer composed of tungsten oxide according to an aspect of the present invention includes an occupied energy level near the Fermi surface, and the energy level acts to achieve Schottky ohmic contact with the anode with almost no influence from the work function or surface conditions of the anode. Specifically, at a location that is 2 nm from the surface of the anode towards the hole injection layer, the difference in binding energy between the Fermi level of the anode and the occupied energy level falls within a range of ±0.3 eV. As a result, the hole injection barrier between the anode and the hole injection layer is greatly reduced.

Due to the action of the occupied energy level, as described above, the hole injection barrier between the hole injection layer according to an aspect of the present invention and the functional layer is extremely small. Accordingly, holes can be injected from the anode to the hole injection layer as well as from the hole injection layer to the functional layer with nearly no barrier. Reducing the hole injection barrier in this way between not only the hole injection layer in the functional layer, but also between the anode and the hole injection layer, allows for an even better low driving voltage for the EL element. Furthermore, improving the hole injection efficiency reduces the burden on the EL element during driving thereof, thereby promising an increase in the operating lifetime of the EL element.

2. Confirmation of Stability of the Schottky Ohmic Contact

As described above, when the thickness of the hole injection layer composed of tungsten oxide according to an aspect of the present invention is 2 nm or greater, a stable Schottky ohmic contact forms between the hole injection layer and the anode. This has also been confirmed based on characteristics of the EL element.

First, using the above-described hole-only devices HOD-a, the degree to which the hole injection efficiency from the anode to the hole injection layer is dependent on film thickness was assessed for the hole injection layer according to an aspect of the present invention.

The hole injection layer in the hole-only device HOD-a was formed under the above hole forming conditions a (Table 4), with a thickness in a range between 5 nm and 30 nm. For comparison, an element in which the hole injection layer was omitted, i.e. an element in which the anode and the buffer layer were directly laminated together, was also manufactured (hereinafter referred to as a "film thickness of 0 nm"). The structure of other layers was the same as in the section "Conditions for Forming the Tungsten Oxide Film".

Except for the element with a film thickness of 0 nm, the hole injection layer was formed under film forming conditions a in all of the hole-only devices HOD-a. Therefore, the hole injection efficiency from the hole injection layer to the buffer layer is assumed to be equivalent in all of the elements. Furthermore, the structures were identical except for the thickness of the hole injection layer. Accordingly, the main factors influencing the characteristics of the hole-only devices HOD-a are expected to be the thickness of the hole injection layer and the extent of formation of the Schottky ohmic contact between the anode and the hole injection layer.

First, the influence of the electric resistance of the hole injection layer might be considered. The resistance of the hole injection layer increases in proportion to the thickness of the hole injection layer. The resistivity of the hole injection layer under film forming conditions a, however, is $1/100$ or less that of the buffer layer and the light-emitting layer, was as confirmed by a separate experiment. Therefore, differences in resistance due to differences in the thickness of the hole injection layer make nearly no contribution to the characteristics of the hole-only devices HOD-a.

Accordingly, except for the element with the film thickness of 0 nm, the hole-only devices HOD-a should all have approximately the same characteristics as long as a stable Schottky ohmic contact is formed between the anode and the hole injection layer.

Hole-only devices HOD-a manufactured to have a hole injection layer with respective thicknesses of 0 nm, 5 nm, and 30 nm were connected to a direct current power supply, and voltage was applied thereto. Furthermore, by changing the applied voltage, an electric current value per unit surface area (current density) was calculated for different voltages. Hereinafter, the expression "driving voltage" refers to the voltage applied when the current density value is 10 mA/cm$^2$.

Table 5 shows the driving voltage for each of the hole-only devices HOD-a.

TABLE 5

| Thickness of Hole Injection Layer [nm] | Driving Voltage [V] |
|---|---|
| 0 | 30.0 |
| 5 | 20.1 |
| 30 | 20.2 |

The driving voltage for the element with a film thickness of 0 nm is quite high. This is considered to be because a large hole injection barrier forms between the anode and the buffer layer, due to the absence of the hole injection layer according to an aspect of the present invention. On the other hand, in the elements with a film thickness of 5 nm and 30 nm, the driving voltage is kept low. Furthermore, the driving voltage is nearly equal for both elements, thus clearly not depending on film thickness. Based on this table, it can be concluded that when the thickness of the hole injection layer is at least 5 nm, a nearly constant Schottky ohmic contact forms between the anode and the hole injection layer according to an aspect of the present invention, thereby achieving excellent hole injection efficiency from the anode to the hole injection layer.

Next, the degree to which the hole injection efficiency from the anode to the hole injection layer is dependent on film thickness was assessed for the hole injection layer according to an aspect of the present invention in the organic EL elements BPD-a as well. The thickness of the hole injection layer was in a range between 2 nm and 30 nm.

Since the structure of the organic EL elements BPD-a was the same except for the thickness of the hole injection layer, the elements should all have approximately the same characteristics as long as a stable Schottky ohmic contact is formed between the anode and the hole injection layer.

Organic EL elements BPD-a manufactured to have a hole injection layer with respective thicknesses of 2 nm, 5 nm, 15 nm, 20 nm, and 30 nm were connected to a direct current power supply, and voltage was applied thereto. Furthermore, by changing the applied voltage, an electric current value per unit surface area (current density) was calculated for different voltages. Hereinafter, the expression "driving voltage" refers to the voltage applied when the current density value is 10 mA/cm$^2$.

Table 6 shows the driving voltage for each of the organic EL elements BPD-a.

TABLE 6

| Thickness of Hole Injection Layer [nm] | Driving Voltage [V] |
|---|---|
| 2 | 8.6 |
| 5 | 8.4 |
| 15 | 8.7 |
| 20 | 8.7 |
| 30 | 8.4 |

Each of the driving voltages is a good, low value. Taking into consideration variations in the thickness of each layer that naturally occur during manufacturing of the elements, these driving voltages can be concluded not to depend on the thickness of the layers and to be sufficiently equivalent. Therefore, as with the hole-only devices HOD-a, it can be assumed that a nearly constant Schottky ohmic contact forms between the anode and the hole injection layer according to an aspect of the present invention in the organic EL elements BPD-a as well when the thickness of the hole injection layer is 2 nm or greater.

Next, the relationship between the thickness of the hole injection layer according to an aspect of the present invention and the operating lifetime of the EL element was assessed using organic EL elements BPD-a. The organic EL elements BPD-a were manufactured with the same structure as in Table 6, with the thickness of the hole injection layer being in a range between 2 nm and 30 nm. For comparison, an element with a film thickness of 0 nm, i.e. an element without a hole injection layer, was also manufactured.

Since the structure of the EL elements was the same except for the thickness of the hole injection layer, the elements are expected to have approximately the same lifetime as long as a stable Schottky ohmic contact is formed between the anode and the hole injection layer.

EL elements respectively manufactured to have hole injection layers with a thickness of 0 nm, 2 nm, 5 nm, and 30 nm were connected to a direct current power supply and were driven at a constant current with a current density of 10 mA/cm$^2$. Changes in the luminance of the emitted light in accordance with driving time were measured.

For each element, Table 7 shows the time from the start of driving for the luminance to decrease to 60%.

TABLE 7

| | Thickness of Hole Injection Layer [nm] | | | |
|---|---|---|---|---|
| | 0 | 2 | 5 | 30 |
| Time for Decrease in Luminance | 100 | 150 | 150 | 170 |

From this table, it is clear that the luminance of the element with a film thickness of 0 nm decreases quickly, i.e. that the lifetime is short. This is considered to be because a large hole injection barrier forms between the anode and the buffer layer, due to the absence of the hole injection layer according to an aspect of the present invention. It thus becomes necessary to apply a high driving voltage in order to maintain constant current, increasing the burden on the element and thereby greatly affecting the lifetime.

On the other hand, in the elements with a film thickness of 2 nm, 5 nm, and 30 nm, the decrease in luminance is lower than the element with a film thickness of 0 nm, i.e. the lifetime is longer. This is considered to be because the hole injection layer according to an aspect of the present invention effectively reduces the hole injection barrier, thereby reducing the necessary driving voltage and lessening the burden on the elements.

The results were good for the elements with respective film thicknesses of 2 nm, 5 nm, 30 nm, which all had an approximately equivalent decrease in luminance. Accordingly, it can be inferred that if the thickness of the hole injection layer is 2 nm or greater, a nearly constant Schottky ohmic contact forms between the anode and the hole injection layer according to an aspect of the present invention, and therefore that any element with a hole injection layer that is at least 2 nm thick will have an equivalent driving voltage and an equivalent lifetime.

The above experiments confirm, based on characteristics of the EL element, that when the thickness of the hole injection layer composed of tungsten oxide according to an aspect of the present invention is 2 nm or greater, a stable Schottky ohmic contact forms between the hole injection layer and the anode.

In another experiment, the inventors confirmed that cleaning the anode when manufacturing the elements in Table 1 and FIGS. 6, 7, 9, and 10 led to formation of Schottky ohmic contact between the anode and the hole injection layer, regardless of the film forming conditions for the hole injection layer. This cleaning consisted of performing argon ion sputtering on the surface of the ITO anode before formation of the hole injection layer.

Like the method used in FIG. 17, repeating the cycle of forming the hole injection layer, under the above film forming conditions, on an ITO anode treated as above and performing UPS measurement confirmed the existence of a spectral protrusion near the Fermi surface for hole injection layers having a thickness within approximately 2 nm, regardless of the film forming condition, and confirmed the formation of Schottky ohmic contact with the anode. As the film thickness increased, however, the presence of a spectral protrusion near the Fermi surface depended on the film forming conditions, as in FIG. 13.

This is assumed to be because oxygen vacancies form on the surface of the ITO anode due to argon ion sputtering, making it easier for oxygen atoms in the tungsten oxide to be pulled towards the ITO anode immediately after the start of formation of the hole injection layer. This results in the formation of numerous structures similar to an oxygen vacancy in the hole injection layer only near the interface. The Schottky ohmic contact according to an aspect of the present invention thus forms between the ITO anode and the hole injection layer.

Once the thickness of the hole injection layer reaches several nanometers immediately after the start of formation of the hole injection layer, the layer proceeds to form uniformly with the properties determined by the film forming conditions. Therefore, the characteristics of the elements in Table 1 and in FIGS. 6, 7, 9, and 10, in which the hole injection layer has a thickness of 30 nm, depend on the film forming conditions.

[2] Experiments on Hole Conduction Efficiency in the Hole Injection Layer and Analysis of Results As described above, the hole injection layer 40 (FIGS. 1C and 1D) in the organic EL display panel 110 of the present embodiment has a nanocrystal structure. This structure allows for an increase in the paths in the hole injection layer 40 for conduction of holes injected from the anode 20 to the hole injection layer 40, thereby reducing the driving voltage of the organic EL display panel 110.

The inventors discovered that forming the tungsten oxide that constitutes the hole injection layer 40 under predetermined film forming conditions allows for the nanocrystal structure to be caused to exist on purpose in the hole injection layer 40. First, details on these predetermined film forming conditions are described below.

The hole injection layer 40 was formed using a DC magnetron sputtering device, with metal tungsten as the sputtering target. The substrate temperature was not controlled. Use of a reactive sputtering method in which the sputtering gas is argon gas, the reactive gas is oxygen gas, and equivalent amount of each gas are released, is considered to be desirable for film formation. Note that the method of forming the hole injection layer 40 is not limited to these conditions. Well-known methods other than sputtering may be used for film formation, such as the vapor deposition method or CVD.

In order to form the hole injection layer 40 composed of tungsten oxide having a nanocrystal structure, the atoms and clusters that hit the substrate need to reach the substrate with a kinetic energy low enough so as not to damage the orderly structure already formed on the substrate and to be able to bond together in an orderly manner while moving along substrate. It is therefore desirable to use as low a film forming rate as possible.

Based on the results of experiments described below, the inventors determined that the following are film forming conditions that achieve the above low film forming rate when using the reactive sputtering method. (4) The total pressure of the sputtering gas composed of argon gas and oxygen gas should be at least 2.3 Pa and at most 7.0 Pa. (5) The partial pressure of the oxygen gas with respect to the total pressure of the sputtering gas should be at least 50% and at most 70%. (6) The input power (input power density) per unit area of the target should be at least 1.5 W/cm$^2$ and at most 6.0 W/cm$^2$. (7) The value yielded by dividing the total pressure of the sputtering gas by the input power density should be larger than 0.7 Pa·cm$^2$/W. The inventors confirmed that these conditions yielded the hole injection layer 40, composed of tungsten oxide having a nanocrystal structure, with the advantageous effect of reducing the driving voltage of the organic EL display panel 110.

With respect to condition (4), note that while the upper limit of the total pressure in the experiment described below is 4.7 Pa, the inventors confirmed separately that a similar trend is exhibited at least up to 7.0 Pa.

Furthermore, with respect to condition (5), while the partial pressure of the oxygen gas with respect to the total pressure is set to 50%, the inventors confirmed the reduction in driving voltage at least in the range between 50% and 70%.

A further explanation of condition (7) is now provided. When the amounts of argon gas and oxygen gas that are released are equivalent, it is assumed that film properties are determined by the input power density and the total pressure. The input power density in (6) changes both the number and kinetic energy of tungsten atoms and tungsten clusters released from the target by sputtering. In other words, lowering the input power density reduces the number of tungsten atoms released from the sputtering target and also lowers the kinetic energy. As a result, less tungsten reaches the substrate, arriving with a low kinetic energy. Hence, lowering the input power density should allow for film formation at a low film forming rate. Furthermore, the total pressure in (4) changes the mean free path of the tungsten atoms and tungsten clusters released from the sputtering target. In other words, if the total pressure is high, the tungsten atoms and tungsten clusters have a higher probability of repeatedly colliding with the gas in the chamber before reaching the substrate. The directions of arrival of the tungsten atoms and tungsten clusters thus become scattered, and kinetic energy is lost due to the collisions. As a result, less tungsten reaches the substrate, arriving with a low kinetic energy. Hence, raising the total pressure should allow for film formation at a low film forming rate.

It is considered, however, that there are limits to changing the film forming rate by independently controlling the input power density and the total pressure. Accordingly, the value yielded by dividing the total pressure by the input power density was adopted as a new parameter determining the film forming rate. This new parameter constitutes film forming condition (7).

For the above reasons, it is considered desirable that the film forming conditions for forming the nanocrystal structure of the present embodiment satisfy the above conditions (4) through (7). The upper limit for the parameter in condition (7) is 3.13 Pa·cm$^2$/W in the range of the experiment described below. Is considered acceptable for this value to be smaller than 3.2 Pa·cm$^2$/W. For even more reliable film formation, a value of 3.1 Pa·cm$^2$/W or less is desirable. Based on the above analysis of the film forming rate and the nanocrystal structure, however, a lower film forming rate is considered more desirable, and therefore restrictions are not necessarily placed on the upper limit. Film forming condition (7) was determined based on the above considerations.

The inventors confirmed in a separate experiment that for higher values of the above parameter, the film forming rate is lower, whereas for lower values of the above parameter, the film forming rate is higher.

Next, the inventors confirmed the validity of the above film forming conditions through experiments.

First, hole-only devices 1B were manufactured as assessment devices in order to assess the degree to which the hole conduction efficiency of the hole injection layer 40 depends on film forming conditions. The hole-only devices 1B that were actually manufactured had a structure similar to the structure illustrated in FIG. 5.

Hole-only devices 1B were manufactured with a hole injection layer 4 formed under five different film forming conditions A through E shown in Table 8. Hereinafter, the hole-only device 1B formed under film forming conditions A is referred to as HOD-A, the hole-only device 1B formed under film forming conditions B is referred to as HOD-B, the hole-only device 1B formed under film forming conditions C is referred to as HOD-C, the hole-only device 1B formed under film forming conditions D is referred to as HOD-D, and the hole-only device 1B formed under film forming conditions E is referred to as HOD-E.

The only difference between film forming conditions A shown in Table 8 and film forming conditions a shown in Table 4 is a slight difference in total pressure; otherwise, these conditions are the same.

TABLE 8

| Film Forming Conditions | Total Pressure (Pa) | Oxygen Partial Pressure (%) | Input Power Density (W/cm$^2$) | Total Pressure/ Power Density (Pa · cm$^2$/W) |
| --- | --- | --- | --- | --- |
| A | 4.70 | 50 | 1.50 | 3.13 |
| B | 4.70 | 50 | 3.00 | 1.57 |
| C | 4.70 | 50 | 6.00 | 0.78 |
| D | 2.35 | 50 | 1.50 | 1.57 |
| E | 2.35 | 50 | 6.00 | 0.39 |

The completed hole-only devices 1B were then connected to a direct current power supply, and voltage was applied thereto. Furthermore, by changing the applied voltage, an electric current value per unit surface area (current density) was calculated for different voltages.

Figure 29:
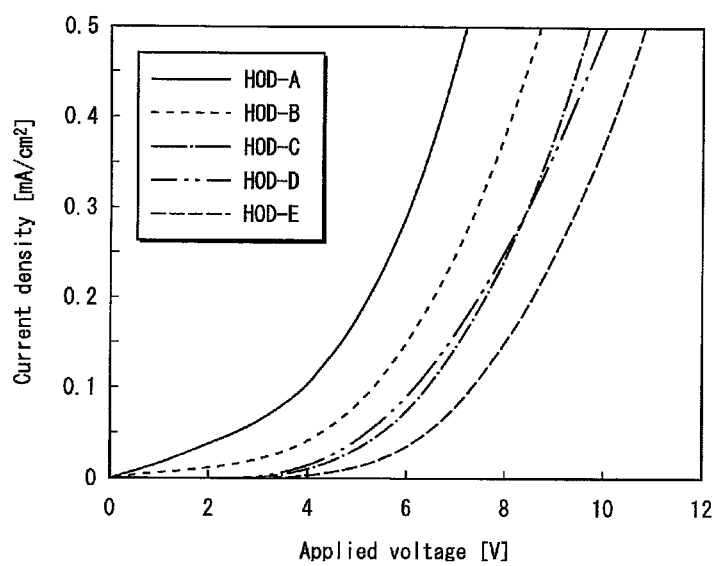
FIG. 29 is a device characteristics diagram showing relation curves illustrating relations between applied voltage and current density of the hole-only devices.

FIG. 29 is a diagram illustrating the relationship between the voltage applied to the hole-only devices 1B and the current density. In FIG. 29, the vertical axis indicates current density (mA/cm$^2$), whereas the horizontal axis indicates applied voltage (V).

Table 9 shows the driving voltage for each of the hole-only devices 1B. Note that the expression "driving voltage" refers to the voltage applied when the current density value is 0.3 mA/cm$^2$.

Since the structure of each hole-only device 1B other than the hole injection layer 4 is the same, the hole injection barrier between adjacent layers, excluding the hole injection layer 4, as well as the hole conduction efficiency of each layer, again excluding the hole injection layer 4, is assumed to be constant for the elements. Based on this fact, it is inferred that for lower driving voltages, the hole conduction efficiency of the hole injection layer 40 will be higher (the reason for this is analyzed later).

TABLE 9

| Name of Sample | Driving Voltage (V) |
| --- | --- |
| HOD-A | 6.25 |
| HOD-B | 7.50 |
| HOD-C | 8.50 |
| HOD-D | 8.50 |
| HOD-E | 9.49 |

As shown in Table 9 and FIG. 29, the current density-applied voltage curve rises the slowest for the HOD-E, which has the highest driving voltage among the elements. Accordingly, it is inferred that HOD-A, B, C, and D have superior hole conduction efficiency as compared to HOD-E, which is manufactured under the film forming conditions with a low total pressure and the maximum input power density.

Thus far, tests on the hole conduction efficiency for the hole injection layer 4 in the hole-only devices 1B have been described. In an organic EL element within the light-emitting cell in an organic EL display panel according to an aspect of the present invention, the dependence on film forming conditions of the hole conduction efficiency of the hole injection layer is essentially the same as the hole-only devices 1B. To confirm this point, the inventors manufactured organic EL elements 1 as assessment devices. The manufactured organic EL elements 1 have the same structure as the structure illustrated in FIG. 8.

Hereinafter, the organic EL element 1 formed under film forming conditions A is referred to as BPD-A, the organic EL element 1 formed under film forming conditions B is referred to as BPD-B, the organic EL element 1 formed under film forming conditions C is referred to as BPD-C, the organic EL element 1 formed under film forming conditions D is referred to as BPD-D, and the organic EL element 1 formed under film forming conditions E is referred to as BPD-E.

The organic EL elements 1 prepared under film forming conditions A through E were then connected to a direct current power supply, and voltage was applied thereto. Furthermore, by changing the applied voltage, an electric current value per unit surface area (current density) was calculated for different voltages.

Figure 30:
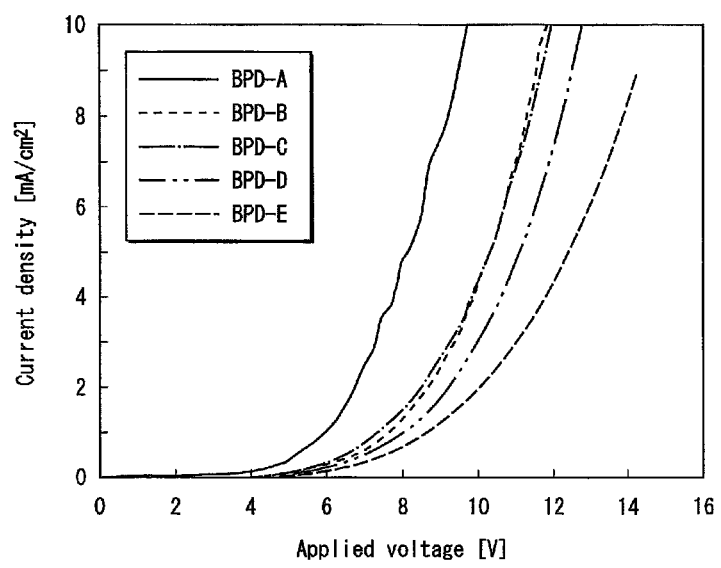
FIG. 30 is a device characteristics diagram showing relation curves illustrating relations between applied voltage and current density of organic EL elements.

FIG. 30 is a diagram illustrating the relationship between the voltage applied to the organic EL elements 1 and the current density. In FIG. 30, the vertical axis indicates current density (mA/cm$^2$), whereas the horizontal axis indicates applied voltage (V).

Table 10 shows the driving voltage for each of the organic EL elements 1. Note that the expression "driving voltage" refers to the voltage applied when the current density value is 8 mA/cm$^2$.

TABLE 10

| Name of Sample | Driving Voltage (V) |
| --- | --- |
| BPD-A | 9.25 |
| BPD-B | 11.25 |
| BPD-C | 11.50 |
| BPD-D | 12.25 |
| BPD-E | 14.00 |

As shown in Table 10 and FIG. 30, the current density-applied voltage curve rises the slowest for the BDP-E, which has the highest driving voltage among the elements. This trend is similar to the trend observed in the hole-only devices HOD-A through HOD-E, which were prepared under the same respective film forming conditions.

From the above results, it was confirmed that in the organic EL elements 1 as well, the hole conduction efficiency of the hole injection layer 4 depends on the film forming conditions, similar to the case of the hole-only devices 1B. Specifically, it is inferred that in the organic EL elements 1 as well, forming the film within the range of the film forming conditions A, B, C, and D yields an excellent hole conduction efficiency for the hole injection layer 4, thereby achieving a low driving voltage.

Note that among the above conditions, the condition concerning input power is represented in terms of input power density, as indicated in Table 8. When using a DC magnetron sputtering device that is different from the one used in the present experiment, a hole injection layer composed of tungsten oxide with an excellent hole conduction efficiency, as in the present experiment, can be yielded by adjusting the input power so that the input power density fulfills the above condition. Conditions on total pressure and oxygen partial pressure, on the other hand, are independent of the device.

Additionally, as already explained above, no intentional adjustment of the substrate temperature was performed while forming the hole injection layer 4 by applying the reactive sputtering method, and during the experiment, the sputtering device was placed under room temperature. Therefore, the substrate was at room temperature at least before the forming of the hole injection layer 4. However, while the hole injection layer 4 was being formed, there is a possibility that the substrate temperature may have risen by several tens of degrees Celsius.

Note that through a separate experiment, the inventors confirmed that when the oxygen partial pressure is raised too high, the driving voltage conversely ends up rising. Accordingly, it is desirable for the oxygen partial pressure to be between 50% and 70%.

The above experiment results indicate that for a low driving voltage, an organic EL element provided with a hole injection layer manufactured under film forming conditions A, B, C, and D is desirable, and that an organic EL element manufactured under film forming conditions A and B is even more desirable. Hereinafter, an organic EL display panel with a light-emitting cell that is an organic EL element provided with a hole injection layer manufactured under film forming conditions A, B, C, or D is the target of the present disclosure.

Chemical State of Tungsten in the Hole Injection Layer

Tungsten atoms with a valence of five exist in the tungsten oxide layer constituting the hole injection layer 40 of the present embodiment. These tungsten atoms with a valence of five are formed by adjusting the film forming conditions as shown in the above experiments. Details are provided below.

In order to confirm the chemical state of the tungsten oxide layer formed under the above film forming conditions A through E, a hard X-ray photoelectron spectroscopy measurement (hereinafter simply referred to as "HXPS measurement") experiment was performed. Typically, the optical spectrum yielded by hard X-ray photoelectron spectroscopy (hereinafter simply referred to as "HXPS spectrum") reveals information for up to a film thickness of a few dozen nanometers in the object being measured. In other words, bulk information on the film is obtained, and the measurement depth is determined by the angle between the normal line to the surface and the direction in which the photoelectron is detected. In the present experiment, this angle was adjusted to be 40° to allow for observation of the valence state in the entire direction of thickness of the tungsten oxide layer.

The conditions under which the HXPS measurement was conducted are as follows. Note that no charge-up occurred during measurement.

HXPS Measurement Conditions
BL47XU beamline of SPring-8 was used.
Light source: synchrotron radiation (energy of 8 keV)
Bias: None
Electron emission angle: Angle of 40° with normal line to the substrate
Interval between measurement points: 0.05 eV Samples for HXPS measurement were manufactured under the film forming conditions A through E shown in Table 8. A tungsten oxide layer (considered to be the hole injection layer 40) was formed to a thickness of 30 nm by the above reactive sputtering method on an ITO substrate formed on glass. The result was taken as the sample for HXPS measurement. The samples for HXPS measurement manufactured under the film forming conditions A, B, C, D, and E are hereinafter respectively referred to as sample A, sample B, sample C, sample D, and sample E.

HXPS measurement was performed on the hole injection layer 40 in each of the samples A through E. FIG. 31 is a diagram illustrating the resulting spectra. The origin of the horizontal axis, which represents binding energy, corresponds to the Fermi level of the ITO substrate, and the left direction with respect to the origin is positive. The vertical axis represents photoelectron intensity.

Three peaks can be observed in the binding energy regions shown in FIG. 31. From left to right in FIG. 31, the peaks belong to the following energy levels of tungsten: $5p_{3/2}$ ($W5p_{3/2}$), $4f_{5/2}$ ($W4f_{5/2}$), and $4f_{7/2}$ ($W4f_{7/2}$).

Next, peak fitting analysis was performed on the peaks belonging to $W5p_{3/2}$, $W4f_{5/2}$, and $W4f_{7/2}$, in the spectrum of each sample, using XPSPEAK 4.1, which is software for photoelectron spectroscopy analysis. First, based on the photoionization cross-section for the hard X-ray energy, the area intensity ratio of each component corresponding to $W4f_{7/2}$, $W4f_{5/2}$, and $W5p_{3/2}$ was fixed as follows: $W4f_{7/2}$:$W4f_{5/2}$:$W5p_{3/2}$=4:3:10.5. Next, as shown in Table 11, the position of the peak top of the $W4f_{7/2}$ component with a valence of six ($W^{6+}4f_{7/2}$) was aligned with a binding energy of 35.7 eV. The location of the peak top and the initial value of the full width at half maximum were set within the range shown in Table 11 for the component belonging to the surface photoelectrons of $W5p_{3/2}$, $W4f_{5/2}$, $W4f_{7/2}$, the component belonging to the valence of six, and the component belonging to the valence of five. In the Gaussian-Lorentzian mixed function used for fitting of the components, the initial value of the ratio in the Lorentzian function was also set within the range indicated in Table 11. Furthermore, the initial value of the area intensity of each component was set freely while maintaining the above intensity ratio. Optimization calculations were performed a maximum of 100 times by varying the area intensity for each component while maintaining the above intensity ratio, and by varying the peak location, the full width at half maximum, and the ratio in the Lorentzian function for each component within the ranges indicated in Table 11. These calculations yielded the final peak fitting analysis results.

TABLE 11

| Corresponding peak | $W5p_{3/2}$ | | | $W4f_{5/2}$ | | | $W4f_{7/2}$ | | |
|---|---|---|---|---|---|---|---|---|---|
| | $W^{sur}5p_{3/2}$ | $W^{6+}5p_{3/2}$ | $W^{5+}5p_{3/2}$ | $W^{sur}4f_{5/2}$ | $W^{6+}4f_{5/2}$ | $W^{5+}4f_{5/2}$ | $W^{sur}4f_{7/2}$ | $W^{6+}4f_{7/2}$ | $W^{5+}4f_{7/2}$ |
| Peak Energy (eV) | 42.30 to 43.07 | 41.20 to 41.30 | 39.70 to 38.65 | 38.75 to 39.13 | 37.80 to 37.85 | 36.72 to 36.95 | 36.60 to 36.90 | 35.70 (reference) | 34.60 to 34.80 |
| Value of full width at half maximum (eV) | 1.73 to 2.40 | 1.93 to 2.24 | 1.8 to 2.86 | 1.40 to 1.60 | 0.87 to 0.98 | 0.90 to 1.50 | 1.40 to 1.60 | 0.87 to 0.98 | 0.90 to 1.50 |
| Lorentzian function ratio (%) | 0 | 13 to 40 | 0 to 25 | 0 to 57 | 0 to 6 | 0 to 20 | 0 to 57 | 0 to 6 | 0 to 20 |

Figure 32A:
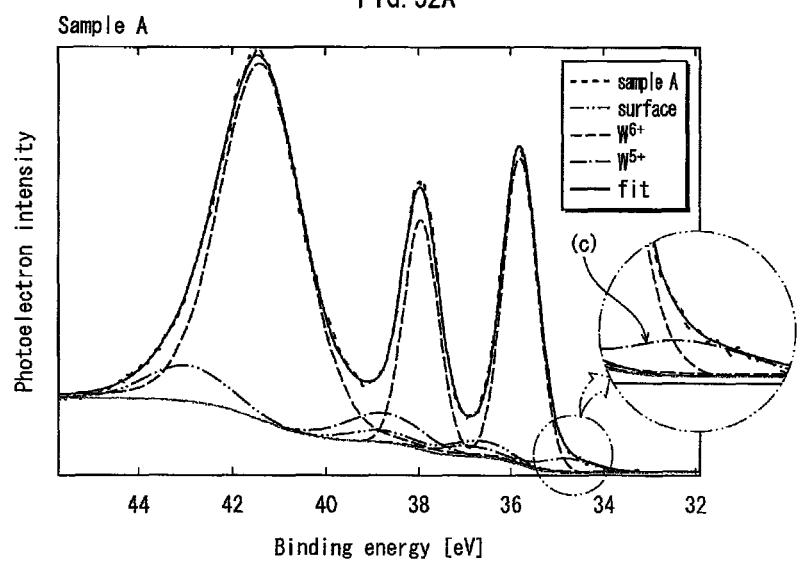
FIG. 32A shows peak fitting analysis results for sample A in FIG. 9.
Figure 32B:
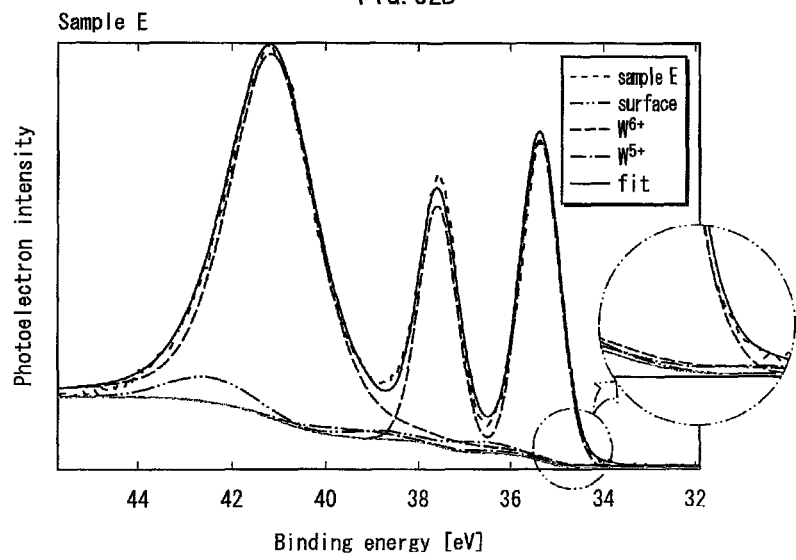
FIG. 32B shows peak fitting analysis results for sample E.

FIGS. 32A and 32B show the final peak fitting analysis results. FIG. 32A shows the analysis results for sample A, and FIG. 32B shows the analysis results for sample E.

In both FIGS. 32A and 32B, the dashed lines (sample A, sample E) are actual measured spectra (corresponding to the spectra in FIG. 31), the lines with alternate long and two short dashes (surface) are the component belonging to the surface photoelectrons $W^{sur}5p_{3/2}$, $W^{sur}4f_{5/2}$, $W^{sur}4f_{7/2}$), the dotted lines ($W^{6+}$) are the component belonging to the valence of six ($W^{6+}5p_{3/2}$, $W^{6+}4f_{5/2}$, $W^{6+}4f_{7/2}$), and the alternating long and short dashed lines ($W^{5+}$) are the component belonging to the valence of five ($W^{5+}5p_{3/2}$, $W^{5+}4f_{5/2}$, $W^{5+}4f_{7/2}$). The solid lines (fit) are the spectra yielded by summing the components indicated by the lines with alternate long and two short dashes and the alternating long and short dashed lines.

The spectra for the dashed lines and the solid lines in FIGS. 32A and 32B match extremely well. In other words, the peaks belonging to the energy levels of $W5p_{3/2}$, $W4f_{5/2}$, and $W4f_{7/2}$ can all be described well by the sum of the component (surface) belonging to the photoelectrons from the surface of the hole injection layer 40 and the component ($W^{6+}$) belonging to a valence of six, as well as the component ($W^{5+}$) belonging to a valence of five, included within the hole injection layer 40.

Furthermore, in the binding energy region that is between 0.3 eV and 1.8 eV lower than the component belonging to a valence of six ($W^{6+}$) in sample A of FIG. 32A, the existence of a corresponding component belonging to a valence of five ($W^{5+}$) can be confirmed. By contrast, in sample E of FIG. 32B, no such component belonging to a valence of five can be confirmed. For the purposes of illustration, the circled region in each of FIGS. 32A and 32B is shown enlarged to the right. As seen in the enlarged diagrams, a ridge in the alternating long and short dashed line for $W^{5+}$ (labeled (c) in FIG. 32A) can be clearly observed for sample A, but no such ridge can be observed for sample E. Furthermore, looking more closely at the enlarged diagrams, the solid line (fit), which is the sum of the components resulting from peak fitting, exhibits a large "shift" in sample A with respect to the dotted line ($W^{6+}$), which corresponds only to the component with a valence of six. In sample E, however, the "shift" is not as large as in sample A. In other words, the "shift" in sample A can be inferred as suggestive of the existence of tungsten atoms with a valence of five.

Next, the ratio of tungsten atoms with a valence of five to tungsten atoms with a valence of six, i.e. $W^{5+}/W^{6+}$, was calculated for samples A through E. This ratio was calculated by dividing the area intensity of the component belonging to a valence of five by the area intensity of the component belonging to a valence of six in the peak fitting analysis results for each sample.

Note that the area intensity ratio of the component belonging to a valence of five to the component belonging to a valence of six should be the same for $W5p_{3/2}$, $W4f_{5/2}$, and $W4f_{7/2}$ based on the principle of measurement. In the present experiment, it was confirmed that these values are indeed the same. Therefore, the following analysis only refers to $W4f_{7/2}$.

Table 12 shows the ratio $W^{5+}/W^{6+}$ in $W4f_{7/2}$ for samples A through E.

TABLE 12

| Name of Sample | $W^{5+}/W^{6+}$ |
|---|---|
| Sample A | 7.4% |
| Sample B | 6.1% |
| Sample C | 3.2% |
| Sample D | 3.2% |
| Sample E | 1.8% |

Based on the values of $W^{5+}/W^{6+}$ shown in Table 12, the sample with the largest ratio of tungsten atoms with a valence of five in the hole injection layer 40 is sample A. The ratio then tends to decrease in the order of sample B, sample C, and sample D, with sample E having the lowest ratio. Comparing the results from Table 10 and Table 12, it is clear that as the ratio of tungsten atoms with a valence of five in the hole injection layer 40 increases, the driving voltage of the organic EL elements tends to be lower.

Using the above HXPS measurement to calculate the composition ratio of tungsten to oxygen, it was confirmed that the ratio of the number of tungsten atoms to the number of oxygen atoms in the hole injection layer 40 was nearly 1:3 on average throughout the layer in all of the samples A through E. Based on this ratio, it can be assumed that in all of the samples A through E, nearly the entire hole injection layer 40 has a basic structure with atomic coordinates based on tungsten trioxide. Note that the inventors performed X-ray absorption fine structure (XAFS) measurement with respect to the hole injection layer 40 of each of the samples A through E and confirmed that the above-mentioned basic structure is formed therein.

Electronic State of the Hole Injection Layer 40

The hole injection layer 40 composed of tungsten oxide in the present embodiment has an occupied energy level near the Fermi surface. Due to the action of the occupied energy level, the interface energy level is aligned between the hole injection layer 40 and the buffer layer 60, thereby reducing the hole injection barrier between the hole injection layer 40 and the buffer layer 60. As a result, the organic EL element of the present embodiment can be driven at a low voltage.

As described below, this occupied energy level near the Fermi surface exists not only at the above interface, but also throughout the hole injection layer 40 at the grain boundaries of the nanocrystals, thus serving as a conduction path for holes. This provides the hole injection layer 40 with an excellent hole conduction efficiency, so that the organic EL display panel of the present embodiment can be driven at a lower voltage.

An experiment to confirm the existence of the occupied energy level near the Fermi surface was performed using UPS measurement on the hole injection layer 40 in each of the above samples A through E.

The forming of the hole injection layer 40 of each of the samples was performed inside a sputtering device. Then, to prevent atmospheric exposure, the samples A through E were transported to a glovebox which was connected to the sputtering device and which was filled with nitrogen gas. Subsequently, the samples were sealed inside transfer vessels in the glovebox, and were mounted on a photoelectron spectroscopy device. After formation, the hole injection layer 40 was therefore not exposed to the atmosphere before UPS measurement was performed.

The conditions under which the UPS measurement was conducted are as follows. Note that charge-up did not occur during measurement.

Figure 33:
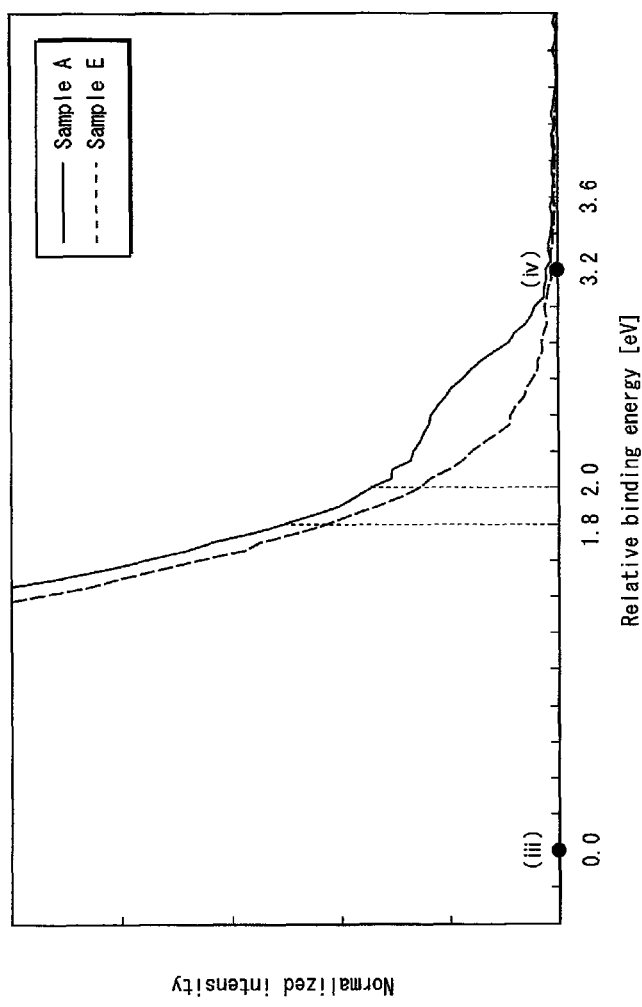
FIG. 33 is a diagram illustrating UPS spectra of a tungsten oxide layer.

Light source: He I line
Bias: None
Electron emission angle: Direction of normal line to the substrate
Interval between measurement points: 0.05 eV FIG. 33 is a diagram illustrating a UPS spectrum of the hole injection layer 40 in samples A and E within area y. In FIG. 33, labels such as area y and point (iii) are as described with reference to FIGS. 12 and 13, and the horizontal axis represents relative binding energy with point (iii) as the origin.

As illustrated in FIG. 33, the spectral protrusion near the Fermi surface described with reference to FIG. 13 was confirmed in the hole injection layer 40 of the sample A in an area between a point which is 3.6 eV lower in binding energy than point (iii) and a point which is 1.8 eV lower in binding energy than point (iii), point (iii) being the location at which the valence band rises. On the other hand, this sort of spectral protrusion was not confirmed in sample E. Note that in samples B, C, and D as well, the above spectral protrusion was confirmed with a shape differing little from sample A in terms of normalized intensity.

UPS measurement, however, is only an assessment of the surface layer. Upon attempting to confirm the existence of the spectral protrusion near the Fermi surface throughout the entire hole injection layer 40 by performing HXPS measurement on the hole injection layer 4 in samples A and E, the spectral protrusion was confirmed in sample A, as expected, but not in sample E.

The above experiment proved that the hole injection layer 40 formed under film forming conditions A through D has an occupied energy level near the Fermi surface. Therefore, when a tungsten oxide layer having an upward protrusion (not necessarily a peak) in an area which is approximately between 1.8 eV and 3.6 eV lower in terms of binding energy than point (iii) in the photoelectron spectrum, i.e. a tungsten oxide layer having an occupied energy level near the Fermi surface, is adopted as the hole injection layer, an organic EL display panel having a hole injection layer formed under any of film forming conditions A through D exhibits excellent hole conduction efficiency.

Here, the characteristics of the hole-only devices 1B and the organic EL elements 1 of the present embodiment described thus far are thought to be affected more by the hole conduction efficiency in the hole injection layer 4 than by the hole injection efficiency from the anode 2 to the hole injection layer 4 and the hole injection efficiency from the hole injection layer 4 to the buffer layer 6A. The reasons are as follows.

In the hole injection layer 4 formed under all of the film forming conditions A, B, C, and D, the spectral protrusion near the Fermi surface was confirmed by UPS measurement, as described above. In terms of FIG. 18, this means that these hole injection layers 4 all have a number density sufficient for injection sites x to be confirmed by UPS measurement. Furthermore, the shape of the spectral protrusion and the normalized intensity did not differ greatly between hole injection layers 4 under conditions A, B, C, and D. Accordingly, the number density of the injection sites x can be assumed to be equivalent in each of the hole injection layers 4 under conditions A, B, C, and D. Considering how film forming condition A is equivalent to the above film forming condition a, the hole injection layers 4 under conditions A, B, C, and D can all be assumed to have a sufficient number density of injection sites x with respect to the number density of injection sites y in the buffer layer 6A. In other words, the hole injection layers 4 under conditions A, B, C, and D are all considered to have equivalent hole injection efficiency from the hole injection layer 4 to the buffer layer 6A.

Furthermore, since the hole injection layer under any of film forming conditions A through D has an equivalent spectral protrusion near the Fermi surface, the above-described Schottky ohmic contact forms between the anode 2 and the hole injection layer 4. Accordingly, the hole injection layers 4 under conditions A, B, C, and D are all considered to have equivalent hole injection efficiency from the anode 2 to the hole injection layer 4 as well.

The driving voltages of HOD-A, B, C, and D in Table 9 are all good; however, they represent a spread of 2.25 V. Therefore, a factor other than the hole injection efficiency from the hole injection layer 4 to the buffer layer 6A and from the anode 2 to the hole injection layer 4 must affect the spread. The remaining factor affecting the spread can be assumed to be the hole conduction efficiency of the hole injection layer 4 itself.

Since no spectral protrusion near the Fermi surface of the hole injection layer 4 under film forming condition E was confirmed, the driving voltage of the elements under film forming condition E is assumed to be affected by both the hole conduction efficiency of the hole injection layer 4 and by the hole injection barrier between the hole injection layer 4 and the buffer layer 6A, as well as between the anode 2 and the hole injection layer 4. However, based on the valence of tungsten and on the relationship between the nanocrystal structure and hole conduction, as described below, the hole conduction efficiency of the hole injection layer 4 under film forming condition E can easily be inferred to be extremely low.

Figure 34:
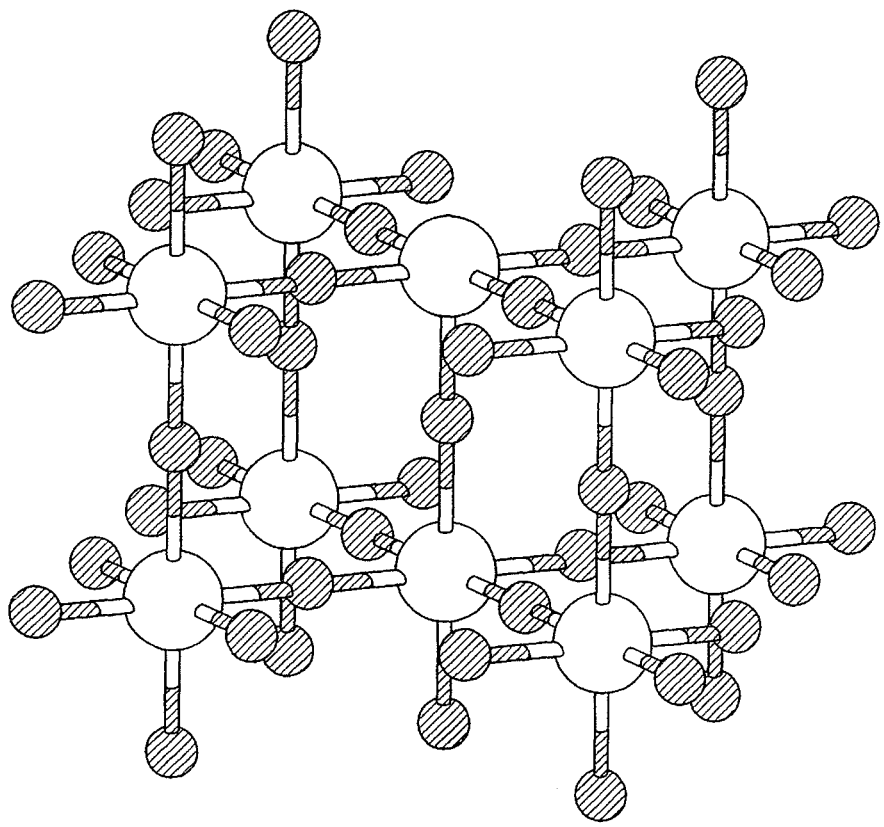
FIG. 34 is a diagram illustrating the crystal structure of tungsten trioxide.

Analysis of Relationship Between Value of $W^{5+}/W^{6+}$ and Hole Conduction Efficiency FIG. 34 is a diagram illustrating the tungsten oxide crystal structure. In the tungsten oxide of the present embodiment, as described above, the composition ratio of tungsten to oxygen is nearly 1:3. Therefore, tungsten trioxide is described here as an example.

As shown in FIG. 34, a tungsten trioxide crystal is a structure in which six oxygen atoms and one tungsten atom bind in octahedral coordination, with octahedrons sharing oxygen atoms at vertices. (To simplify the illustration, FIG. 34 shows octahedrons in perfect alignment, like rhenium trioxide. In reality, the octahedrons are in a slightly distorted arrangement). These tungsten atoms that are bound to six oxygen atoms in octahedral coordination are tungsten atoms with a valence of six. On the other hand, tungsten atoms with a lower valence than six correspond to structures in which the octahedral coordination has somehow become disrupted. A typical example is when one of the six oxygen atoms escapes, forming an oxygen vacancy. In this case, the tungsten atom bonded with the remaining five oxygen atoms has a valence of five.

Typically, when an oxygen vacancy exists in a metal oxide, an electron left behind by the oxygen atom that has escaped is provided to a metal atom near the vacancy in order to maintain electric neutrality. The valence of the metal atom thus lowers. An electron is thus provided in this way to the tungsten atom with a valence of five. This electron is assumed to combine with the electron that was used to bond with the oxygen atom that escaped, thus forming a lone pair of electrons.

Based on the above analysis, the mechanism for hole conduction in the hole injection layer 40 of the present embodiment that has tungsten atoms with a valence of five is, for example, as follows.

A tungsten atom with a valence of five can supply a hole with an electron from its own lone pair of electrons. Accordingly, if tungsten atoms with a valence of five exist within a certain distance from each other, a hole can hop between the lone pair of electrons of tungsten atoms with a valence of five due to the voltage applied to the hole injection layer. Furthermore, if the tungsten atoms with a valence of five are nearly adjacent, the overlap between 5d orbitals corresponding to the lone pairs of electrons grows large, so that holes can move easily without hopping.

In other words, in the present embodiment, holes are thought to be conducted between the tungsten atoms with a valence of five that exist in the hole injection layer 40.

Based on the above inference, if the value of $W^{5+}/W^{6+}$ is high, i.e. if the proportion of tungsten atoms with a valence of five is high in the hole injection layer, as in sample A, tungsten atoms with a valence of five are more likely to be close or adjacent, thus facilitating hole conduction at a low voltage. This provides the organic EL element with excellent hole conduction efficiency.

Note that in samples C, and D, while the value of $W^{5+}/W^{6+}$ is not as high as in sample A, a value of approximately 3.2% provided the element with a good, low driving voltage. It is therefore considered sufficient for the value of $W^{5+}/W^{6+}$ to be approximately 3.2% or greater.

Microstructure of Tungsten Oxide in the Hole Injection Layer 40

A nanocrystal structure exists in the tungsten oxide layer constituting the hole injection layer 40 of the present embodiment. This nanocrystal structure is formed by adjusting the film forming conditions. Details are provided below.

In order to confirm the existence of the nanocrystal structure in the hole injection layer 40 under each of the film forming conditions A through E in Table 8, a transmission electron microscope (TEM) measurement experiment was performed.

The hole injection layers 40 in the samples for TEM measurement were formed with a DC magnetron sputtering device. Specifically, a tungsten oxide layer (considered to be the hole injection layer 40) was formed to a thickness of 30 nm by the above reactive sputtering method on an ITO substrate formed on glass.

Hereinafter, the TEM measurement samples manufactured under film forming conditions A, B, C, D, and E are referred to as samples A, B, C, D, and E.

Typically, TEM measurement is performed on a surface by selecting a thin sample. In the present embodiment, a cross-section of the hole injection layer 40 was designated as the target for measurement. A cross-section was manufactured by using a focused ion beam (FIB) device to process the sample, and the thickness of the laminate was adjusted to approximately 50 nm. The conditions for FIB processing and TEM measurement are as follows.

Figure 35:
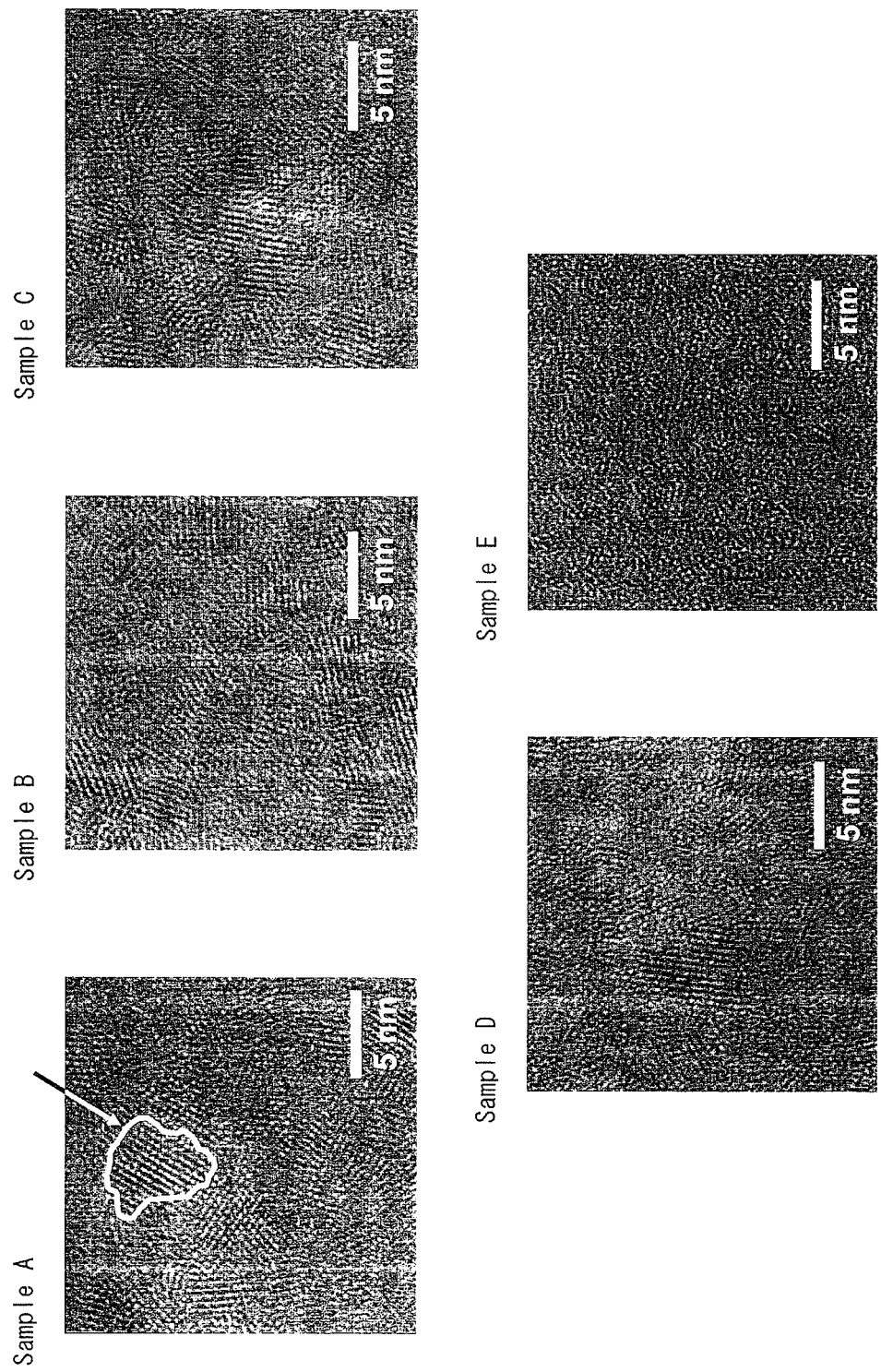
FIG. 35 shows cross-sectional TEM photographs of the tungsten oxide layer.

Conditions for FIB Processing
  Device used: Quanta200 (manufactured by FEI Company)
  Accelerating voltage: 30 kV (final voltage: 5 kV)
  Laminate thickness: approximately 50 nm
  Conditions for TEM Measurement
  Device used: Topcon EM-002B (manufactured by Topcon Technohouse Corporation)
  Measurement method: high-resolution electron microscopy
  Accelerating voltage: 200 kV FIG. 35 is a diagram illustrating a TEM measurement photograph of a cross-section of the hole injection layer 40 in samples A through E. The magnification ratio in each photograph is as indicated by the scale bar shown in each photograph. The photographs are shown with 256 gradations from the darkest to the brightest region.

In each TEM photograph for samples A, B, C, and D, regular linear structures can be observed based on how bright regions are partially aligned in the same direction. As indicated by the scale bar, the linear structures occur with an interval approximately between 1.85 angstroms and 5.55 angstroms. On the other hand, the bright regions are scattered irregularly in sample E, with no regular linear structures being observable.

Typically, in a TEM photograph, regions with the above linear structures represent one microscopic crystal. In the TEM pictures in FIG. 35, the size of these crystals can be seen to be approximately between 5 and 10 nm. Therefore, the absence or presence of the above linear structure can be interpreted as follows: whereas the nanocrystal structure can be confirmed in the tungsten oxide of samples A, B, C, and D, the nanocrystal structure cannot be confirmed in sample E, which is thought to have an amorphous structure nearly throughout the sample.

In the TEM photograph of sample A in FIG. 35, one of the nanocrystals, chosen arbitrarily, is outlined with a white line. Note that this outline is not precise, but rather is meant to be an example. This is because the TEM photograph shows not only the uppermost surface in the cross-section, but also the conditions lower in the layer, thus making it difficult to precisely identify the outline. The size of the outlined nanocrystal appears to be approximately five nm.

FIG. 36 shows the results of a 2D Fourier transform on the TEM measurement photographs in FIG. 35 (hereinafter referred to as 2D Fourier transform images). The 2D Fourier transform images are a distribution of the wavelengths in the reciprocal space of the TEM measurement photographs in FIG. 35 and therefore indicate the periodicity of the TEM measurement photographs. The 2D Fourier transform images in FIG. 36 were created by performing a Fourier transform on the TEM photographs of FIG. 35 using LAview Version #1.77, which is image processing software.

In the 2D Fourier transform images for samples A, B, C, and D, bright regions formed by two or three concentric circles centering on the center point (Γ point) can be seen relatively clearly. On the other hand, in sample E, such a bright region formed by concentric circles is not clear.

The lack of clarity of the bright region formed by concentric circles indicates the loss of order in the TEM photograph of FIG. 35. In other words, the hole injection layer 40 in samples A, B, C, and D, in which the bright region formed by concentric circles is clear, indicates a relatively high level of regularity and orderliness in the layer, whereas the hole injection layer 40 in sample E has a low level of regularity and orderliness.

Figure 37B:
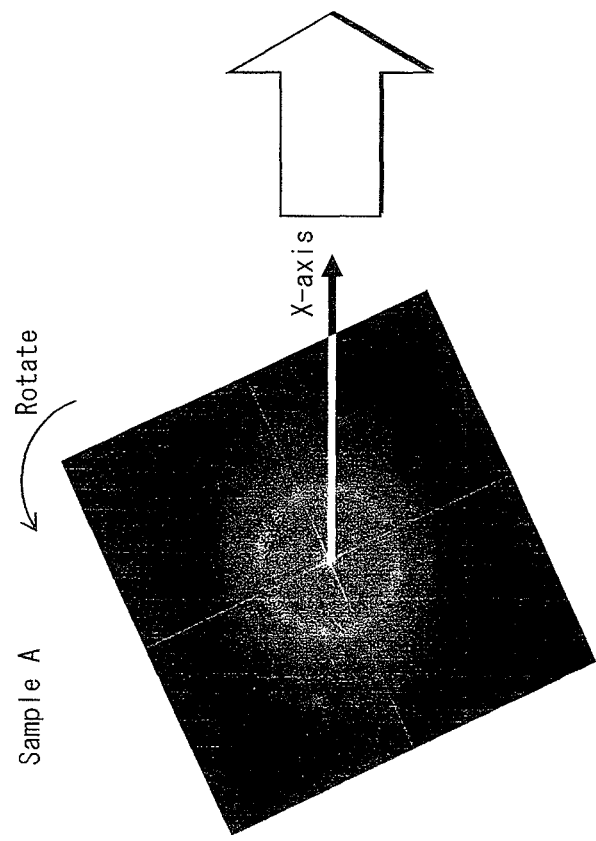
FIGS. 37A and 37B are diagrams illustrating the creation of a plot of change in luminance from the 2D Fourier transform image shown in FIG. 36.
Figure 37A:
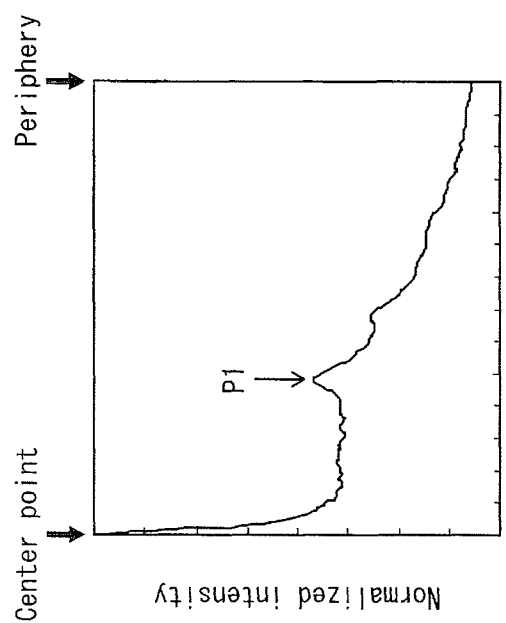

To clearly express this orderliness, graphs showing the change in luminance vs. the distance from the center of the image were created for each 2D Fourier transform image in FIG. 36. FIGS. 37A and 37B show an outline of the method of creating the graphs, using sample A as an example.

As illustrated in FIG. 37A, a 2D Fourier transform image was rotated 1° at a time from 0° to 359°, with the center point is the center of rotation. Upon every degree of rotation, the luminance versus the distance from the center point along the X-axis was measured. Measurement results for each degree of rotation were then summed up and divided by 360, yielding the average luminance versus the distance from the center point (hereinafter referred to as normalized luminance). FIG. 37B shows a plot with distance from the center point along the horizontal axis and normalized luminance for each distance along the vertical axis. Microsoft Office Picture Manager was used to rotate the 2D Fourier transform images, and the image processing software ImageNos was used to measure the distance from the center point and the luminance. Hereinafter, the plot showing the relationship between the distance from the center point and the normalized luminance at each distance, as created with the method described in FIGS. 37A and 37B, is referred to as a "plot of change in luminance".

FIGS. 38 and 39 illustrate the plots of change in luminance for samples A through E. Apart from a high luminance region at the center point, each of the samples exhibited a peak as indicated by the arrows. Hereinafter, the peak indicated by the arrow nearest the center point in the plot of change in luminance is referred to as a "peak P1".

FIGS. 38 and 39 show that as compared to the peak P1 in sample E, the peak P1 in samples A, B, C, and D is a pointed, convex shape. The sharpness of the peak P1 in each sample was quantified for comparison. FIGS. 40A and 40B show an outline of the method of assessment, using samples A and E as examples.

FIGS. 40A and 40B are plots of change in luminance for samples A and E respectively. In FIGS. 40A and 40B, (a1) and (b1) are enlarged diagrams of each peak P1 and the surrounding region. The "L" in the figures represents the "peak width L of the peak P1" and is used as an index of how "pointed" the peak P1 is.

In order to more accurately determine this "peak width L of the peak P1", the first derivative of the plot of change in luminance in (a1) and (b1) is shown in (a2) and (b2) in FIGS. 40A and 40B. In (a2) and (b2) in FIGS. 40A and 40B, the peak width L is the difference between the value along the horizontal axis corresponding to the peak top of the peak P1 and the value along the horizontal axis, in the direction of the center point from the peak, corresponding to the position at which the derivative first becomes zero.

Table 13 shows the values of the peak width L in samples A through E, with the value along the horizontal axis corresponding to the peak top of the peak P1 normalized as 100.

TABLE 13

| Name of Sample | Peak Width L |
| --- | --- |
| Sample A | 16.7 |
| Sample B | 18.1 |
| Sample C | 21.3 |
| Sample D | 21.9 |
| Sample E | 37.6 |

As shown in Table 13, the peak width L is smallest for sample A and increases in the order of samples B, C, and D, with sample E having the largest value. The peak width for samples C and D is not as small as for sample A. However, even with a value of 21.9, the organic EL element having a hole injection layer under film forming conditions C and D achieves good hole conduction efficiency, as described above.

The value of the peak width L in Table 13 indicates the clarity of the bright region formed by the concentric circle closest to the center point in the 2D Fourier transform images of FIG. 36. As the value of the peak width L is smaller, the extent of the region formed by the concentric circles is also smaller. Accordingly, the TEM photograph in FIG. 35 before the 2D Fourier transform exhibits a greater level of regularity and orderliness. This is considered to correspond to how the proportion of the area occupied by the nanocrystal structure in the TEM photograph is larger. Conversely, as the value of the peak width L is larger, the extent of the region formed by the concentric circles is also larger. Accordingly, the TEM photograph in FIG. 35 before the 2D Fourier transform exhibits a lower level of regularity and orderliness. This is considered to correspond to how the proportion of the area occupied by the nanocrystal structure in the TEM photograph is smaller.

Analysis of Relationship Between Nanocrystal Structure and Hole Conduction Efficiency The experiments in the present embodiment have revealed the following. A hole injection layer with good hole conduction efficiency has an occupied energy level near the Fermi surface throughout the entire layer, and the proportion of tungsten atoms with a valence of five is high. Furthermore, the hole injection layer has a nanocrystal structure, and the layer is regular and orderly. Conversely, in a hole injection layer with poor hole conduction efficiency, no occupied energy level near the Fermi surface could be confirmed throughout the entire layer, and the proportion of tungsten atoms with a valence of five is extremely low. No nanocrystal structure could be confirmed in the hole injection layer, and the structure of the layer was neither regular nor orderly. The relationship between these experimental results is analyzed below.

First, the relationship between the nanocrystal structure (the regularity of the film structure) and the tungsten atoms with a valence of five is examined.

As described above; in the hole injection layer formed under each film forming condition in the present embodiment, the composition ratio of tungsten to oxygen is nearly 1:3. Accordingly, the nanocrystal structure that provides the layer structure with regularity as observed in the hole injection layers under film forming conditions A, B, C, and D is assumed to be a microcrystal structure of tungsten trioxide.

Typically, when an oxygen vacancy occurs within a nanoscale microcrystal, the region over which the oxygen vacancy exerts an influence is extremely large in relative terms, due to the small size of the microcrystal. The microcrystal thus becomes greatly distorted, making it difficult to maintain the crystal structure. Accordingly, tungsten atoms with a valence of five that derive from a structure similar to an oxygen vacancy are unlikely to be included within the nanocrystal.

This is not necessarily true, however, along the surface of the nanocrystal, nor at the grain boundaries between nanocrystals. Typically, a structure similar to an oxygen vacancy, known as a surface oxygen vacancy, easily forms on surfaces or grain boundaries where the crystal periodicity is interrupted. For example, Non-Patent Literature 5 reports that the surface of tungsten trioxide crystals is more stable when half of the tungsten atoms along the outermost surface do not terminate in oxygen atoms than when all of the tungsten atoms along the outermost surface terminate in oxygen atoms. In this way, it is considered that a large number of tungsten atoms with a valence of five that do not terminate in oxygen atoms exist along the surface and grain boundaries of the nanocrystals.

On the other hand, in the hole injection layer under film forming condition E, almost no tungsten atoms with a valence of five are present, and no nanocrystal structure was confirmed. The entire layer had an amorphous structure with little regularity. This is considered to be because while the octahedrons that represent the basic structure of tungsten trioxide share an oxygen atom at the vertices without interruption (and therefore do not become tungsten atoms with a valence of five), the arrangement of the octahedrons lacks periodicity and order.

Next, the relationship between the occupied energy level near the Fermi surface and the tungsten atoms with a valence of five is described.

It is considered that the occupied energy level near the Fermi surface derives from structures similar to an oxygen vacancy. It is also considered that tungsten atoms with a valance of five derive from structures similar to an oxygen vacancy. In other words, the occupied energy level near the Fermi surface and the tungsten atoms with a valence of five both derive from the structures similar to an oxygen vacancy.

Based on the above, it can be inferred that in a hole injection layer with good hole conduction efficiency, a large number of tungsten atoms with a valence of five exists along the surface and grain boundaries of the nanocrystals. Therefore, along the surface and at the grain boundaries, the overlap between 5d orbitals of the tungsten atoms with a valence of five grows large, so that the occupied energy level near the Fermi surface exists continuously. On the other hand, a hole injection layer with poor hole conduction efficiency is amorphous, having almost no structures similar to an oxygen vacancy nor tungsten atoms with a valence of five deriving from such structures, and thus it can be inferred that no occupied energy level near the Fermi surface exists in the layer.

Next, the mechanism for hole conduction in the hole injection layer according to an aspect of the present invention is analyzed further. The conduction of holes between tungsten atoms with a valence of five in the hole injection layer 40 has already been analyzed. Based on the correlation between the above experiment results, however, it is possible to extrapolate a more concrete image.

Figure 41A:
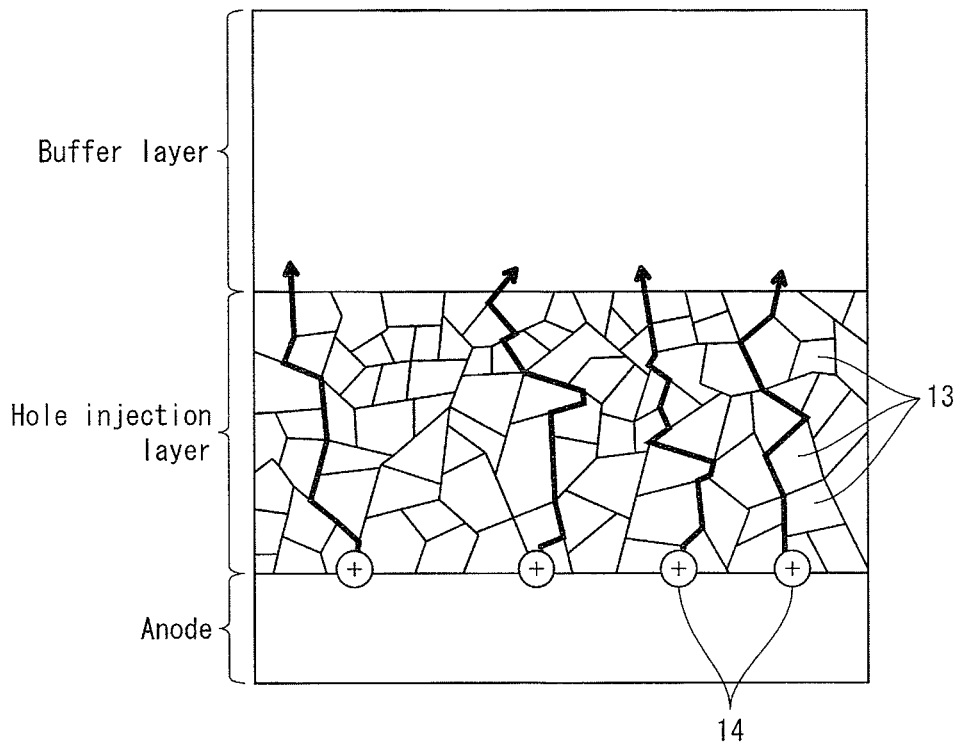
FIG. 41A is a diagram schematically illustrating hole conduction when the tungsten oxide layer is formed mainly from nanocrystal structures.
Figure 41B:
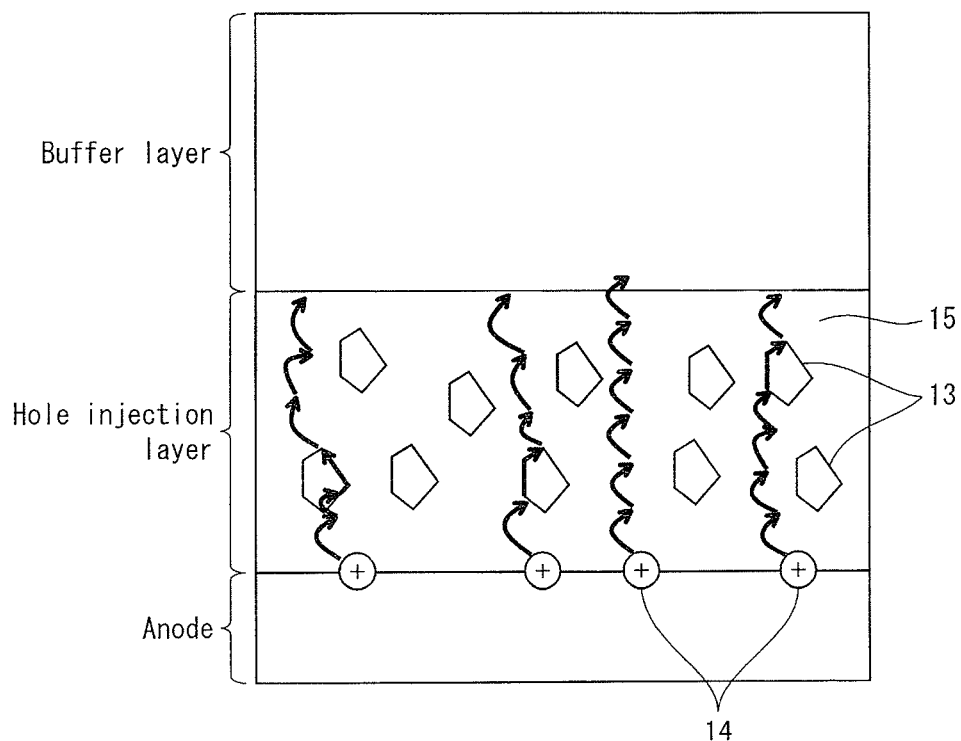
FIG. 41B is a diagram schematically illustrating hole conduction when the tungsten oxide layer is formed mainly from an amorphous structure.

First, hole conduction is described in a hole injection layer composed of tungsten oxide with a mainly amorphous structure, as in the hole injection layer formed under film forming condition E. FIG. 41B shows the conduction of holes 14 in a hole injection layer in which an amorphous structure 15 is dominant, with few (or no) nanocrystals 13 present. Tungsten atoms with a valence of five are scattered throughout the amorphous structure 15, and upon the application of voltage to the hole injection layer, holes 14 hop between tungsten atoms with a valence of five that are relatively close to each other. Receiving the force of the electrical field, the holes 14 move to the buffer layer by hopping between tungsten atoms with a valence of five that are close to each other. In other words, in the amorphous structure 15, the holes 14 move through hopping conduction.

When the number of tungsten atoms with a valence of five is extremely low, as in the hole injection layer under film forming condition E, the tungsten atoms with a valence of five are separated by a long distance. In order to hop across this long distance, an extremely high voltage needs to be applied, thus raising the driving voltage of the element.

In order to avoid this increase in voltage, the number of tungsten atoms with a valence of five, and therefore the structures similar to an oxygen vacancy, should be increased in the amorphous structure 15. It is in fact possible to manufacture an amorphous layer that includes many structures similar to an oxygen vacancy by forming the tungsten oxide through, for example, vacuum deposition under pre-determined conditions.

Such an amorphous layer with many structures similar to an oxygen vacancy, however, loses chemical stability. Furthermore, a clear discoloring occurs due to the absorption of light by the structures similar to an oxygen vacancy. Therefore, this approach is not practical for the mass production of organic EL display panels. By contrast, in the hole injection layer according to an aspect of the present invention, the composition ratio of tungsten to oxygen is nearly 1:3. Therefore, few structures similar to an oxygen vacancy are found throughout the layer, and the layer has a crystalline structure. This hole injection layer thus exhibits relatively good chemical stability and less discoloring.

Note that many tungsten atoms with a valence of five exist along the surface of the nanocrystals 13 in FIG. 41B. Therefore, occupied energy levels near the Fermi surface that allow for the exchange of holes exist along the surface of the nanocrystals 13. As a result, once the holes 14 reach the surface of the nanocrystals 13, this is the only location at which the holes 14 move easily. In order to reach the buffer layer, however, the holes 14 must traverse the amorphous structure 15, thus preventing the hole conduction efficiency from improving.

Next, hole conduction within a tungsten oxide layer having the nanocrystal structure according to an aspect of the present invention is described. FIG. 41A shows the conduction of holes 14 in a hole injection layer with little (or none) of the amorphous structure 15 and abundant nanocrystals 13. First, as described above, abundant tungsten atoms with a valence of five exist along the surface and grain boundaries of the nanocrystals 13. Therefore, an unoccupied energy level near the Fermi surface that can exchange holes is nearly continuous along the surface and grain boundaries. Furthermore, since abundant nanocrystals 13 are present in FIG. 41A, the surfaces and grain boundaries of these nanocrystals 13 are also continuous. In other words, continuous hole conduction paths exist along the continuous surfaces and grain boundaries of the nanocrystals 13, as indicated by the boldface arrows. As a result, upon applying voltage to the hole injection layer, the holes 14 are easily conducted along the occupied energy levels near the Fermi surface that extend along these continuous surfaces and grain boundaries, thus allowing the holes 14 to reach the buffer layer at a low driving voltage.

Based on the above analysis, the important factors for achieving a metal oxide layer with good hole conduction efficiency are 1) the existence of portions that can exchange holes, and 2) continuity among these portions. Accordingly, a metal oxide layer that 1) includes metal atoms at a lower valence than the maximum possible valence and that 2) has a nanocrystal structure can be considered a good structure for hole conduction.

Analysis of the Auxiliary Wiring, Schottky Ohmic Contact Between the Electron Injection Layer and the Hole Injection Layer, and Conduction of Holes and Electrons in the Hole Injection Layer Thus far, from the perspective of analyzing the anode of the hole injection layer and the organic EL element, carriers have been represented as holes, and current has been considered as flowing only from the anode to the hole injection layer. The Schottky ohmic contact between the electrode, such as the anode, and the hole injection layer according to an aspect the present invention is not limited to when current flows only from the electrode to the hole injection layer.

As described above, the occupied energy level near the Fermi surface is produced within a structure similar to an oxygen vacancy by an electron in the 5d orbital of a tungsten atom not bound with an oxygen atom. Unlike electrons in the valence band or electrons of organic molecules, these carriers can move relatively freely. In other words, the occupied energy level near the Fermi surface is a donor energy level or a metallic energy level of an n-type semiconductor in which electrons flow easily. Accordingly, electrons can be easily exchanged with the electrode in both directions ("electrons" being replaceable by "holes"). It is precisely this ease of exchange that allows for Schottky ohmic contact. With a separate experiment, the inventors confirmed that electrons flow ohmically in both directions in a double layered structure composed of the hole injection layer according to an aspect of the present invention and each of ITO, IZO, Al, and Ba.

The above Schottky ohmic contact between the electrode and the hole injection layer according to an aspect of the present invention of course also forms between the auxiliary wiring and the hole injection layer, as well as between the hole injection layer and the electron injection layer. Carriers can therefore easily be exchanged between these layers. As a result, although located between the auxiliary wiring and the electron injection layer, the hole injection layer according to an aspect of the present invention does not block the injection of electrons from the hole injection layer to the electron injection layer nor from the auxiliary wiring to the hole injection layer. With respect to this point, the hole injection layer according to an aspect of the present invention differs greatly from a hole injection layer formed, for example, from copper phthalocyanine, PEDOT, or the like, in which injection of electrons from the auxiliary wiring is difficult.

Furthermore, the hole injection layer according to an aspect of the present invention has a nanocrystal structure, and the above-described occupied energy level near the Fermi surface, which is a metallic energy level, is continuous along the surfaces and grain boundaries of the nanocrystals. Accordingly, electrons are easily conducted throughout the layer via these continuous metallic energy levels ("electrons" being replaceable by "holes"). As a result, a good hole conduction efficiency is achieved for the element in the light-emitting cell; whereas the wiring portion is maintained at a good, low resistance, despite interposition of the hole injection layer.

As compared to when the auxiliary wiring and the electron injection layer are directly connected, the resistance of the connecting portion does increase due to the hole injection layer according to an aspect of the present invention being located between the auxiliary wiring and the electron injection layer. Since the hole injection layer according to an aspect of the present invention, however, has a nanocrystal structure, the resistivity is extremely low as compared to a typical functional layer composed of an organic substance. Furthermore, the thickness of the layer is at most several dozen nanometers in a typical organic EL element. Therefore, the contribution to resistance made by the hole injection layer according to an aspect of the present invention is extremely small as compared to the resistance of the entire organic EL display panel, which includes the light-emitting cells and the wiring portions. Accordingly, the interposition of the hole injection layer according to an aspect of the present invention in the connecting portion does not cause a substantial increase in the resistance of the wiring portion. An organic EL display panel adopting the hole injection layer according to an aspect of the present invention therefore does not require a step to prevent formation of the hole injection layer on the auxiliary wiring.

In the present embodiment, the electron injection layer is layered onto the hole injection layer according to an aspect of the present invention in the connecting portion, yet the electron injection layer in the connecting portion is not absolutely necessary, and may be omitted. In this case, the hole injection layer and the common electrode are in direct Schottky ohmic contact, which again does not lead to an increase in the resistance of the wiring portion.

After forming the light-emitting layers, an electron transport layer composed mainly of organic material or inorganic material may be formed to be continuous on the light-emitting cells and the connecting portions. In this case, the hole injection layer according to an aspect of the present invention and the electron transport layer are adjacent in the connecting portions. As described above, the hole injection layer according to an aspect of the present invention has the characteristics of an n-type semiconductor or a metal due to an occupied energy level near the Fermi surface. Therefore, a so-called p-n junction does not occur at the interface with the electron transport layer, thus yielding an interface with a small energy barrier at which it is relatively easy to inject electrons to the electron transport layer from the hole injection layer according to an aspect of the present invention. With respect to this point as well, the hole injection layer according to an aspect of the present invention differs greatly from a hole injection layer formed, for example, from copper phthalocyanine, PEDOT, or the like, in which the exchange of electrons with the electron transport layer is difficult.

Note that in the organic EL display panel 110 of the present embodiment, the anode 20 (first electrode) provided on the substrate 10 and the auxiliary wiring 30 are provided in parallel with the hole injection layer 40 therebetween. Since the anode 20 and the auxiliary wiring 30 are separated by several dozen micrometers, the problem does not arise of an anode 20 and auxiliary wiring 30 with opposite polarities causing a short circuit across the hole injection layer 40.

Embodiment 2

Overall Structure of Organic EL Display Panel

Figure 42A:
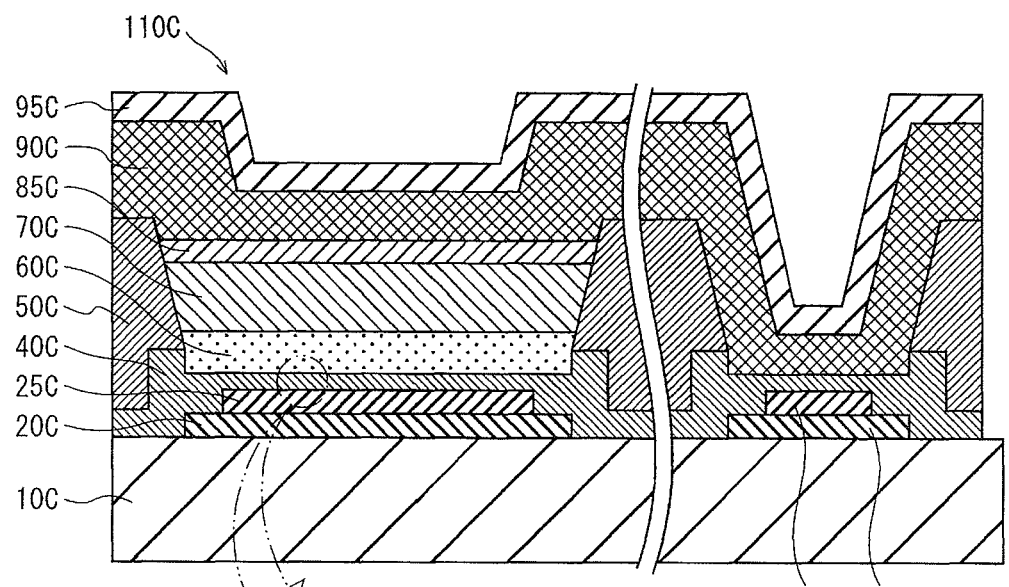
FIG. 42A is a cross-section diagram schematically showing the structure of an organic EL panel according to Embodiment 2, in FIG. 42B is a partially expanded view near the hole injection layer.
Figure 42B:
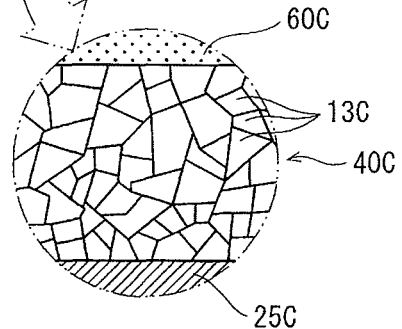

FIG. 42A is a schematic cross-sectional view illustrating the structure of an organic EL display panel 110C according to the present embodiment. FIG. 42B is a partially expanded view near a hole injection layer 40C.

The organic EL display panel 110C is an application type display panel in which the functional layer is, for example, applied by a wet process. The hole injection layer 40C and a variety of functional layers that have a variety of functions and include organic material are layered together and placed between a pair of electrodes consisting of an anode 20C and a cathode 90C.

Specifically, the organic EL display panel 110C includes a substrate 10C having the following layered on the main side thereof in the following order: anodes 20C, ITO layers 25C, the hole injection layer 40C, buffer layers 60C, light-emitting layers 70C, electron injection layers 85C, the cathode 90C, and a sealing layer 95C. Furthermore, auxiliary wirings 30C are formed respectively at a distance from the anodes 20C on the main side of the substrate 10C. The ITO layer 25C, the hole injection layer 40C, the cathode 90C, and the sealing layer 95C are also layered on each auxiliary wiring 30C. The following description focuses on the differences from the organic EL display panel 110.

Anode/Auxiliary Wiring

The anodes 20C are provided in plurality in a matrix, with one anode 20C for each pixel, whereas the auxiliary wirings 30C are provided along the anodes 20C for each row of pixels.

ITO Layer

The ITO (indium tin oxide) layer 25C is provided between each anode 20C and the hole injection layer 40C and has the function of ensuring a good bond between the layers. In the organic EL display panel 110C, the ITO layers 25C and the anodes 20C are separate, but the ITO layers 25C may be considered part of the anodes 20C.

The ITO layer 25C is also provided between the auxiliary wiring 30C and the hole injection layer 40C. In the organic EL display panel 110C, the ITO layers 25C and the auxiliary wirings 30C are separate, but the ITO layers 25C may be considered part of the auxiliary wirings 30C.

Hole Injection Layer

Like the hole injection layer 40 in Embodiment 1, the hole injection layer 40C is a tungsten oxide layer formed under predetermined film forming conditions and having a thickness of at least 2 nm (in the present example, 30 nm). As a result, in the light-emitting cell (to the left of the wavy line in FIG. 42A indicating omission), the hole injection layer 40C and the buffer layer 60C establish an interface energy level alignment, with the ITO layers 25C and the hole injection layers 40C in Schottky ohmic contact. Furthermore, in the wiring portion (to the right of the wavy line in FIG. 42A indicating omission), the ITO layers 25C and the hole injection layer 40C, as well as the hole injection layer 40C and the cathode 90C, are in Schottky ohmic contact. In greater detail, these Schottky ohmic contacts mean that the Fermi level of the ITO layer 25C and the cathode 90C differs from the lowest binding energy of the occupied energy level near the Fermi surface of the hole injection layer 40C by within ±0.3 eV at a position that is 2 nm away from the surface of the ITO layer 25C or the cathode 90C towards the hole injection layer 40C.

As a result, in the organic EL display panel 110C, the hole injection barrier between the ITO layer 25C and the hole injection layer 40C, as well as between the hole injection layer 40C and the buffer layer 60C, is moderated in the light-emitting cell as compared to a conventional structure. Furthermore, carriers are easily exchanged between the ITO layer 25C and the hole injection layer 40C, as well as between the hole injection layer 40C and the cathode 90C, in the wiring portion, thereby allowing for a good, low driving voltage.

In the composition formula WOx denoting the composition of the tungsten oxide constituting the hole injection layer 40 C, x is a real number existing within a range of approximately 2<x<3. While it is desirable for the hole injection layer 40C to be formed only from highly pure tungsten oxide, the inclusion of a slight degree of impurities is acceptable, provided that the amount does not exceed the amount of impurities that might normally be incorporated.

Note that the predetermined film forming conditions for the hole injection layer 40C are described in the section "Method of Manufacturing Organic EL Display Panel 110C". As in Embodiment 1, since the tungsten oxide layer constituting the hole injection layer 40C is formed under the predetermined conditions, the hole injection layer 40C includes tungsten oxide nanocrystals 13C as illustrated in FIG. 42B. Note that apart from the nanocrystal structure, the hole injection layer 40C may include an amorphous structure.

Electron Injection Layer/Cathode/Sealing Layer

The electron injection layer 85C has a function to inject electrons from the cathode 90C to the light-emitting layer 70C. It is desirable that the electron injection layer 85C be, for example, a 5-nm thick layer of barium, or a 1-nm thick layer of lithium fluoride, sodium fluoride, or a combination thereof.

The cathode 90C is, for example, composed of an ITO layer with a thickness of approximately 100 nm.

A direct current power supply is connected to the anodes 20C and to the auxiliary wirings 30C to supply power from an external source to the organic EL display panel 110C.

The sealing layer 95C has a function to seal the organic EL display panel 110C from being exposed to water or air. The sealing layer 95C is, for example, formed from a material such as SiN (Silicon nitride) or SiON (Silicon oxynitride). In the case of a top emission type organic EL element, it is desirable that the sealing layer 95C be formed from a light-transmissive material.

Method of Manufacturing Organic EL Display Panel 110C

The following describes an example of a method for manufacturing the entire organic EL display panel 110C, with reference to FIGS. 43A through 47C.

Figure 43A:
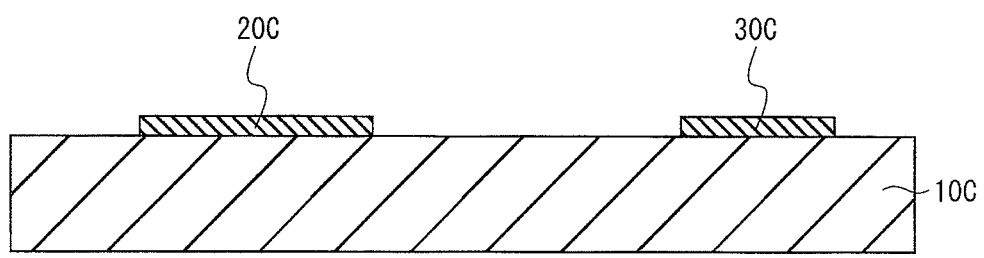
FIGS. 43A through 43C are process drawings illustrating a method of manufacturing an organic EL panel according to Embodiment 2.

First, a thin film of silver is formed by sputtering, for example, on the substrate 10C. The thin film is then patterned by, for example, photolithography to form the anodes 20C and the auxiliary wirings 30C in a matrix (FIG. 43A). Note that the thin film may be formed by another method such as vacuum deposition.

Figure 43B:
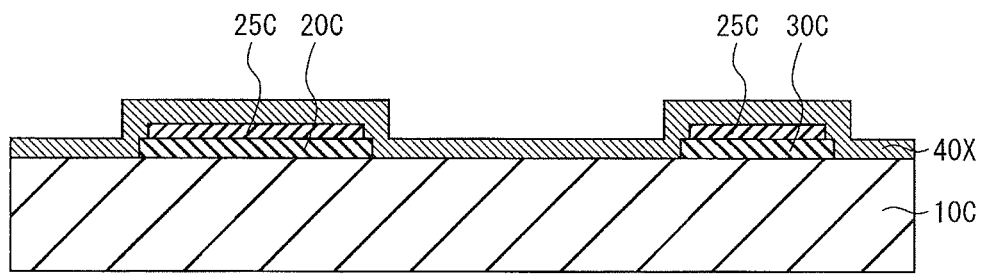

Next, an ITO thin film is formed by sputtering, for example, and is patterned by photolithography, for example, to form the ITO layer 25C on each anode 20C and auxiliary wiring 30C. A thin film 40X containing tungsten oxide is then formed under the predetermined film forming conditions described below (FIG. 43B).

Figure 43C:
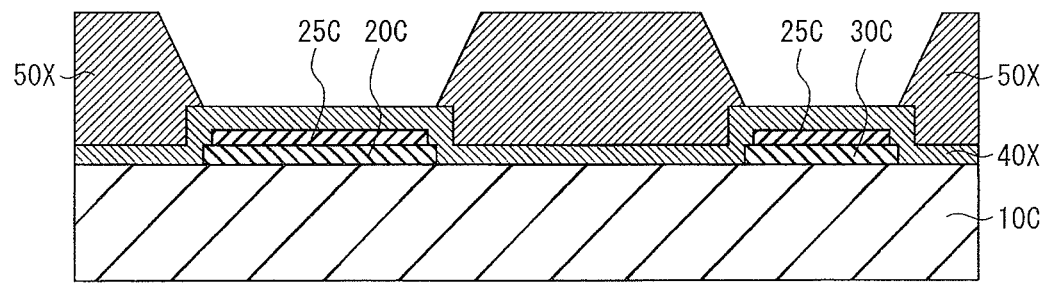

Subsequently, a bank material layer 50X is formed on the thin film 4X with bank material composed of organic material. A portion of the bank material layer 50X is removed to expose a portion of the thin film 40X (FIG. 43C). The bank material layer 50X is formed by application or by another method. The bank material layer 50X can be removed by patterning with a predetermined developer (a solution of tetramethylammonium hydroxide (TMAH) or the like).

Figure 44A:
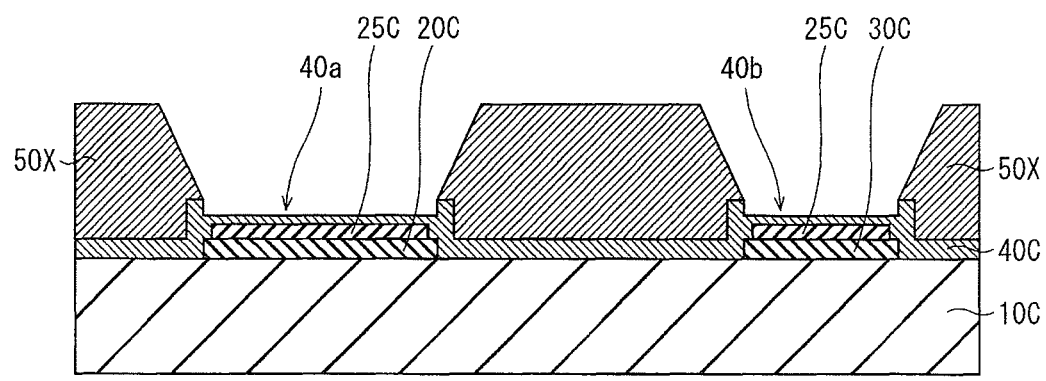
FIGS. 44A and 44B are process drawings illustrating a method of manufacturing an organic EL panel according to Embodiment 2.

While the tungsten oxide forming the thin film 4X has good chemical resistance, it has the property of slightly dissolving in TMAH solution. Therefore, washing off the bank residue remaining on the surface of the thin film 40X with the above developer causes the exposed portion of the thin film 40X to erode, leading to formation of a concave structure (FIG. 44A). As a result, the hole injection layer 40C includes a concavity 40a corresponding to the anode 20C and a concavity 40b corresponding to the auxiliary wiring 30C.

Figure 44B:
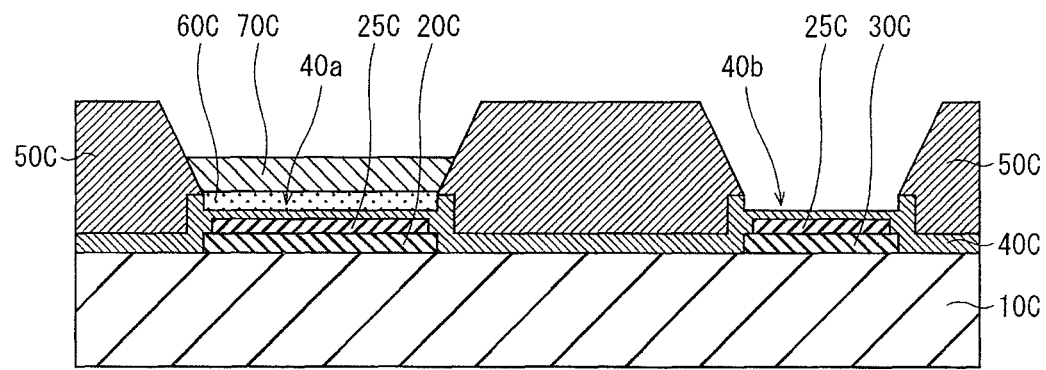

Next, repellency treatment is performed on the surface of the bank material layer 50X using fluorine plasma, for example, to form the banks 50C. Subsequently, an ink composition containing organic material is dripped, for example, using the inkjet method, into a region corresponding to the anode 20C as defined by the banks 50C. The ink is then dried, thereby forming the buffer layer 60C and the light-emitting layer 70C (FIG. 44B). The buffer layer 60C and the light-emitting layer 70C are not formed in a region corresponding to the auxiliary wiring 30C as defined by the banks 50C. Note that ink may be dripped with a different method such as the dispenser method, the nozzle coating method, the spin coating method, intaglio printing, or relief printing.

Figure 45A:
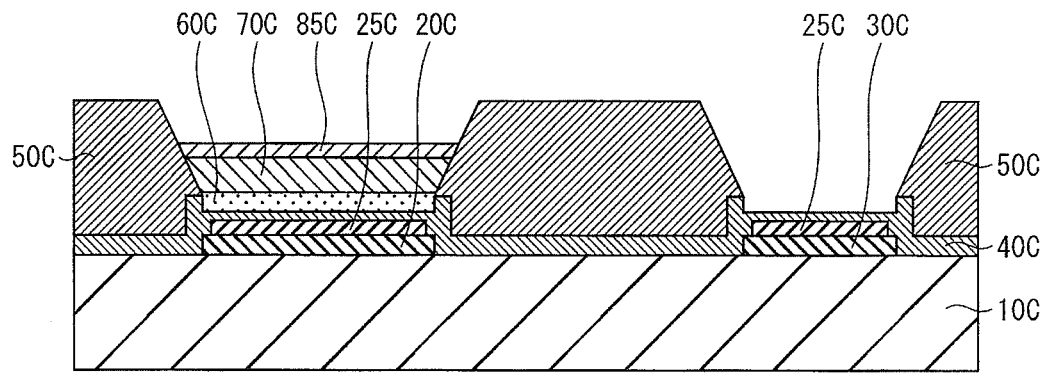
FIGS. 45A through 45C are process drawings illustrating a method of manufacturing an organic EL panel according to Embodiment 2.

Next, a thin film of barium constituting the electron injection layer 85C is formed on the light-emitting layer 70C with vacuum deposition, for example (FIG. 45A).

Figure 45B:
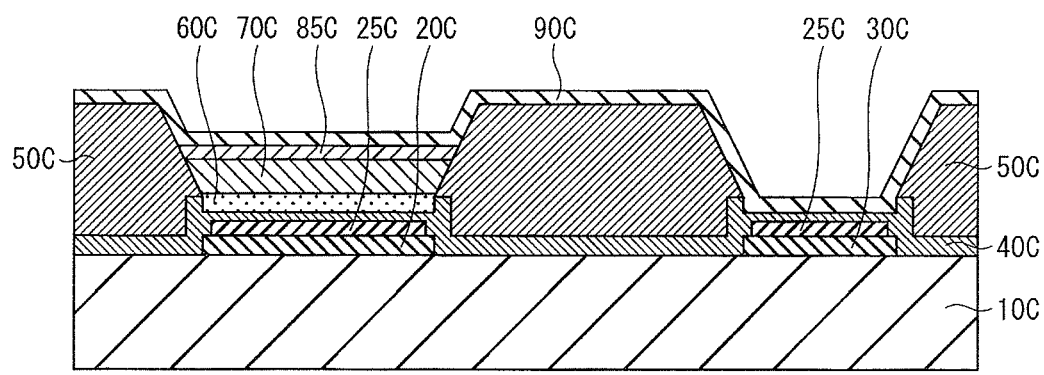

An ITO thin film constituting the cathode 90C is then formed across the entire surface by sputtering, for example (FIG. 45B).

Figure 45C:
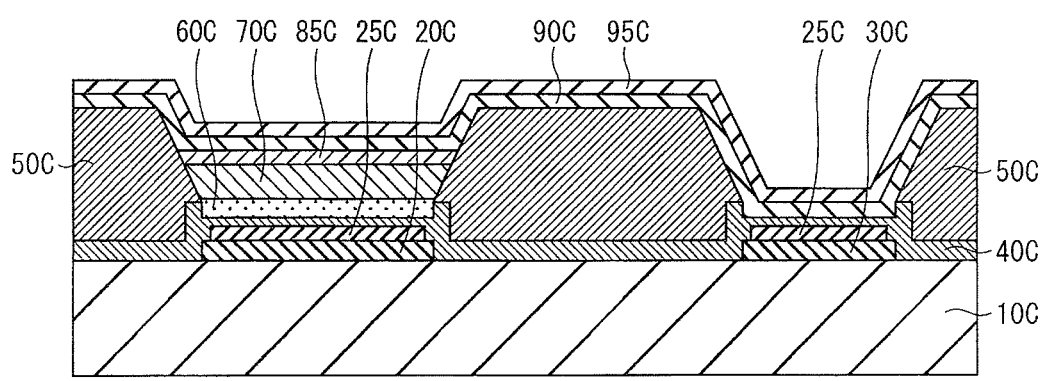

Next, on the cathode 90C, the sealing layer 95C is formed (FIG. 45C).

This completes the organic EL display panel 110C.

The following describes the film forming conditions for the hole injection layer 40C (thin film 40X). It is desirable that the hole injection layer 40C (thin film 40X) be formed with the reactive sputtering method. Specifically, metal tungsten is placed in the chamber as the sputtering target, with argon gas as the sputtering gas and oxygen gas as the reactive gas. Under these conditions, the argon is ionized by the application of high voltage and caused to bombard the sputtering target. The metal tungsten ejected as a result of the sputtering phenomenon reacts with the oxygen gas to produce tungsten oxide, thus forming the tungsten oxide layer on the ITO layer 25C.

As in Embodiment 1, desirable film forming conditions are as follows. (4) The total pressure of gas in the chamber should be at least 2.3 Pa and at most 7.0 Pa. (5) The partial pressure of the oxygen gas with respect to the total pressure should be at least 50% and at most 70%. (6) The input power (input power density) per unit area of the target should be at least 1.5 W/cm$^2$ and at most 6.0 W/cm$^2$. (7) The value yielded by dividing the total pressure by the input power density should be larger than 0.7 Pa·cm$^2$/W. The hole injection layer 40C composed of tungsten oxide having a nanocrystal structure is formed under these film forming conditions.

Another Example of Steps from Formation of Anodes and Auxiliary Wiring to Formation of Banks Next, with reference to FIGS. 46A through 47C, another example of the process from the formation of anodes and auxiliary wiring to the formation of banks is described. Note that in this process, an example of a structure for forming a planarizing layer 17C on the surface of the substrate 10C is described.

Figure 46A:
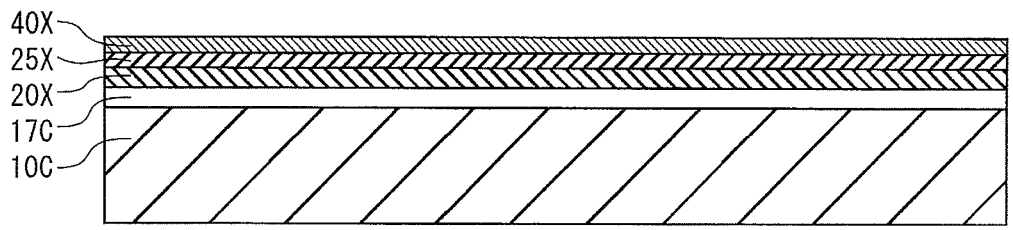
FIGS. 46A through 46D are process drawings illustrating a method of manufacturing an organic EL panel according to a modification to Embodiment 2.

First, a planarizing layer 17C is formed on the substrate 10C from an insulating resin material such as polyimide or acrylic. With the vapor deposition method, the following three layers are layered sequentially on the planarizing layer 17C: an Al alloy thin film 20X, an IZO thin film 25X, and a thin film (tungsten oxide film) 40X (FIG. 46A). ACL (aluminum-cobalt-lanthanum) material, for example, is used as the Al alloy material.

Figure 46B:
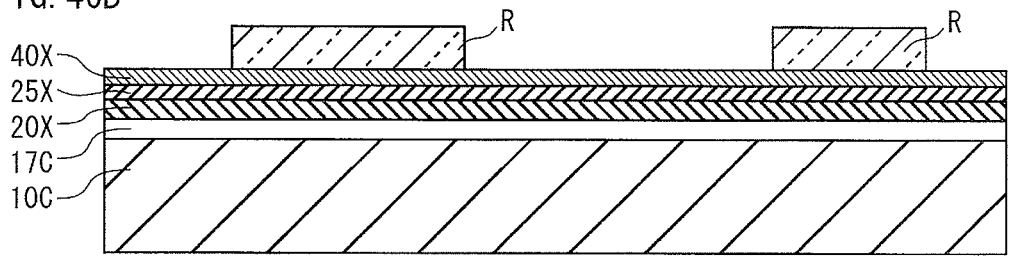

Next, a resist pattern R is formed by photolithography in the regions in which the three layers for the anode 20C, the IZO layer 25D, and the hole injection layer 40D are formed, as well as the regions in which the three layers for the auxiliary wiring 30C, the IZO layer 25D, and the hole injection layer 40D are formed (FIG. 46B).

Figure 46C:
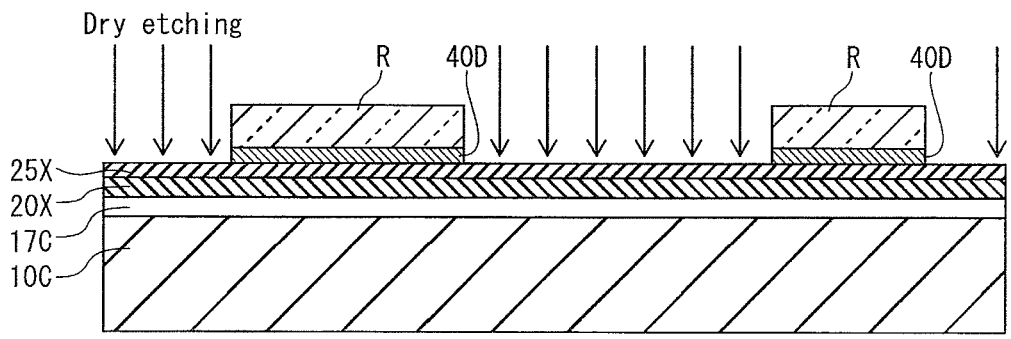

Next, patterning is performed by dry etching (D/E) of the regions of the thin film 4X not covered by the resist pattern R (FIG. 46C). During this dry etching, only the thin film 4X is selectively etched with either a mixture of fluorinated gas and $N_2$ gas, or a mixture of fluorinated gas and $O_2$ gas. The following is an example of specific setting conditions for the dry etching.

Conditions for Dry Etching
Target of treatment: tungsten oxide film
Etching gas: fluorine-containing gas ($SF_6$, $CF_4CHF_3$)
Mixed gas: $O_2$, $N_2$,
Mixed gas ratio: $CF_4:O_2=160:40$
Supplied power: Source 500 W, Bias 400 W
Pressure: between 10 mTorr and 50 mTorr
Etching temperature: room temperature Performing the above dry etching yields the hole injection layer 40D. Subsequently, ashing is performed with $O_2$ gas to facilitate removal of the resist pattern during the following wet etching (W/E) process.

Figure 46D:
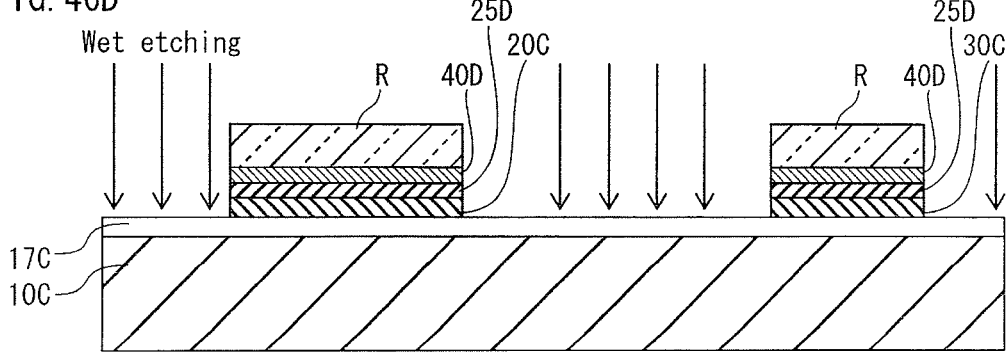

Via wet etching, the regions of the IZO thin film 25X and the Al alloy thin film 20X not covered by the resist pattern R are patterned (FIG. 46D). Using a mixed solution of containing nitric acid, phosphoric acid, acetic acid, and water as the etchant, wet etching is performed simultaneously on both the IZO thin film 25X and the Al alloy thin film 20X.

The following is an example of specific setting conditions for the wet etching.

Conditions for Wet Etching
Target of treatment: IZO thin film and Al alloy thin film
Etchant: mixed aqueous solution of nitric acid, phosphoric acid, and acetic acid
Blend ratio of solvent: not specified (mixing is possible under typical conditions)
Etching temperature: lower than room temperature Note that to perform the wet etching well, it is desirable that the IZO thin film 25X, which is the uppermost layer, be a thickness of 20 nm or less. This is because the amount of side etching grows large if the thickness exceeds 20 nm.

Instead of forming an IZO layer from an IZO thin film, an ITO layer may of course be formed from an ITO thin film.

Figure 47A:
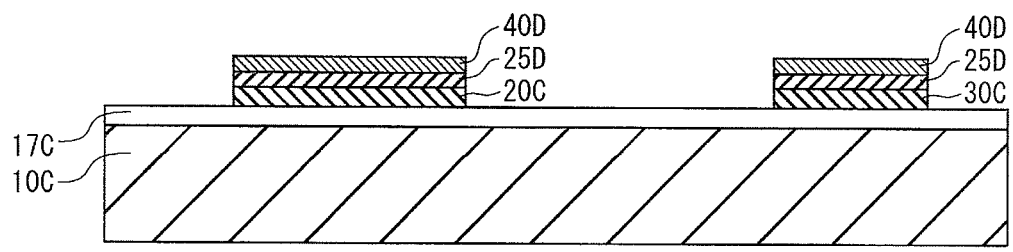
FIGS. 47A through 47C are process drawings illustrating a method of manufacturing an organic EL panel according to the modification to Embodiment 2.

The anode 20C and the IZO layer 25D, as well as the auxiliary wiring 30C and the IZO layer 25D, are formed through the above processes. Subsequently, the resist pattern R is removed through a resist removing step, yielding a patterned triple layer structure composed of the anode 20C, the IZO layer 25D, and the hole injection layer 40D and a pattern triple layer structure composed of the auxiliary wiring 30C, the IZO layer 25D, and the hole injection layer 40D (FIG. 47A). During this process, the hole injection layer 40D is formed in locations corresponding to the anode 20C and the IZO layer 25D as well as locations corresponding to the auxiliary wiring 30C and the IZO layer 25D.

Figure 47B:
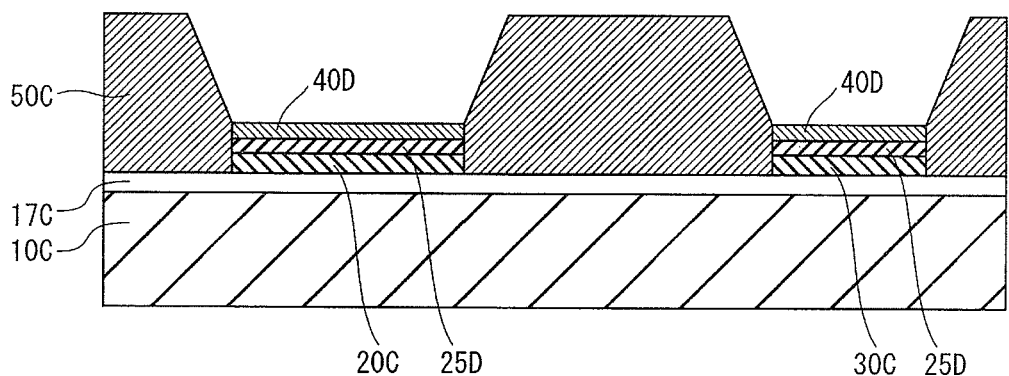

Next, the bank material layer 50X is formed on the exposed surface of the planarizing layer 17C (not shown in the figures) and is patterned to form the banks 50C (FIG. 47B).

Figure 47C:
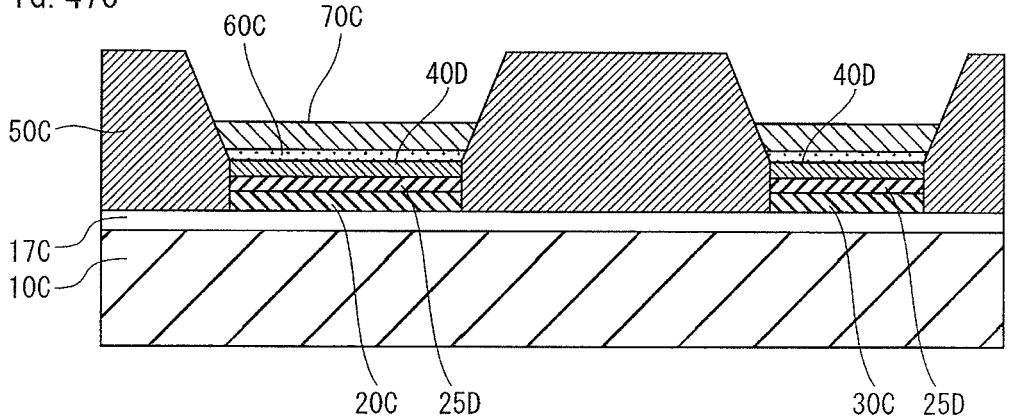

Note that with the above-described method, the buffer layers 60C and the light-emitting layers 70C can be formed by adjusting the predetermined ink, dripping the ink successively into regions partitioned by the banks 50 C, and drying the ink (FIG. 47C).

The experiments in the analysis provided for Embodiment 1 above of course hold as well for the hole injection layers 40C and 40D in Embodiment 2.

Other Considerations

While an organic EL display panel and organic EL display apparatus according to an aspect of the present invention have been concretely described, the above embodiments are merely examples for clearly illustrating the operations and advantageous effects of an aspect of the present invention. The present invention is in no way limited to the above embodiments. For example, the size and the material listed for each component are merely typical examples to facilitate comprehension; the present invention is in no way limited to these sizes and materials.

An organic EL display panel according to an aspect of the present invention may be either a top emission type panel or a bottom emission type panel.

Instead of the structure shown in FIG. 1A, a top emission type panel may adopt the structure in which the pixel electrodes and the auxiliary wirings are only a metal film. In this case, the light-emitting cell is composed, for example, of the following in order from the substrate: pixel electrode (metal film)/hole injection layer/buffer layer/light-emitting layer/electron injection layer/common electrode (transparent conductive film). The connecting portion is composed, for example, of the following in order from the substrate: auxiliary wiring (metal film)/hole injection layer/electron injection layer/common electrode (transparent conductive film).

On the other hand, in a bottom emission type panel, the pixel electrodes and the auxiliary wirings are, for example, formed by a transparent conductive film, whereas the common electrode is formed by a metal film. The light-emitting cell is composed, for example, of the following in order from the substrate: pixel electrode (transparent conductive film)/hole injection layer/buffer layer/light-emitting layer/electron injection layer/common electrode (metal film). The connecting portion is composed, for example, of the following in order from the substrate: auxiliary wiring (transparent conductive film)/hole injection layer/electron injection layer/common electrode (metal film).

Furthermore, an aspect of the present invention may also be adopted in a double-sided emission type panel. In this case, the light-emitting cell is composed, for example, of the following in order from the substrate: pixel electrode (transparent conductive film)/hole injection layer/buffer layer/light-emitting layer/electron injection layer/common electrode (transparent conductive film). The connecting portion is composed, for example, of the following in order from the substrate: auxiliary wiring (transparent conductive film)/hole injection layer/electron injection layer/common electrode (transparent conductive film). A structure may also be adopted that partially provides a metal film as the auxiliary wiring.

In the above embodiments, the electron injection layer below the common electrode is not limited to being a metal layer. Either or both of an electron injection layer and an electron transport layer composed mainly of an organic material or an inorganic material may be adopted.

The expression "occupied energy level" in the context of the present invention includes an energy level of a so-called semi-occupied orbital, which is an electron orbital occupied by at least one electron.

The method of forming the hole injection layer according to an aspect of the present invention is not limited to the reactive sputtering method. For example, the vapor deposition method, the CVD method, or the like may be used instead.

In Embodiment 1, the position at which the peak P1 in FIGS. 40A and 40B begins to rise is the position along the horizontal axis, in the direction of the center point from the top of the peak P1, at which the derivative first becomes zero in (a2) and (b2) in FIGS. 40A and 40B. The method of determining the position at which the peak P1 begins to rise is not, however, limited in this way. For example, in (a1) of FIG. 40A, the average value of the normalized luminance near the peak P1 may be used as a baseline, with the position at which the peak P1 begins to rise being defined as the intersection of this baseline and the line in the graph near the peak P1.

In the organic EL display panel according to an aspect of the present invention, a hole transport layer may be provided between the hole injection layer and the light-emitting layer. The hole transport layer has the function of transporting holes injected from the hole injection layer to the light-emitting layer. An organic material with hole transporting properties is used as the hole transport layer. The organic material for the hole transport layer is an organic substance having the property of conducting holes via an intermolecular charge-transfer reaction. This is also known as a p-type organic semiconductor.

The material for the hole transport layer may be either a high molecular material or a low molecular material, and the hole transport layer may be formed by wet printing, for example. When forming the light-emitting layer, which is the uppermost layer, it is desirable for the material for the hole transport layer to include a cross-linking agent so as not to mix with the material for the light-emitting layer. Examples of the material for the hole transport layer are a copolymer that includes a fluorene region and a triarylamine region, and a triarylamine derivative with a low molecular weight. An example of a cross-linking agent is dipentaerythritol hexaacrylate. In this case, it is desirable that the cross-linking agent be formed from poly(3,4-ethylenedioxythiophene) doped with polystyrene sulfonic acid (PEDOT: PSS) or a derivative thereof (a copolymer or the like).

In the above embodiments, an organic material is used as the bank material, but alternatively an inorganic material may be used. In this case as well, the bank material layer is formed by application or by another method, as when using an organic material. The bank material layer can be removed by forming a resist pattern on the bank material layer and then performing etching with a predetermined etchant (a solution of tetramethylammonium hydroxide (TMAH) or the like).

Furthermore, as an aspect of the present invention, the hole injection layer may be separated on the pixel electrodes and on the auxiliary wirings.

The method of driving organic EL display panel according to an aspect of the present invention is not limited to the active-matrix method. For example, a passive matrix method may alternatively be used.

INDUSTRIAL APPLICABILITY

An organic EL display panel manufactured with the method of manufacturing an organic EL element according to an aspect of the present invention can be used as a display element in products such as mobile phone displays and TVs, or can be used in a variety of light sources and the like. Regardless of the specific use thereof, the organic EL display panel according to an aspect of the present invention can be used as an organic EL display panel driven at a low voltage while exhibiting a wide range of luminous intensity, from low luminous intensity to high luminous intensity. With such a high level of performance, the organic EL display panel according to an aspect of the present invention is extremely versatile and is appropriate for use in the home, in public facilities, and in the workplace, for example in various display devices, televisions, and displays for portable electronic devices, or as an illumination light source.

REFERENCE SIGNS LIST 1 organic EL element (assessment device)
1B hole-only device
1C sample element for photoelectron spectroscopy
2, 20, 20C anode (first electrode)
4, 12, 40, 40C, 40D hole injection layer (tungsten oxide layer)
6A, 60, 60C buffer layer
6B, 70, 70C light-emitting layer (organic layer)
8A barium layer
8B aluminum layer
8C cathode (Au)
9, 10, 10C substrate
11 conductive silicon substrate
13 nanocrystal
14 hole
15 amorphous structure
17C planarizing layer
20X Al alloy thin film
25C ITO layer
25D IZO layer
25X IZO thin film
30, 30C auxiliary wiring (wiring)
35 connection aperture
40X thin film (tungsten oxide film)
40a, 40b concavity
45 pixel aperture
50, 50C bank (barrier)
50A photoresist
50X bank material layer
51 mask
80, 85C metal layer (electron injection layer)
90, 90C cathode (second electrode)
95 light-emitting cell
95A light-emitting pixel
95C sealing layer
100 organic EL display apparatus
110, 110C organic EL display panel
110A intermediate product
120 drive control unit
121-124 drive circuit
125 control circuit
DC direct current power supply

The invention claimed is:
1. An organic EL display panel comprising:
a substrate;
at least one first electrode on or in the substrate;
auxiliary wiring on or in the substrate at a distance from the first electrode;
a functional layer, including at least a light-emitting layer, above the first electrode;
a hole injection layer for injecting holes to the functional layer, the hole injection layer being between the first electrode and the functional layer; and a second electrode above the functional layer, wherein
the hole injection layer and the second electrode are both formed to be continuous above the first electrode and above the auxiliary wiring,
the second electrode and the auxiliary wiring are electrically connected by the hole injection layer,
the hole injection layer includes a metal oxide film,
metal atoms constituting the metal oxide include both metal atoms at a maximum valence thereof and metal atoms at a valence less than the maximum valence, and
the metal oxide film includes a crystal of the metal oxide, a particle diameter of the crystal being on an order of nanometers.

2. The organic EL display panel of claim 1, wherein
the second electrode is a transparent electrode.

3. The organic EL display panel of claim 2, wherein
the transparent electrode is one of ITO and IZO.

4. The organic EL display panel of claim 1, wherein
the second electrode has one of Al and Ag as a primary component.

5. The organic EL display panel of claim 1, further comprising:
a metal layer formed to be continuous above the first electrode and above the auxiliary wiring, wherein
above the first electrode, the metal layer is between the second electrode and the light-emitting layer, and
above the auxiliary wiring, the metal layer is between the second electrode and the hole injection layer.

6. The organic EL display panel of claim 5, wherein
the metal layer is an electron injection layer that, above the first electrode, injects electrons from the second electrode to the light-emitting layer.

7. The organic EL display panel of claim 6, wherein
the metal layer includes barium.

8. The organic EL display panel of claim 6, wherein
at an interface between the hole injection layer and the electron injection layer, an occupied energy level of the hole injection layer causes a binding energy of the occupied energy level to be approximately equal to a Fermi level of the electron injection layer.

9. The organic EL display panel of claim 8, wherein
at the interface between the hole injection layer and the electron injection layer, a gap between the occupied energy level and the Fermi level of the electron injection layer is at most 0.3 electron volts in terms of binding energy.

10. The organic EL display panel of claim 1, wherein
the auxiliary wiring is one of ITO and IZO.

11. The organic EL display panel of claim 1, wherein
the hole injection layer above the auxiliary wiring has properties identical to the hole injection layer above the first electrode.

12. The organic EL display panel of claim 1, wherein
at least above the auxiliary wiring, the hole injection layer is at least 4 nm thick.

13. The organic EL display panel of claim 1, further comprising:
a bank on the hole injection layer defining at least one aperture exposing the first electrode and including a region exposing the auxiliary wiring, wherein
the light-emitting layer is formed above the first electrode in the aperture defined by the bank.

14. The organic EL display panel of claim 13, wherein
the at least one first electrode comprises a plurality of first electrodes, one per pixel, and
the at least one aperture in the bank comprises a plurality of apertures formed in one-to-one correspondence with the first electrodes.

15. The organic EL display panel of claim 13, wherein
the at least one first electrode comprises a plurality of first electrodes, one per pixel, arranged in lines, and
the at least one aperture in the bank comprises a plurality of apertures, one for each of the lines of the first electrodes.

16. The organic EL display panel of claim 1, wherein
the hole injection layer is at least 2 nm thick.

17. The organic EL display panel of claim 1, wherein
a UPS spectrum of the hole injection layer exhibits an upward protrusion in a range between 1.8 electron volts and 3.6 electron volts lower than a lowest energy level of a valence band in terms of binding energy.

18. The organic EL display panel of claim 1, wherein
an XPS spectrum of the hole injection layer exhibits an upward protrusion in a range between 1.8 electron volts and 3.6 electron volts lower than a lowest energy level of a valence band in terms of binding energy.

19. The organic EL display panel of claim 1, wherein
a differential spectrum obtained by differentiating a UPS spectrum of the hole injection layer exhibits a shape expressed by a non-exponential function throughout a range between 2.0 electron volts and 3.2 electron volts lower than a lowest energy level of a valence band in terms of binding energy.

20. The organic EL display panel of claim 1, wherein
an occupied energy level of the hole injection layer is in a range between 2.0 electron volts and 3.2 electron volts lower than a lowest energy level of a valence band in terms of binding energy.

21. The organic EL display panel of claim 1, wherein
at an interface between the hole injection layer and the functional layer, an occupied energy level of the hole injection layer causes a highest occupied molecular orbital of the functional layer, to be approximately equal to the occupied energy level in terms of binding energy.

22. The organic EL display panel of claim 21, wherein
at the interface between the hole injection layer and the functional layer, a gap between the occupied energy level and the highest occupied molecular orbital of the functional layer is at most 0.3 electron volts in terms of binding energy.

23. The organic EL display panel of claim 1, wherein
at an interface between the first electrode and the hole injection layer, an occupied energy level of the hole injection layer causes a binding energy of the occupied energy level to be approximately equal to a Fermi level of the first electrode.

24. The organic EL display panel of claim 23, wherein
at the interface between the first electrode and the hole injection layer, a gap between the occupied energy level and the Fermi level of the first electrode is at most 0.3 electron volts in terms of binding energy.

25. The organic EL display panel of claim 1, wherein
at an interface between the auxiliary wiring and the hole injection layer, an occupied energy level of the hole injection layer causes a binding energy of the occupied energy level to be approximately equal to a Fermi level of the auxiliary wiring.

26. The organic EL display panel of claim 25, wherein
at the interface between the auxiliary wiring and the hole injection layer, a gap between the occupied energy level and the Fermi level of the auxiliary wiring is at most 0.3 electron volts in terms of binding energy.

27. The organic EL display panel of claim 1, wherein
at an interface between the hole injection layer and the second electrode, an occupied energy level of the hole injection layer causes a binding energy of the occupied energy level to be approximately equal to a Fermi level of the second electrode.

28. The organic EL display panel of claim 27, wherein
at the interface between the hole injection layer and the second electrode, a gap between the occupied energy level and the Fermi level of the second electrode is at most 0.3 electron volts in terms of binding energy.

29. The organic EL display panel of claim 1, wherein
the metal oxide is tungsten oxide, and
the metal atoms at the maximum valence are tungsten atoms with a valence of six.

30. The organic EL display panel of claim 29, wherein
the metal atoms at the valence less than the maximum valence are tungsten atoms with a valence of five.

31. The organic EL display panel of claim 30, wherein
a ratio $W^{5+}/W^{6+}$ of the number of the tungsten atoms with a valence of five to the number of the tungsten atoms with a valence of six is at least 3.2%.

32. The organic EL display panel of claim 31, wherein
the ratio $W^{5+}/W^{6+}$ is at least 3.2% and at most 7.4%.

33. The organic EL display panel of claim 29, wherein
a hard X-ray photoelectron spectroscopy spectrum of the hole injection layer formed from tungsten oxide includes a first component and a second component, the first component corresponding to a $4f_{7/2}$ energy level of the tungsten atoms with a valence of six, and the second component being in a region lower than the first component in tel ins of binding energy.

34. The organic EL display panel of claim 33, wherein
the second component is in a region between 0.3 electron volts and 1.8 electron volts lower, in terms of binding energy, than a peak top of the first component.

35. The organic EL display panel of claim 33, wherein
an area intensity of the second component is between 3.2% and 7.4% of an area intensity of the first component.

36. The organic EL display panel of claim 29, wherein
tungsten atoms at a valence less than the maximum valence cause an electronic state of the hole injection layer formed from tungsten oxide to have an occupied energy level in a range between 1.8 electron volts and 3.6 electron volts lower than a lowest energy level of a valence band in terms of binding energy.

37. The organic EL display panel of claim 29, wherein
the hole injection layer formed from tungsten oxide includes a plurality of crystals of the tungsten oxide, each of the crystals having a particle diameter of between 5 nm and 10 nm.

38. The organic EL display panel of claim 29, wherein
regular linear structures at intervals of between 1.85 angstroms and 5.55 angstroms appear in a lattice image by transmission electron microscopy observation of the hole injection layer formed from tungsten oxide.

39. The organic EL display panel of claim 38, wherein
in a 2D Fourier transform image of the lattice image, a bright region formed by concentric circles centering on a center point of the 2D Fourier transform image appears.

40. The organic EL display panel of claim 39, wherein
in a plot of distance from the center point versus normalized luminance, the normalized luminance being a normalized value of the luminance of the 2D Fourier transform image at the corresponding distance, at least one peak of the normalized luminance appears other than the center point.

41. The organic EL display panel of claim 40, wherein
with a peak width being a difference between the distance corresponding to a position of a peak top of the normalized luminance appearing closest to the center point in the plot and the distance corresponding to a position at which a peak of the normalized luminance begins to rise, the peak width is less than 22 when the distance corresponding to the peak top is 100.

42. An organic EL display panel comprising:
a substrate;
a first electrode on or in the substrate;
wiring on or in the substrate at a distance from the first electrode;
an organic layer, including organic material, above the first electrode;
a metal oxide film, including a metal oxide, between the organic layer and the first electrode; and
a second electrode above the organic layer, wherein
the metal oxide film and the second electrode are both formed to be continuous above the first electrode and above the wiring,
the second electrode and the wiring are electrically connected by the metal oxide film,
metal atoms constituting the metal oxide include both metal atoms at a maximum valence thereof and metal atoms at a valence less than the maximum valence, and
the metal oxide film includes a crystal of the metal oxide, a particle diameter of the crystal being on an order of nanometers.

43. A method of manufacturing an organic EL display panel, comprising the steps of:
forming a first electrode on or in a substrate;
forming auxiliary wiring on or in the substrate at a distance from the first electrode;
forming a hole injection layer to be continuous above the first electrode and above the auxiliary wiring;
forming a functional layer above the first electrode including at least a light-emitting layer; and
forming a second electrode to be continuous above the functional layer and above the hole injection layer formed above the auxiliary wiring, wherein
the second electrode and the auxiliary wiring are electrically connected by the hole injection layer,
the hole injection layer is formed to include a metal oxide film, and
the metal oxide film is formed so that metal atoms constituting the metal oxide include both metal atoms at a maximum valence thereof and metal atoms at a valence less than the maximum valence, and so as to include a crystal of the metal oxide, a particle diameter of the crystal being on an order of nanometers.

* * * * *